(12) United States Patent
Lee et al.

(10) Patent No.: US 11,411,007 B2
(45) Date of Patent: Aug. 9, 2022

(54) SEMICONDUCTOR MEMORY DEVICE AND METHOD OF MANUFACTURING THE SAME

(71) Applicant: Samsung Electronics Co., Ltd., Suwon-si (KR)

(72) Inventors: Minsu Lee, Seongnam-si (KR); Kiseok Lee, Hwaseong-si (KR); Woobin Song, Hwaseong-si (KR); Minhee Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 177 days.

(21) Appl. No.: 16/991,661

(22) Filed: Aug. 12, 2020

(65) Prior Publication Data

US 2021/0159231 A1 May 27, 2021

(30) Foreign Application Priority Data

Nov. 22, 2019 (KR) .................. 10-2019-0151615

(51) Int. Cl.
*H01L 27/108* (2006.01)
*G11C 11/408* (2006.01)
*G11C 11/4094* (2006.01)

(52) U.S. Cl.
CPC .... *H01L 27/10879* (2013.01); *G11C 11/4085* (2013.01); *G11C 11/4094* (2013.01); *H01L 27/10841* (2013.01); *H01L 27/10897* (2013.01)

(58) Field of Classification Search
None
See application file for complete search history.

(56) References Cited

U.S. PATENT DOCUMENTS

| | | | |
|---|---|---|---|
| 5,995,433 A * | 11/1999 | Liao | G11C 11/405 365/150 |
| 7,151,690 B2 | 12/2006 | Forbes | |
| 10,032,777 B1 | 7/2018 | Chen et al. | |
| 10,079,235 B2 | 9/2018 | Mathew et al. | |
| 10,319,724 B2 | 6/2019 | Mathew et al. | |
| 10,319,725 B2 | 6/2019 | Juengling | |
| 2019/0006376 A1 | 1/2019 | Ramaswamy | |
| 2019/0103407 A1 | 4/2019 | Kim et al. | |
| 2019/0164985 A1 | 5/2019 | Lee et al. | |
| 2019/0206869 A1 | 7/2019 | Kim et al. | |
| 2019/0252386 A1 | 8/2019 | Lee et al. | |
| 2019/0259761 A1 | 8/2019 | Takemura et al. | |

FOREIGN PATENT DOCUMENTS

JP 2018-085508 A 5/2018

* cited by examiner

*Primary Examiner* — Anthony Ho
*Assistant Examiner* — Kevin Quinto
(74) *Attorney, Agent, or Firm* — Harness, Dickey & Pierce, P.L.C.

(57) ABSTRACT

A semiconductor memory device includes a memory cell array of a three-dimensional structure including a plurality of memory cells repeatedly arranged in a first horizontal direction and a second horizontal direction that are parallel with a main surface of a substrate and cross each other on the substrate and in a vertical direction perpendicular to the main surface, wherein each of the plurality of memory cells includes three transistors. A method of manufacturing a semiconductor memory device includes forming simultaneously a plurality of memory cells arranged in a row in a vertical direction on a substrate, wherein each of the plurality of memory cells includes three transistors.

20 Claims, 66 Drawing Sheets

SEMICONDUCTOR MEMORY DEVICE AND METHOD OF MANUFACTURING THE SAME

CROSS-REFERENCE TO RELATED APPLICATION

This application claims the benefit of Korean Patent Application No. 10-2019-0151615, filed on Nov. 22, 2019 in the Korean Intellectual Property Office, the disclosure of which is incorporated herein in its entirety by reference.

BACKGROUND

Inventive concepts relate to a semiconductor memory device and/or a method of manufacturing the same, and more particularly, to a semiconductor memory device including a plurality of memory cells arranged in a three dimension and/or a method of manufacturing the semiconductor memory device.

In general semiconductor memory devices including one-transistor, one-capacitor (1T1C) memory cells such as Dynamic Random Access Memory (DRAM) cells, each of which includes one transistor and one capacitor, since reading data is performed in a method of measuring a voltage change by releasing charge stored in a capacitor via a bit line, static capacitance of the capacitor should be maintained to be greater than a certain value. Due to the development of electronic technology, for example, down-scaling of the semiconductor devices, has been rapidly proceeded. Accordingly, since miniaturization of memory cells is being pursued, securing necessary static capacitance in the 1T1C memory cells may be difficult, and thus, reliability maintenance is limited, for example, due to coupling capacitance components between the bit lines. Accordingly, developing the semiconductor memory devices is being pursued, wherein the semiconductor memory devices have a structure that facilitates miniaturization and high integration of the memory cells without being constrained by the static capacitance of the capacitors and/or the coupling capacitance components between the bit lines.

SUMMARY

Inventive concepts provide a semiconductor memory device having a structure facilitating miniaturization and/or high integration of a memory cell without being constrained by static capacitance of a capacitor or coupling capacitance components between bit lines.

Inventive concepts provide a method of manufacturing, e.g. a method of fabrication, by using a simplified process a semiconductor memory device having a structure facilitating miniaturization and/or high integration of a memory cell without being constrained by static capacitance of a capacitor and/or coupling capacitance components between bit lines.

According to some example embodiments of inventive concepts, there is provided a memory device including a memory cell array of a three-dimensional structure, the memory cell array including a plurality of memory cells on a substrate, the plurality of memory cells repeatedly arranged in a first horizontal direction, a second horizontal direction, and a vertical direction, the first horizontal direction and the second horizontal direction parallel with a main surface of the substrate, the first horizontal direction crossing the second horizontal direction, the vertical direction perpendicular to the main surface. Each of the plurality of memory cells comprises three transistors.

According to some example embodiments of inventive concepts, there is provided a memory device including a memory cell array of a three-dimensional structure, the memory cell array comprising a plurality of memory cells that are repeatedly arranged on a substrate in a first horizontal direction, a second horizontal direction, and a vertical direction, the first horizontal direction and the second horizontal direction parallel with a main surface of the substrate and cross each other, and the vertical direction perpendicular to the main surface. Each of the plurality of memory cells comprises a first transistor including, a first channel region and a storage gate, a second transistor including a second channel region and a portion of a read word line, and a third transistor comprising a third channel region and a portion of a write word line. An axis in a channel length direction of each of the first channel region and the second channel region follows a first straight line parallel with the first horizontal direction, and an axis in a channel length direction of the third channel region is parallel with the first horizontal direction and follows a second straight line apart from the first straight line.

According to some example embodiments of inventive concepts, there is provided a memory device including a memory cell array of a three-dimensional structure, the memory cell array comprising a plurality of memory cells that are on a substrate and are repeatedly arranged in a first horizontal direction, a second horizontal direction, and a vertical direction, the first and second horizontal directions parallel with a main surface of the substrate and crossing each other, the vertical direction perpendicular to the main surface of the substrate. The memory cell array comprises a plurality of bit lines extending in the second horizontal direction and being apart from each other in the vertical direction on the substrate, and a plurality of read word lines and a plurality of write word lines extending parallel with each other in the vertical direction, the plurality of read word lines apart from the plurality of write word lines in the second horizontal direction. Memory cells in a row in the second horizontal direction among the plurality of memory cells share one bit line selected from the plurality of bit lines, and memory cells in a row in the vertical direction among the plurality of memory cells share one read word line and one write word line selected among the plurality of word lines and the plurality of write word lines, respectively.

According to some example embodiments of inventive concepts, there is provided a method of manufacturing a semiconductor device, the method including simultaneously forming a plurality of memory cells on a substrate in a vertical direction, the plurality of memory cells arranged in a row, wherein each of the plurality of memory cells comprises three transistors.

According to some example embodiments of inventive concepts, there is provided a method of manufacturing a semiconductor device, the method including alternately stacking a plurality of conductive layers and a plurality of intermediate insulating layers on a substrate, forming a cell pattern comprising a first line region and a second line region, the first line region and the second line region extending in a first horizontal direction and parallel with each other, the forming the cell pattern including removing a portion of each of the plurality of conductive layers and the plurality of intermediate insulating layers, and replacing some regions of each of the plurality of conductive layers included in the first line region and the second line region with three channel regions constituting three transistors.

According to some example embodiments of inventive concepts, there is provided a method of manufacturing a semiconductor device, the method including alternately stacking a plurality of conductive layers and a plurality of intermediate insulating layers on a substrate, forming a cell pattern comprising a first line region and a second line region, the first line region and the second line region extending in a first horizontal direction, the first line region and the second line region being parallel with each other, the forming the cell pattern including removing a portion of each of the plurality of conductive layers and the plurality of intermediate insulating layers, in each of the plurality of conductive layers, replacing some regions included in the first line region and the second line region with a first channel region, a second channel region, and a third channel region, forming a read word line extending along a first sidewall of the cell pattern in a vertical direction and facing the second channel region, forming a write word line extending along a second sidewall of the cell pattern in the vertical direction and facing the third channel region, and in each of the plurality of conductive layers, replacing a portion of the conductive layer that faces the first channel region with a storage gate.

BRIEF DESCRIPTION OF THE DRAWINGS

Example embodiments of inventive concepts will be more clearly understood from the following detailed description taken in conjunction with the accompanying drawings in which:

FIGS. 26A through 35B are diagrams for describing a method of manufacturing a semiconductor memory device according to some example embodiments of inventive concepts, wherein FIGS. 26A, 27A, 28A, 29A, 30A, 31A, 32A, 33A, 34A, and 35A are perspective views illustrating the method of manufacturing the semiconductor memory device in a process sequence, and FIGS. 26B, 27B, 28B, 29B, 30B, 31B, 32B, 33B, 34B, and 35B are plan views on the first level in FIGS. 26A, 27A, 28A, 29A, 30A, 31A, 32A, 33A, 34A, and 35A, respectively; and FIGS. 36A through 40B are diagrams for describing a method of manufacturing a semiconductor memory device according to some example embodiments of inventive concepts, wherein FIGS. 36A, 37A, 38A, 39A, and 40A are perspective views illustrating the method of manufacturing the semiconductor memory device in a process sequence, and FIGS. 36B, 37B, 38B, 39B, and 40B are plan views on the first level in FIGS. 36A, 37A, 38A, 39A, and 40A, respectively.

DETAILED DESCRIPTION OF EXAMPLE EMBODIMENTS

Figure 1A:
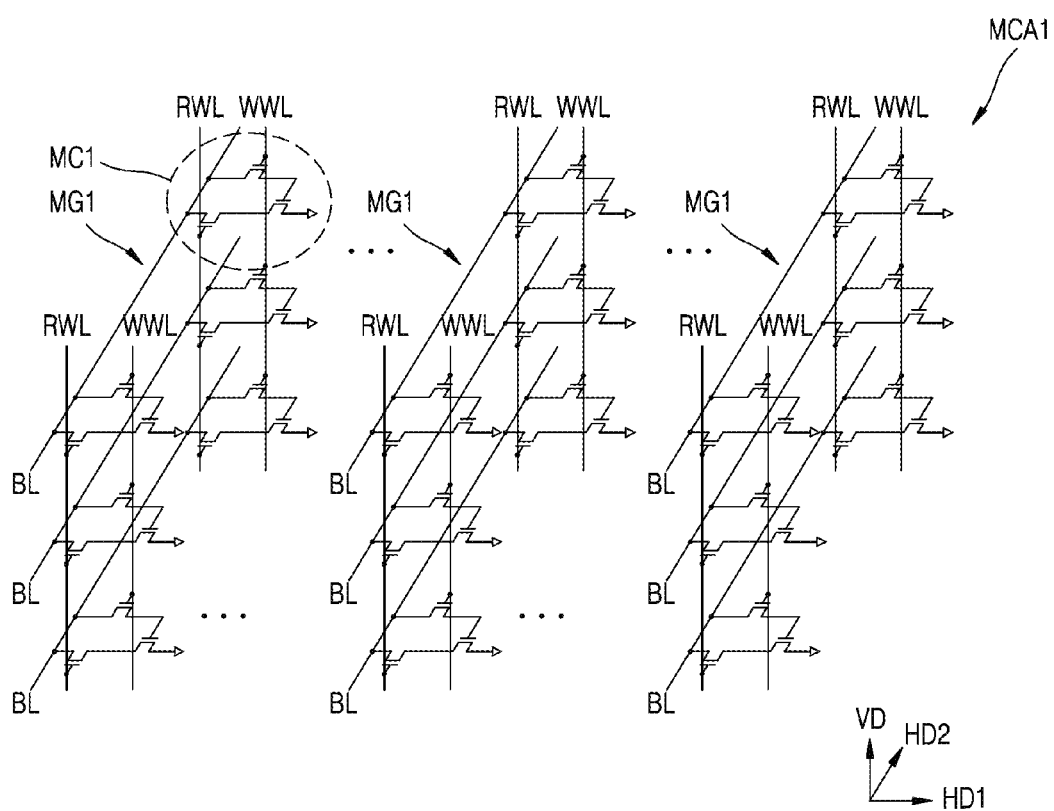
FIG. 1A is a circuit diagram illustrating a circuit configuration of a memory cell array of a semiconductor memory device, according to example embodiments of inventive concepts.

Hereinafter, embodiments of inventive concepts will be described in detail with reference to the accompanying drawings. Identical reference numerals are used for the same constituent devices in the drawings, and a duplicate description thereof may be omitted.

Figure 1B:
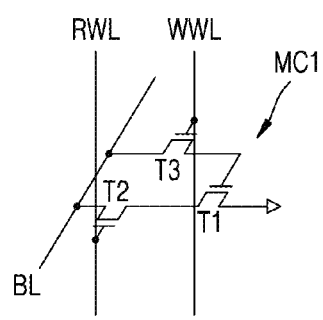
FIG. 1B is a circuit diagram of a memory cell illustrated in FIG. 1A.

FIG. 1A is a circuit diagram illustrating a circuit configuration of a memory cell array MCA1 of a semiconductor memory device 10, according to some example embodiments of inventive concepts. FIG. 1B is a circuit diagram of a memory cell MC1 included in the memory cell array MCA1 illustrated in FIG. 1A.

Referring to FIGS. 1A and 1B, the semiconductor memory device 10 may include the memory cell array MCA1 having a three-dimensional structure and including a plurality of memory cells MC1 that are repeatedly arranged in a first horizontal direction (HD1 direction), a second horizontal direction (HD2 direction), and a vertical direction (VD direction), each of which are orthogonal to each other. The memory cell array MCA1 may include a plurality of memory cell groups MG1 including the plurality of memory cells MC1 that are arranged in two dimensions in the second horizontal direction (HD2 direction) and the vertical direction (VD direction). The plurality of memory cell groups MG1 may be repeatedly arranged in the first horizontal direction (HD1 direction).

The memory cell array MCA1 may include a plurality of read word lines RWL, a plurality of write word lines WWL, and a plurality of bit lines BL, which constitute, or correspond to, the plurality of memory cells MC1. In one memory cell group MG1, each of the plurality of bit lines BL may extend in parallel with one another in a second horizontal direction (HD2 direction) and may be apart from each other in the vertical direction (VD direction). In one memory cell group MG1, the plurality of read word lines RWL and the plurality of write word lines WWL may extend in parallel with each other in the vertical direction (VD direction) and may be apart from each other in the second horizontal direction (HD2 direction).

Referring to FIG. 1B, the plurality of memory cells MC1 may be configured as three-transistor (3T) memory cells including three transistors that are configured by a first transistor T1, a second transistor T2, and a third transistor T3. The plurality of memory cells MC1 may not include a capacitor; however, example embodiments are not limited thereto. The first transistor T1 may be connected to the second transistor T2 in series between a voltage terminal and the bit line BL. The third transistor T3 may be connected between a gate of the first transistor T1 and the bit line BL. Each of the connections among transistors T1, T2, and T3 may be direct connections, or connections not having any other active electrical component therebetween.

One source/drain region of a pair of source/drain regions included in the first transistor T1 may be connected to one source/drain region of a pair of source/drain regions included in the second transistor T2, and the gate of the first transistor T1 may be connected to one source drain region of a pair of source/drain regions included in the third transistor T3. The other source/drain region of the pair of source/drain regions included in the second transistor T2 may be connected to the bit line BL, and a gate of the second transistor T2 may be connected to one read word line RWL selected among a plurality of read word lines RWL. The other source/drain region of the pair of source/drain regions included in the third transistor T3 may be connected to the bit line BL, and a gate of the third transistor T3 may be connected to one write word line WWL selected among the plurality of write word lines WWL. Each of the connections may be direct connections, or connections not having any active component therebetween. Each of the plurality of bit lines BL may function as a read bit line and a write bit line. Each of the first transistor T1, the second transistor T2, and the third transistor T3 may be NMOS transistors; however, example embodiments are not limited thereto, and at least one of the first transistor T1, the second transistor T3, and the third transistor T3 may be PMOS transistors.

Figure 2A:
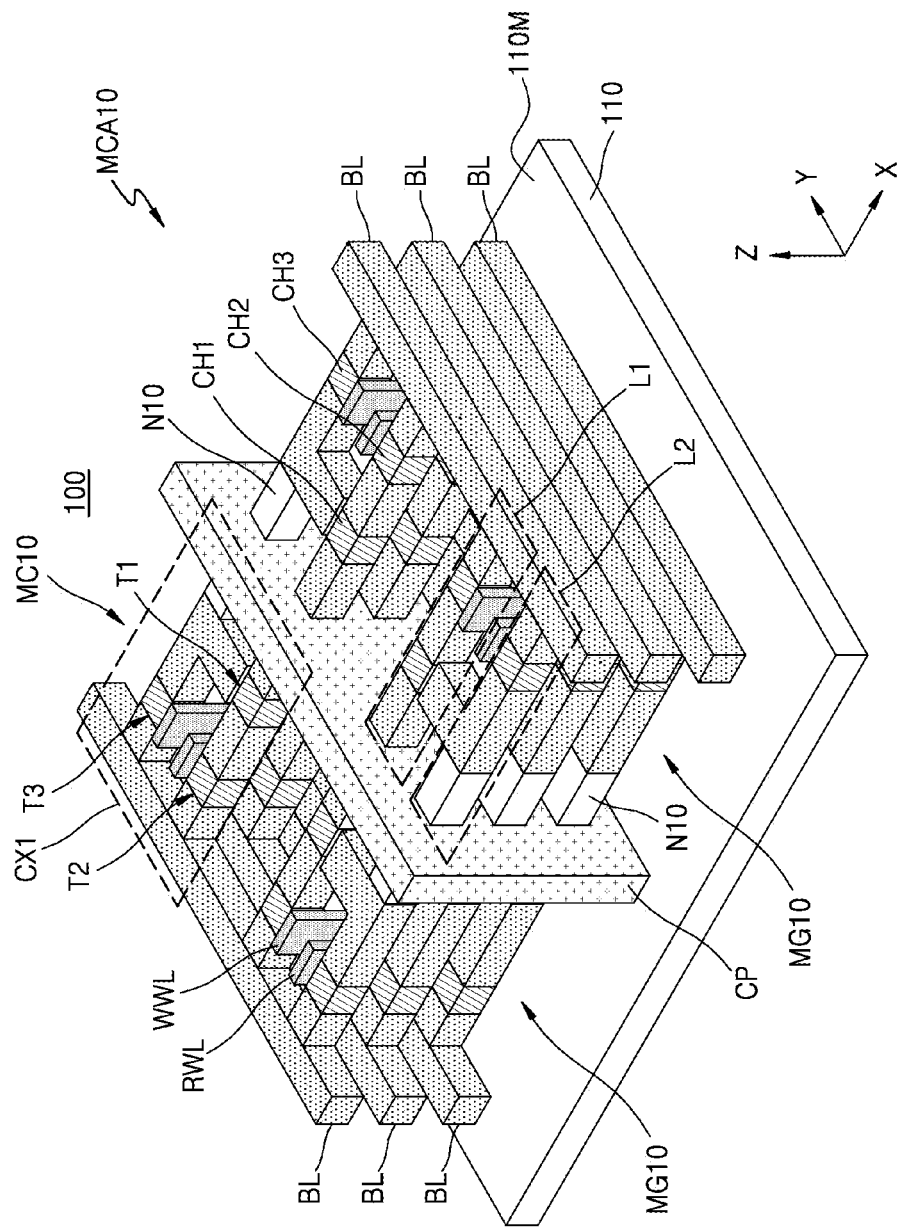
FIG. 2A is a perspective view illustrating some components of a semiconductor memory device, according to some example embodiments of inventive concepts.
Figure 2B:
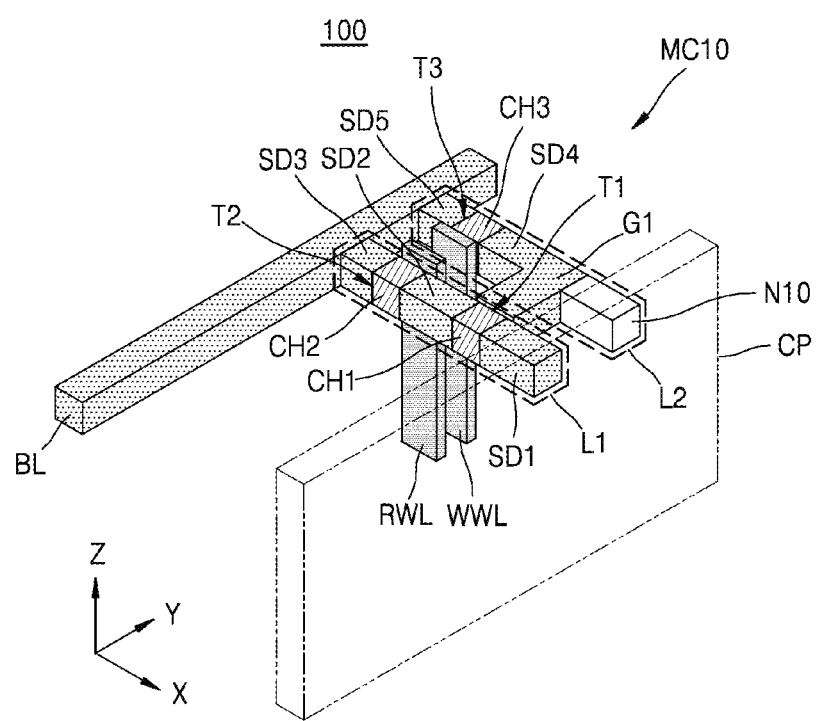
FIG. 2B is a perspective view illustrating some components of one memory cell included in a dashed line region CX1 in FIG. 2A.

FIGS. 2A and 2B are diagrams for describing a semiconductor memory device 100 according to some example embodiments of inventive concepts. FIG. 2A is a perspective view illustrating some components of the semiconductor memory device 100, and FIG. 2B is a perspective view illustrating some components of one memory cell MC10 included in a dashed line region CX1 in FIG. 2A.

Referring to FIGS. 2A and 2B, the semiconductor memory device 100 may include a memory cell array MCA10 having a three-dimensional structure including a plurality of memory cells MC10 that are repeatedly arranged on the substrate 110 in a first horizontal direction (X direction) and a second horizontal direction (Y direction) that are parallel with a main surface 110M of a substrate 110 and are perpendicular to each other, and in a vertical direction (Z direction) perpendicular to the main surface 110M of the substrate 110. The memory cell array MCA10 may constitute, or correspond to, the circuits illustrated in FIGS. 1A and 1B.

The memory cell array MCA10 may include a plurality of memory cell groups MG10 including the plurality of memory cells MC10 arranged in two dimensions in the second horizontal direction (Y direction) and the vertical direction (Z direction). The plurality of memory cell groups MG10 may be repeatedly arranged in the first horizontal direction (X direction).

The memory cell array MCA10 may include the plurality of read word lines RWL, the plurality of write word lines WWL, and the plurality of bit lines BL, which constitute or correspond to the plurality of memory cells MC10. In one memory cell group MG10, the plurality of bit lines BL may extend in parallel with each other in the second horizontal direction (Y direction) and may be apart from each other in the vertical direction (Z direction). In one memory cell group MG10, the plurality of read word lines RWL and the plurality of write word lines WWL may extend long/along in the vertical direction (Z direction). Each of the plurality of memory cells MC10 may include at least portions of the read word line RWL and at least portions of the write word line WWL that are apart from each other in the second horizontal direction (Y direction).

Each of the plurality of memory cells MC10 may include the 3T memory cell including three transistors that are constituted by/correspond to the first transistor T1, the second transistor T2, and the third transistor T3. The first transistor T1 may include a first channel region CH1 and a storage gate G1. The second transistor T2 may include a second channel region CH2 and at least a portion of the read word line RWL. The third transistor T3 may include a third channel region CH3 and at least a portion of the write word line WWL. The first transistor T1 may be connected to the second transistor T2 in series between a common plate CP and the bit line BL. The third transistor T3 may be connected between the storage gate G1 of the first transistor T1 and the bit line BL. The common plate CP may be apart from the bit line BL with one memory cell group MG10 therebetween.

In the plurality of memory cells MC10, two memory cells MC10 that are adjacent to each other in the second horizontal direction (Y direction) may have a mirror image symmetrical shape about an imaginary straight line in the first horizontal direction (X direction). In the plurality of memory cells MC10, two memory cells MC10 neighboring each other in the first horizontal direction (X direction) may have a mirror image symmetric shape with respect to the common plate CP and/or the bit line BL.

Referring to FIG. 2B, each of the plurality of memory cells MC10 may include a first conductive line region L1 and a second conductive line region L2. The first conductive line region L1 and the second conductive line region L2 may be connected (e.g. directly connected) to the bit line BL, extending in parallel with each other from the bit line BL in the first horizontal direction (X direction), and being apart from each other in the second horizontal direction (Y direction). In each of the plurality of memory cells MC10, one end of the first conductive line region L1 may be in contact (e.g. in direct contact) with the common plate CP, and the second conductive line region L2 may be apart from the common plate CP with an insulating region N10 therebetween.

The first conductive line region L1 may include the first channel region CH1, the second channel region CH2, and a plurality of source/drain regions (SD1, SD2, and SD3). Each of the plurality of source/drain regions (SD1, SD2, and SD3) may be between the first channel region CH1 and the common plate CP, between the first channel region CH1 and the second channel region CH2, and between the second channel region CH2 and the bit line BL. A pair of source/drain regions (SD1 and SD2) on both sides of the first channel region CH1 may constitute or correspond to the first transistor T1, and a pair of source/drain regions (SD2 and SD3) on both sides of the second channel region CH2 may constitute or correspond to the second transistor T2. The second transistor T2 may be between the bit line BL and one source/drain region SD2 of the pair of source/drain regions (SD1 and SD2) constituting/corresponding to the first transistor T1. One source/drain region SD3 constituting/corresponding to the second transistor T2 may be connected to the bit line BL, and the other source/drain region SD2 constituting/corresponding to the second transistor T2 may be connected to one source/drain region SD2 constituting the first transistor T1. The source/drain region SD2 may be shared by the first transistor T1 and the second transistor T2.

The second conductive line region L2 may include a third channel region CH3 and a plurality of source/drain regions (SD4 and SD5). Each of the plurality of source/drain regions (SD4 and SD5) may be between the storage gate G1 of the first transistor T1 and the third channel region CH3, and between the third channel region CH3 and the bit line BL. A pair of source/drain regions (SD4 and SD5) on both sides of the third channel region CH3 may constitute/correspond to the third transistor T3. The third transistor T3 may be between the bit line BL and the storage gate G1. One source/drain region SD5 constituting the third transistor T3 may be connected/directly connected to the bit line BL, and the other source/drain region SD4 constituting/corresponding to the third transistor T3 may be connected/directly connected to the storage gate G1. The source/drain region SD4 of the third transistor T3 may be connected/directly connected to the storage gate G1.

An axis in a channel length direction of each of the first channel region CH1 and the second channel region CH2 may be in/along a first straight line parallel with the first horizontal direction (X direction) in the first conductive line region L1. An axis in a channel length direction of the third channel region CH3 may be in/along a second straight line parallel with the first horizontal direction (X direction) in the second conductive line region L2. The first straight line and the second straight line may be apart from each other in the second horizontal direction (Y direction) and may extend in parallel with each other. The term "channel length" as used herein may be referred to as a distance between two neighboring source/drain regions among regions where a channel is formed in each of the first channel region CH1, the second channel region CH2, and the third channel region CH3. The two neighboring source/drain regions may be selected from the plurality of source/drain regions (SD1, SD2, SD3, SD4, and SD5). The second channel region CH2 and the third channel region CH3 may be on/along one straight line in the second horizontal direction (Y direction).

The plurality of memory cells MC10 that are included in one memory cell group MG10 and arranged in a row in the second horizontal direction (Y direction) may share one bit line BL. In the plurality of memory cells MC10 included in one memory cell group MG10, the first transistor T1 may be apart from the bit line BL with the second transistor T2 and the third transistor T3 therebetween. The source/drain region SD3 constituting the second transistor T2 and the source/drain region SD5 constituting the third transistor T3 may be connected/directly connected to the bit line BL. The plurality of memory cells MC10 arranged in a row in the vertical direction (Z direction) among the plurality of memory cells MC10 may share one read word line RWL and one write word line WWL. In each of the plurality of memory cells MC10 included in one memory cell group MG10, one source/drain region SD1 constituting/corresponding to the first transistor T1 may be connected/directly connected to the common plate CP.

The substrate 110 may include a semiconductor such as Si and Ge, or a compound semiconductor such as SiGe, SiC, GaAs, InAs, InGaAs, and InP. Each of the first channel region CH1, the second channel region CH2, and the third channel region CH3 may include doped or undoped single crystal silicon, doped or undoped polysilicon, indium gallium zinc oxide (IGZO), indium tin gallium oxide (ITGO), indium tin zinc oxide (ITZO), indium gallium oxide (IGO), indium zinc oxide (IZO), zinc tin oxide (ZTO), or a combination thereof, but example embodiments are not limited thereto.

Each of the storage gate G1, the read word line RWL, the write word line WWL, the plurality of source/drain regions (SD1, SD2, SD3, SD4, and SD5), the bit line BL, and the common plate CP may include a semiconductor, an oxide semiconductor, and/or a metal. The semiconductor may include doped monocrystalline silicon or doped polysilicon. The oxide semiconductor may include IGZO, ITGO, ITZO, IGO, IZO, ZTO, or a combination thereof. The metal may include Cu, W, Al, or a combination thereof. However, a material constituting/included in each of the storage gate G1, the read word line RWL, the write word line WWL, the plurality of source/drain regions (SD1, SD2, SD3, SD4, and SD5), the bit line BL, and the common plate CP is not limited to the above examples, and various modifications and changes may be made within the scope of the technical idea of inventive concepts.

The portions marked with empty spaces between the plurality of memory cells MC10 and between components constituting/corresponding to each of the plurality of memory cells MC10 illustrated in FIGS. 2A and 2B may be filled with an insulating material, e.g. at least one insulating layer. The insulating layer may include a silicon oxide layer, a silicon nitride layer, a silicon oxynitride layer, or a combination thereof.

Figure 3A:
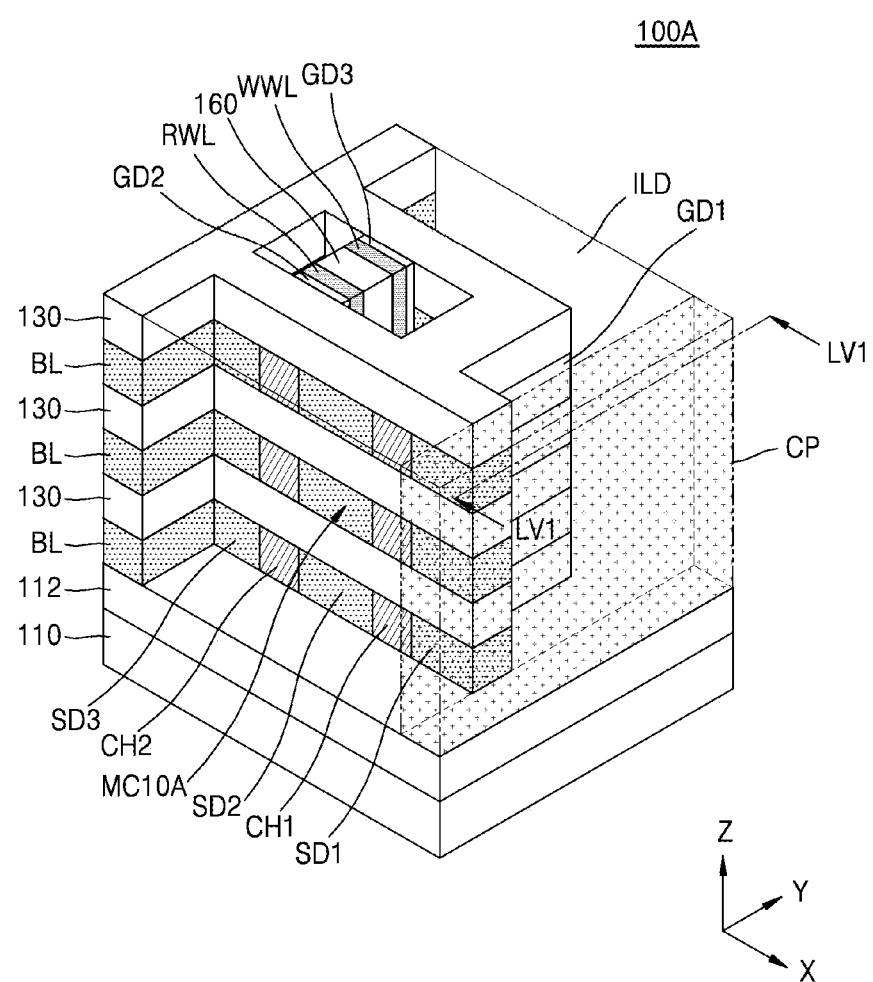
FIG. 3A is a perspective view of some components of a semiconductor memory device, according to some example embodiments of inventive concepts.
Figure 3B:
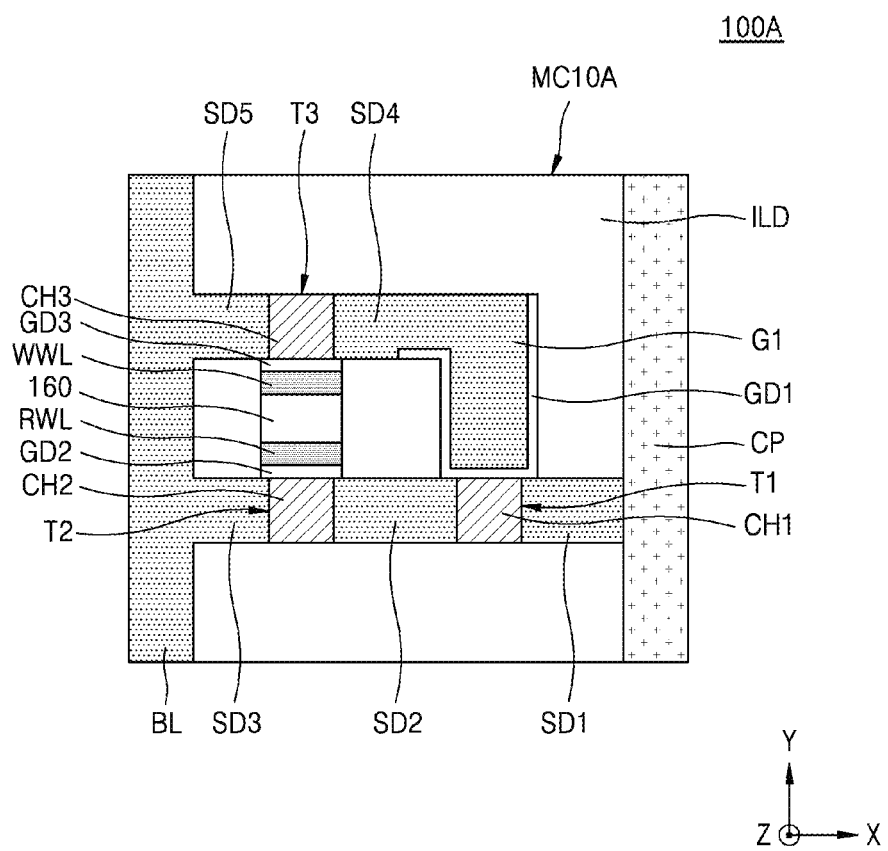
FIG. 3B is a planar view on a first level in FIG. 3A.

FIG. 3A is a perspective view of some region of a semiconductor memory device 100A, according to some example embodiments of inventive concepts, and FIG. 3B is a planar view on a first level LV1 in FIG. 3A. A more detailed example of the semiconductor memory device 100 illustrated in FIGS. 2A and 2B is described with reference to FIGS. 3A and 3B.

Referring to FIGS. 3A and 3B, the semiconductor memory device 100A may include a plurality of memory cells MC10A formed on a lower insulating layer 112 on the substrate 110. The plurality of memory cells MC10A may have substantially the same configuration as that described with respect to the plurality of memory cells MC10 with reference to FIGS. 2A and 2B. The plurality of memory cells MC10A illustrated in FIG. 3A may correspond to the plurality of memory cells MC10 arranged in a row in the vertical direction (Z direction) in the dashed line region CX1 in FIG. 2A. An intermediate insulating layer 130 may be between each of the plurality of memory cells MC10A arranged in a row in the vertical direction (Z direction). The plurality of first channel regions CH1 included in the plurality of memory cells MC10A arranged in a row in the vertical direction (Z direction) may be apart from each other with the intermediate insulating layer 130 therebetween. Each of the lower insulating layer 112 and the intermediate insulating layer 130 may include a silicon oxide layer, a silicon nitride layer, a silicon oxynitride layer, or a combination thereof. The lower insulating layer 112 and the intermediate insulating layer 130 may include the same, or different, materials.

A first gate insulating layer GD1 may be between the first channel region CH1 and the storage gate G1, a second gate insulating layer GD2 may be between the second channel region CH2 and the read word line RWL, and the third gate insulating layer GD3 may be between the third channel region CH3 and the write word line WWL. Each of the first gate insulating layer GD1, the second gate insulating layer GD2, and the third gate insulating layer GD3 may include a silicon oxide layer, a silicon oxynitride layer, a high-k dielectric layer, a ferroelectric layer, or a combination thereof. The high-k dielectric layer may have a dielectric constant of about 10 to about 25. For example, the high-k dielectric layer may include hafnium oxide, aluminum oxide, zirconium oxide, or a combination thereof, but example embodiments are not limited thereto. The ferroelectric layer may include PZT(PbZrTiO$_3$) and/or BST((Ba, Sr) TiO$_3$), but is not limited thereto. The gate dielectric insulating layers GD1, GD2, and GD3 may correspond to the gate dielectric layers of respective Metal Oxide Semiconductor Field Effect Transistors (MOSFETS) corresponding to each of transistors T1, T2, T3, respectively.

An insulating fence 160 may be between the read word line RWL and the write word line WWL. Spaces between components constituting the memory cell MC10A may be filled with a buried insulating layer ILD. Each of the insulating fence 160 and the buried insulating layer ILD may include a silicon oxide layer, a silicon nitride layer, a silicon oxynitride layer, or a combination thereof, and the insulating fence 160 and the insulating layer ILD may include the same or different materials from one another. In FIG. 3A, for better understanding, portions covered with the buried insulating layer ILD among the components constituting/corresponding to the memory cell MC10A are also indicated as solid lines. In the drawings referred to in the following description, as illustrated in FIG. 3A for better understanding, some regions covered with the buried insulating layer ILD are shown as solid lines.

Figure 4:
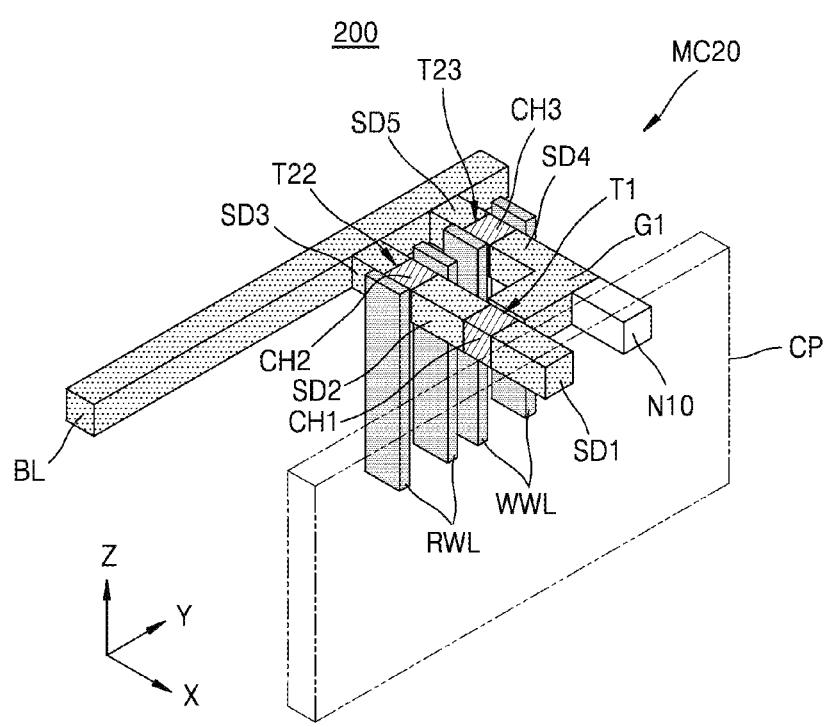
FIG. 4 is a perspective view of a semiconductor memory device according to some example embodiments of inventive concepts.

FIG. 4 is a perspective view of a semiconductor memory device 200 according to some example embodiments of inventive concepts. FIG. 4 illustrates some components of one memory cell MC20 in a portion corresponding to the dashed line region CX1 in FIG. 2A.

Referring to FIG. 4, the semiconductor memory device 200 includes the memory cell MC20. The memory cell MC20 may have substantially the same configuration as that of the memory cell MC10 of the semiconductor memory device 100 illustrated in FIGS. 2A and 2B. However, the memory cell MC20 may include a second transistor T22 and a third transistor T23 that have a double gate structure, and that share channels CH1 and CH2 with transistors T2 and T3, respectively. There may not be a capacitor in the memory cell MC20.

The semiconductor memory device 200 may, similarly to the semiconductor memory device 100 illustrated in FIGS. 2A and 2B, include a memory cell array having a three-dimensional structure including a plurality of memory cells MC20 that are repeatedly arranged on the substrate 110 in the first horizontal direction (X direction), the second horizontal direction (Y direction), and the vertical direction (Z direction). A memory cell array including the plurality of memory cells MC20 may constitute/correspond to the circuit illustrated in FIGS. 1A and 1B.

The second transistor T22 and the third transistor T23 may have substantially the same configuration as those of the second transistor T2 and the third transistor T3 illustrated in FIGS. 2A and 2B, respectively. However, the second transistor T22 may include a pair of read word lines RWL covering both sidewalls of the second channel region CH2, and the third transistor T23 may include a pair of write word lines WWL covering both sidewalls of the third channel region CH3. The pair of read word lines RWL and the pair of write word lines WWL may extend long/along in the vertical direction (Z direction). In a memory cell array of a three-dimensional structure including the plurality of memory cells MC20, the plurality of memory cells MC20 arranged in a row in the vertical direction (Z direction) among the plurality of memory cells MC20 may include the pair of read word lines RWL and the pair of write word lines WWL.

Figure 5A:
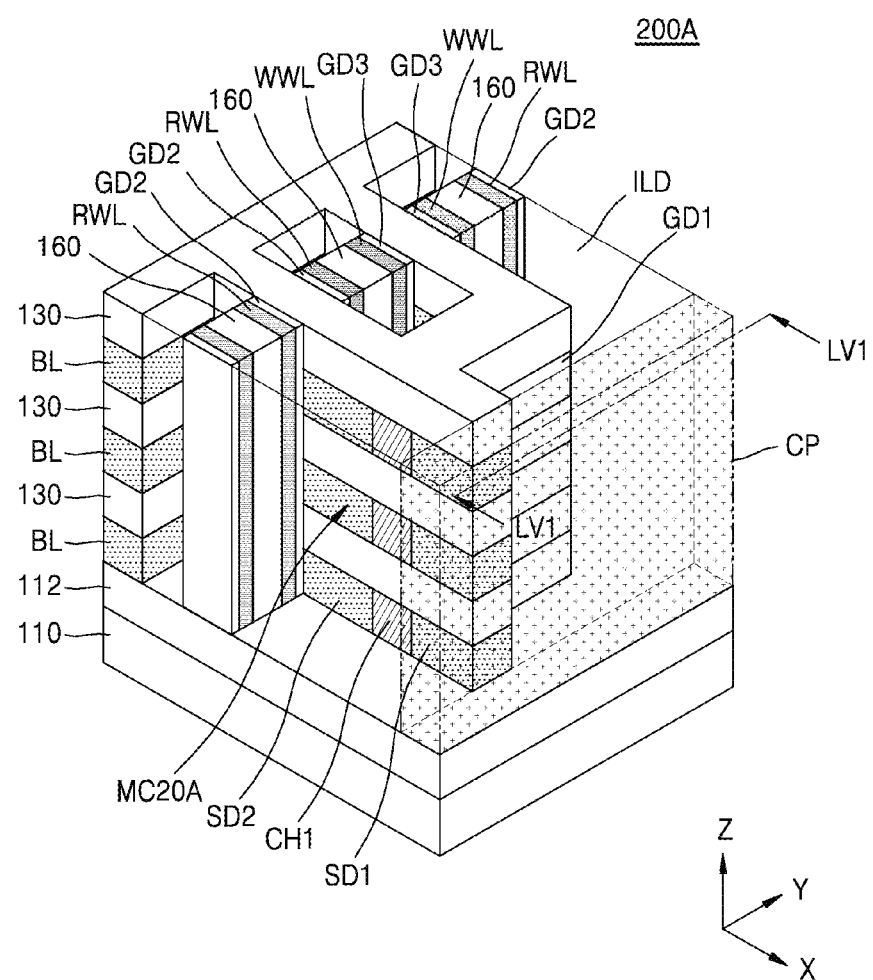
FIG. 5A is a perspective view of some region of a semiconductor memory device, according to some example embodiments of inventive concepts.
Figure 5B:
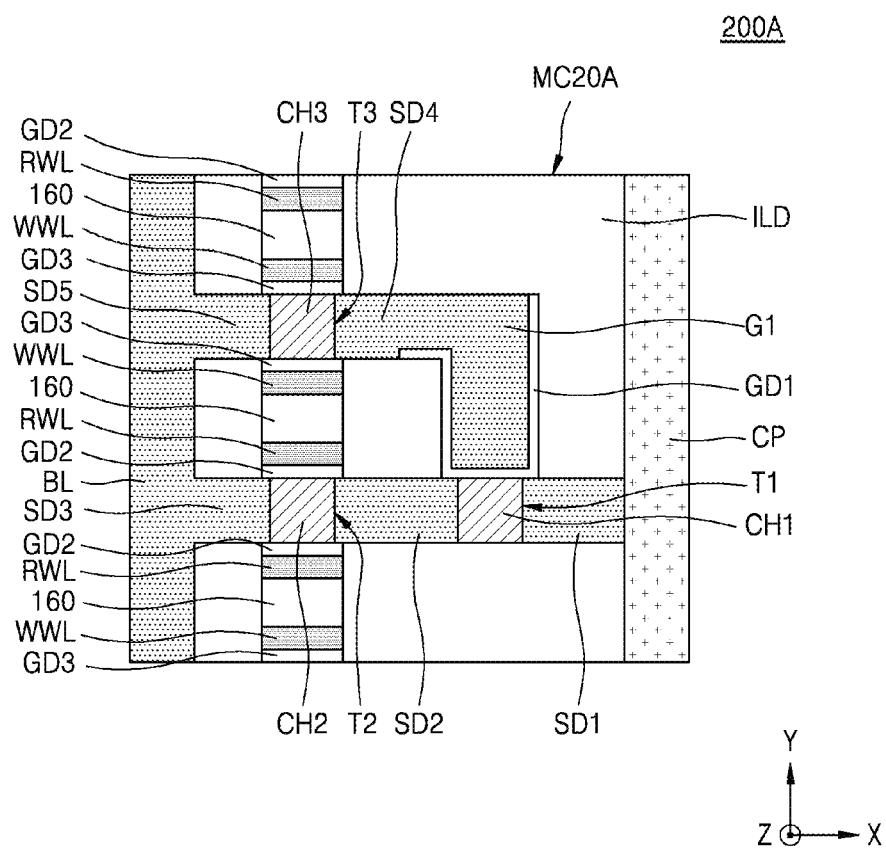
FIG. 5B is a planar view on a first level of FIG. 5A.

FIG. 5A is a perspective view of some region of a semiconductor memory device 200A, according to some example embodiments of inventive concepts, and FIG. 5B is a planar view on the first level LV1 in FIG. 3A. A more detailed example of the semiconductor memory device 200 illustrated in FIG. 4 is described with reference to FIGS. 5A and 5B.

Figure 6A:
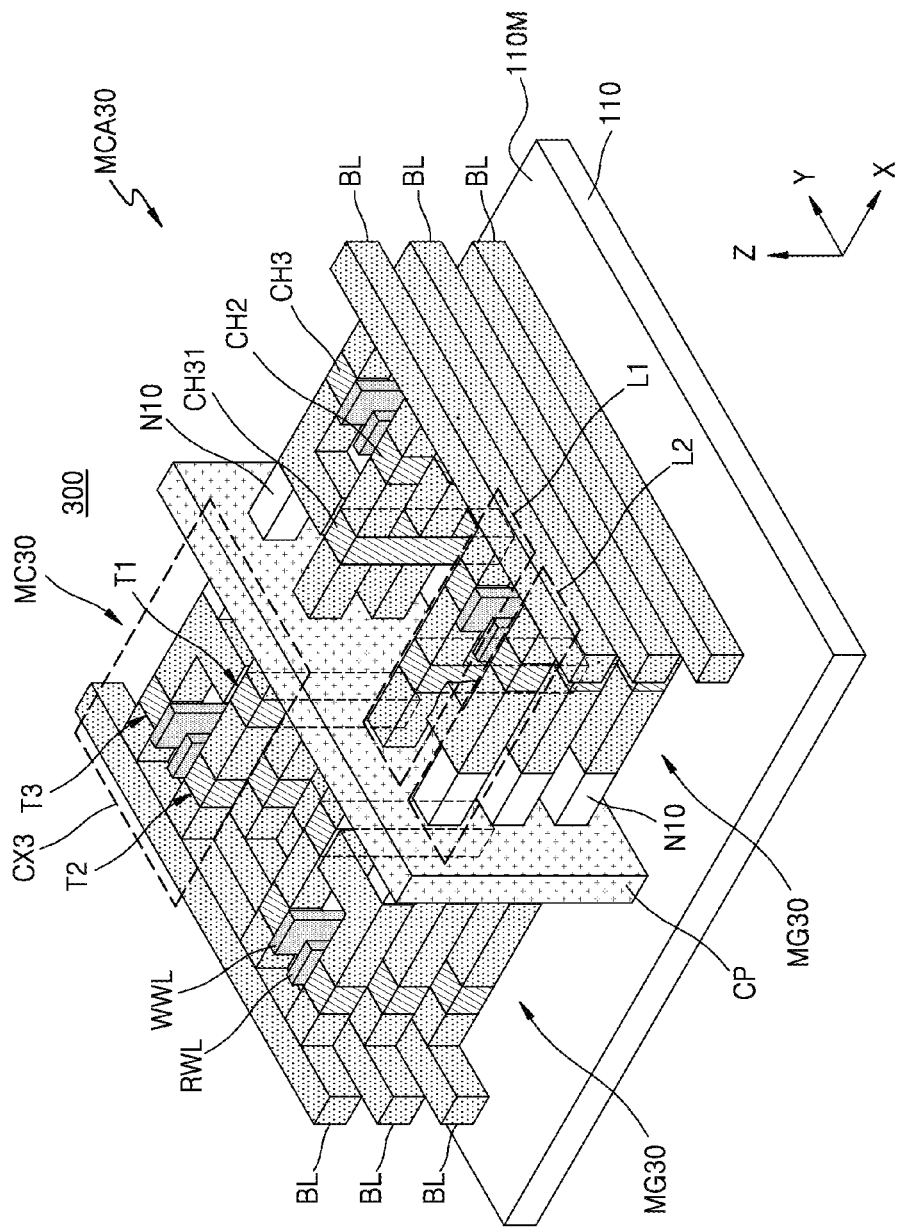
FIG. 6A is a perspective view illustrating some components of a semiconductor memory device, according to some example embodiments of inventive concepts.
Figure 6B:
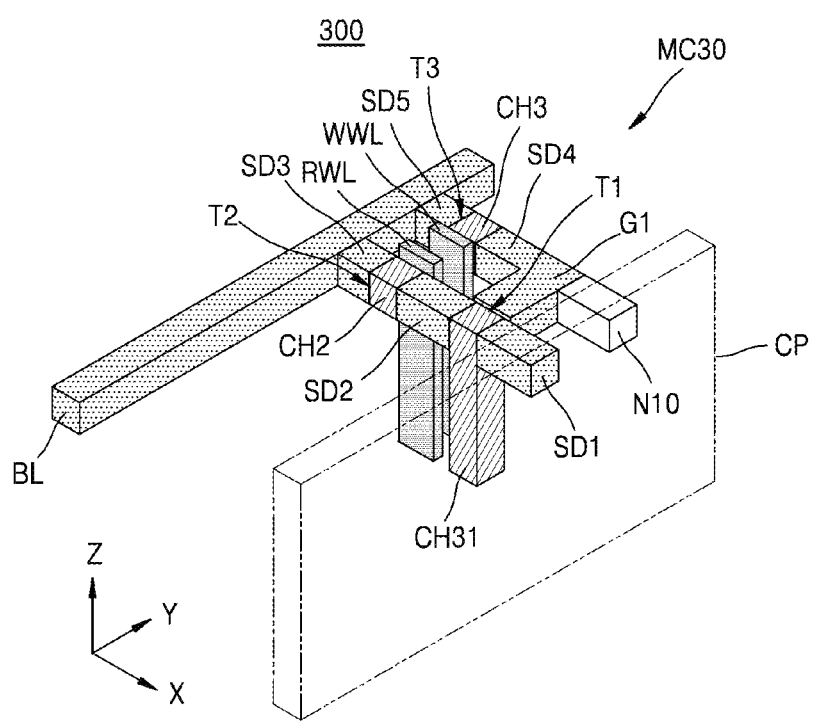
FIG. 6B is a perspective view illustrating some components of one memory cell included in a dashed line region CX3 in FIG. 6A.

Referring to FIGS. 5A and 5B, the semiconductor memory device 200A may have substantially the same configuration as that of the semiconductor memory device 100A described with reference to FIGS. 3A and 3B. However, the semiconductor memory device 200A may include a plurality of memory cells MC20A. The intermediate insulating layer 130 may be between each of the plurality of memory cells MC20A arranged in a row in the vertical direction (Z direction). In the plurality of memory cells MC20A, the second gate insulating layer GD2 may be between the second channel region CH2 and each of the pair of read word lines RWL, and the third gate insulating layer GD3 may be between the third channel region CH3 and each of the pair of write word lines WWL FIGS. 6A and 6B are diagrams for describing a semiconductor memory device 300 according to some example embodiments of inventive concepts. FIG. 6A is a perspective view illustrating some components of the semiconductor memory device 300, and FIG. 6B is a perspective view illustrating some components of one memory cell MC30 included in a dashed line region CX3 in FIG. 6A.

Referring to FIGS. 6A and 6B, the semiconductor memory device 300 may have substantially the same configuration as that of the semiconductor memory device 100 described with reference to FIGS. 2A and 2B. However, the semiconductor memory device 300 may include a memory cell array MCA30 having a three-dimensional structure including a plurality of memory cells MC30.

The memory cell array MCA30 may constitute/correspond to the circuits illustrated in FIGS. 1A and 1B. The memory cell array MCA30 may include a plurality of memory cell groups MG30 including the plurality of memory cells MC that are arranged in two dimensions in the second horizontal direction (HD2 direction) and the vertical direction (VD direction). The plurality of memory cell groups MG30 may be repeatedly arranged in the first horizontal direction (HD1 direction).

In the semiconductor memory device 300, the first transistor T1 may include a first channel region CH31 extending long in the vertical direction (Z direction). The first channel region CH31 may extend in parallel with the plurality of read word lines RWL and the plurality of write word lines WWL on the substrate 110. The first channel region CH31 may be shared by the first transistor T1 of each of the plurality of memory cells MC30 arranged in a row in the vertical direction (Z direction) among the plurality of memory cells MC30.

Figure 7:
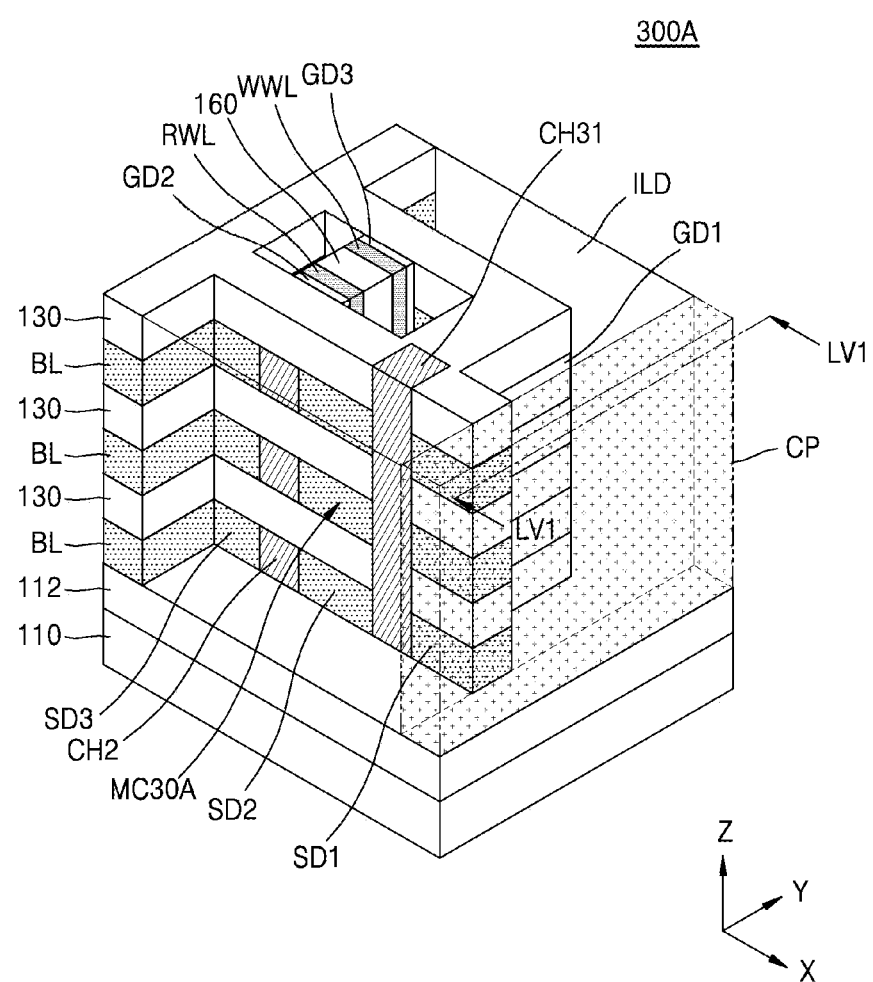
FIGS. 7 through 10 are perspective views for describing a semiconductor memory device, according to some example embodiments of inventive concepts.

FIG. 7 is a perspective view of a semiconductor memory device 300A according to some example embodiments of inventive concepts. A more detailed example of the semiconductor memory device 300 illustrated in FIGS. 6A and 6B is described with reference to FIG. 7.

Referring to FIG. 7, the semiconductor memory device 300A may have substantially the same configuration as that of the semiconductor memory device 100A described with reference to FIGS. 3A and 3B. However, the semiconductor memory device 300A may include a plurality of memory cells MC30A. The plurality of memory cells MC30A may have substantially the same configuration as that described with respect to the plurality of memory cells MC30 with reference to FIGS. 6A and 6B. The plurality of memory cells MC30A may correspond to the plurality of memory cells MC30 arranged in a row in the vertical direction (Z direction) in the dashed line region CX3 in FIG. 6A. The intermediate insulating layer 130 may be between each of the plurality of memory cells MC30A arranged in a row in the vertical direction (Z direction). The plurality of first transistors T1 included in the plurality of memory cells MC30A that are arranged in a row in the vertical direction (Z direction) may share one first channel region CH31.

Figure 8:
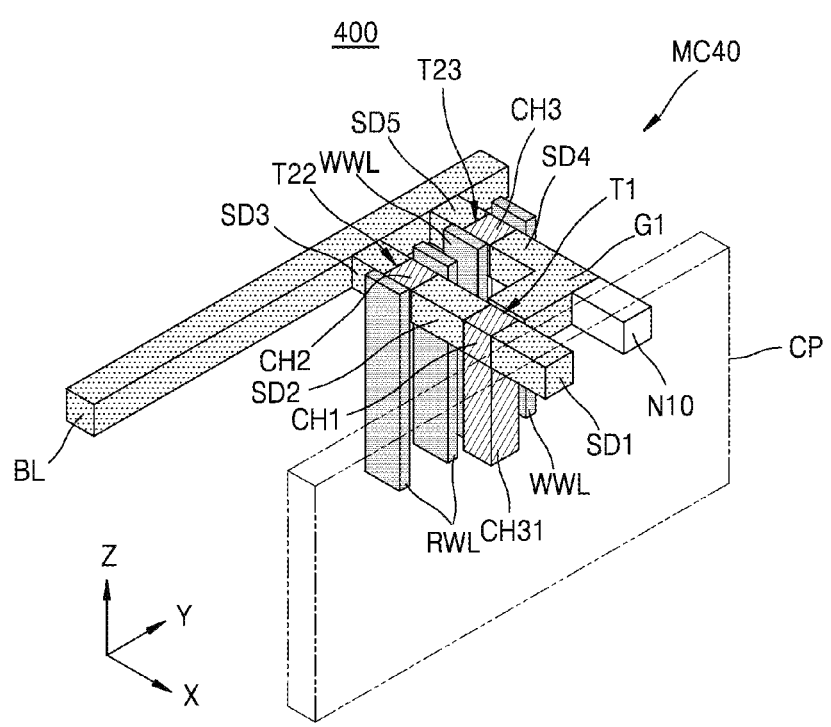

FIG. 8 is a perspective view of some components of a semiconductor memory device 400, according to some example embodiments of inventive concepts.

Referring to FIG. 8, the semiconductor memory device 400 may have substantially the same configuration as that of the semiconductor memory device 300 described with reference to FIGS. 6A and 6B. However, the semiconductor memory device 400 may include a memory cell MC40 instead of the memory cell MC30. A memory cell array of a three-dimensional structure including the plurality of memory cells MC40 may constitute/correspond to the circuit illustrated in FIGS. 1A and 1B. Similarly to the memory cell MC20 described with reference to FIG. 4, the semiconductor memory device 400 may include the second transistor T22 and the third transistor T23, both having a double gate structure. The second transistor T22 may include the pair of read word lines RWL covering both sidewalls of the second channel region CH2, and the third transistor T23 may include the pair of write word lines WWL covering both sidewalls of the third channel region CH3.

Figure 9:
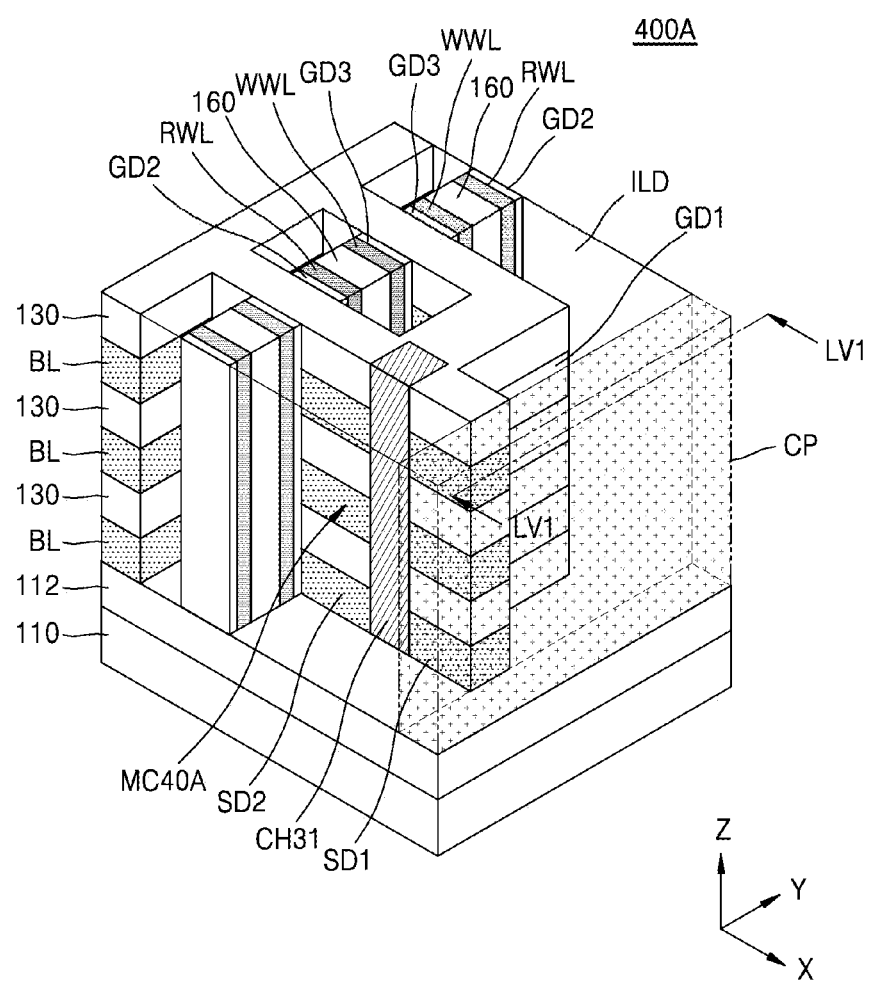

FIG. 9 is a perspective view of a semiconductor memory device 400A according to some example embodiments of inventive concepts. A more detailed example of the semiconductor memory device 400 illustrated in FIG. 8 is described with reference to FIG. 9.

Referring to FIG. 9, the semiconductor memory device 400A has substantially the same configuration as that described with respect to the semiconductor memory device 200A with reference to FIGS. 5A and 5B. The semiconductor memory device 400A may have a planar configuration that is substantially the same as the planar configuration illustrated in FIG. 5B. However, the semiconductor memory device 400A may include the first channel region CH31. The plurality of memory cells MC40A arranged in a row in the vertical direction (Z direction) may share one first channel region CH31.

Figure 10:
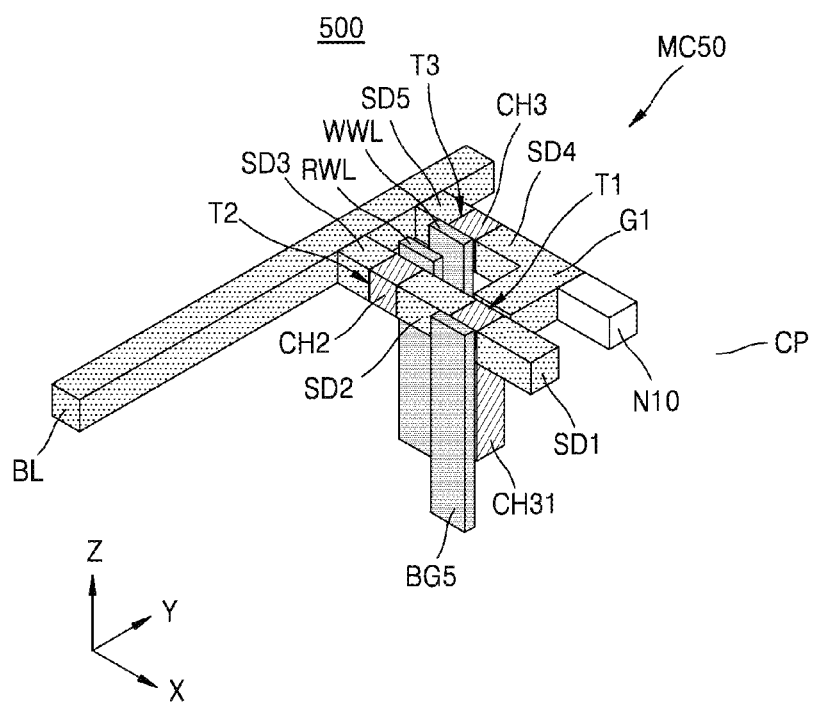

FIG. 10 is a perspective view of some components of a semiconductor memory device 500, according to some example embodiments of inventive concepts.

Referring to FIG. 10, the semiconductor memory device 500 has substantially the same configuration as that described with respect to the semiconductor memory device 300 with reference to FIGS. 6A and 6B. However, the semiconductor memory device 500 may include a memory cell MC50 instead of the memory cell MC30. The memory cell MC50 may include a back-gate BG5 facing the first channel region CH31. The back-gate BG5 may face the storage gate G1 with the first channel region CH31 therebetween. The back-gate BG5 may extend in parallel with the read word line RWL and the write word line WWL in the vertical direction (Z direction). The back-gate BG5 may be shared by the first transistor T1 of each of the plurality of memory cells MC50 arranged in a row in the vertical direction (Z direction) among the plurality of memory cells MC50 constituting/corresponding to the semiconductor memory device 500. The semiconductor memory device 500 may control a leakage current that is caused by the first channel region CH31 due to inclusion of the back-gate BG5.

Figure 11A:
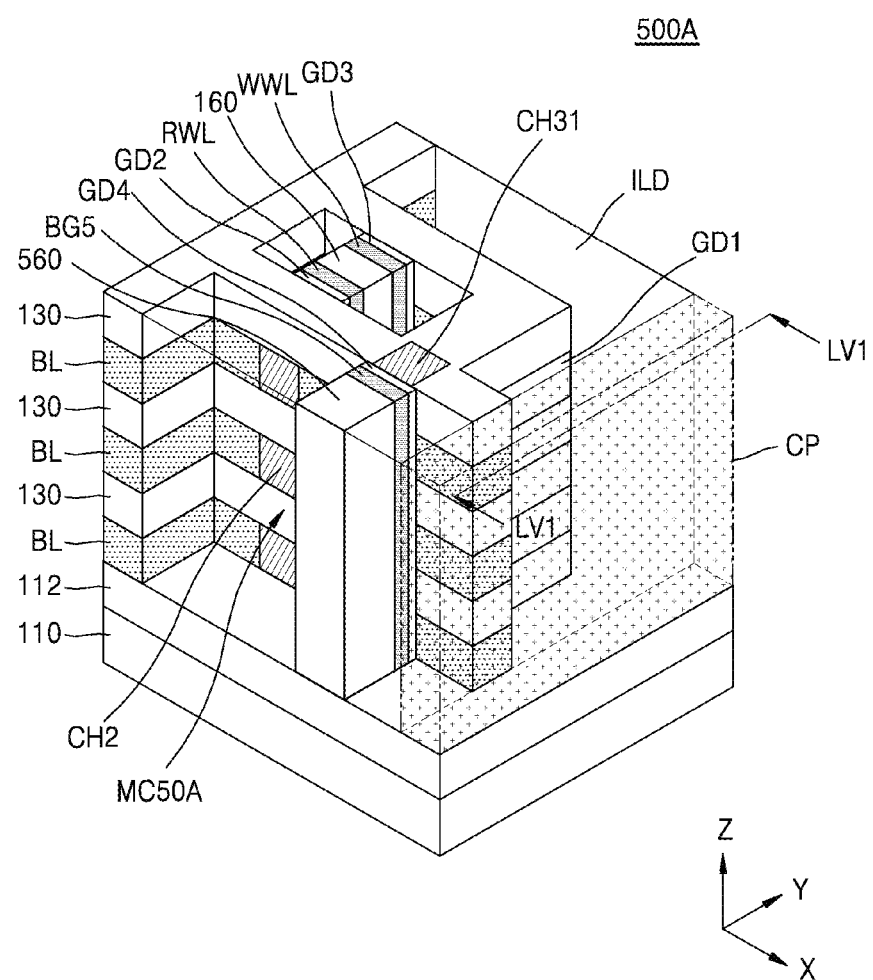
FIG. 11A is a perspective view of some region of a semiconductor memory device, according to some example embodiments of inventive concepts.
Figure 11B:
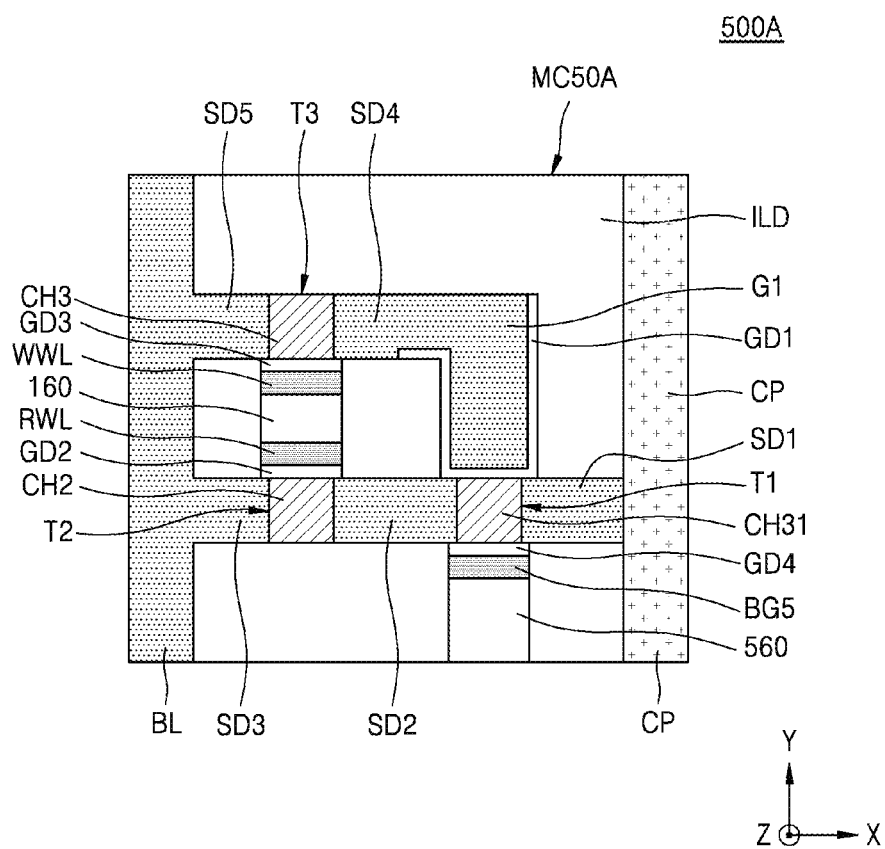
FIG. 11B is a planar view on a first level in FIG. 11A.

FIG. 11A is a perspective view of some region of a semiconductor memory device 500A, according to some example embodiments of inventive concepts, and FIG. 11B is a planar view on the first level LV1 in FIG. 11A. A more detailed example of the semiconductor memory device 500 illustrated in FIG. 10 is described with reference to FIGS. 11A and 11B.

Referring to FIGS. 11A and 11B, the semiconductor memory device 500A may have substantially the same configuration as that of the semiconductor memory device 300A described with reference to FIG. 7. However, the semiconductor memory device 500A may include a plurality of memory cells MC50A. The memory cell MC50A may include a back-gate BG5 facing the first channel region CH31. A fourth gate insulating layer GD4 may be between the first channel region CH31 and the back-gate BG5. A sidewall opposite to the sidewall facing the first channel region CH31 among the sidewalls of the back gate BG5 may be covered by an insulating fence 560. More detailed configurations of the fourth gate insulating layer GD4 and the insulating fence 560 may be the same as those of the first gate insulating layer GD1 and the insulating fence 160 described with reference to FIG. 5B.

Figure 12A:
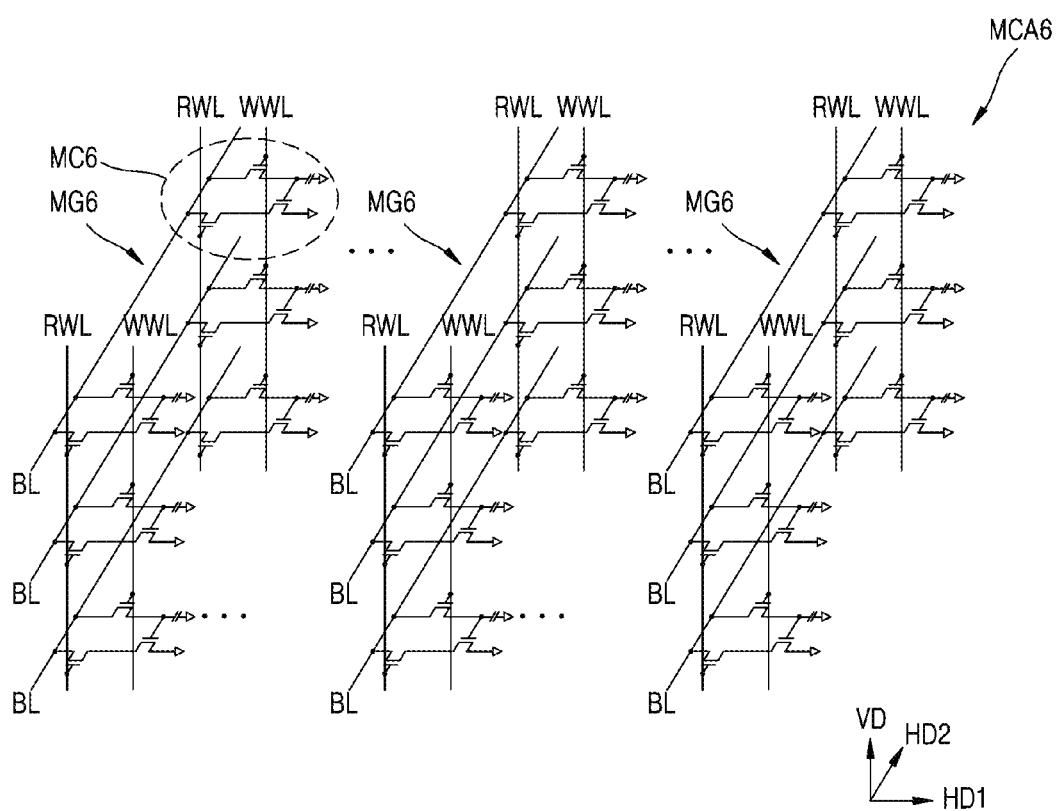
FIG. 12A is a circuit diagram illustrating a circuit configuration of a memory cell array of a semiconductor memory device, according to some example embodiments of inventive concepts.
Figure 12B:
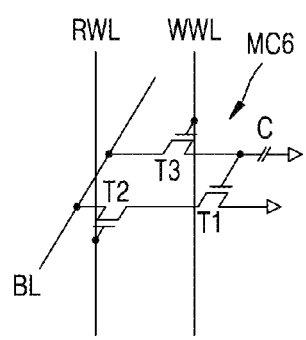
FIG. 12B is a circuit diagram of a memory cell illustrated in FIG. 12A.

FIG. 12A is a circuit diagram illustrating a circuit configuration of a memory cell array MCA6 of a semiconductor memory device 60, according to some example embodiments of inventive concepts, and FIG. 12B is a circuit diagram of a memory cell MC6 included in the memory cell array MCA6 illustrated in FIG. 12A.

Referring to FIGS. 12A and 12B, the semiconductor memory device 60 may include the memory cell array MCA6 having a three-dimensional structure. The memory cell array MCA6 may include a plurality of memory cells MC6 that are repeatedly arranged in a first horizontal direction (HD1 direction), a second horizontal direction (HD2 direction), and a vertical direction (VD direction). Each of the plurality of memory cells MC6 may have substantially the same configuration as that of the plurality of memory cells MC1 described with reference to FIGS. 1A and 1B. The memory cell array MCA6 may include a plurality of memory cell groups MG6 including the plurality of memory cells MC6 arranged in two dimensions in the second horizontal direction (HD2 direction) and the vertical direction (VD direction). The plurality of memory cell groups MG6 may be repeatedly arranged in the first horizontal direction (HD1 direction). However, as an alternative to that described with reference to FIGS. 1A and 1B, each of the plurality of memory cells MC6 may further include a capacitor C. For example, the plurality of memory cells MC6 may include three-transistor one-capacitor (3T1C) memory cells including three transistors that are the first transistor T1, the second transistor T2, and the third transistor T3 and one capacitor C.

In the plurality of memory cells MC6, the capacitor C may be connected between a voltage terminal and the storage gate G1. Since the plurality of memory cells MC6 include the capacitor C, the retention time of each of the plurality of memory cells MC6 may be extended, and refresh characteristics of the semiconductor memory device 60 may be improved. For example, charge may be stored within the capacitor C, and the charge stored within the capacitor C may improve the refresh performance of the memory cells MC6.

Figure 13:
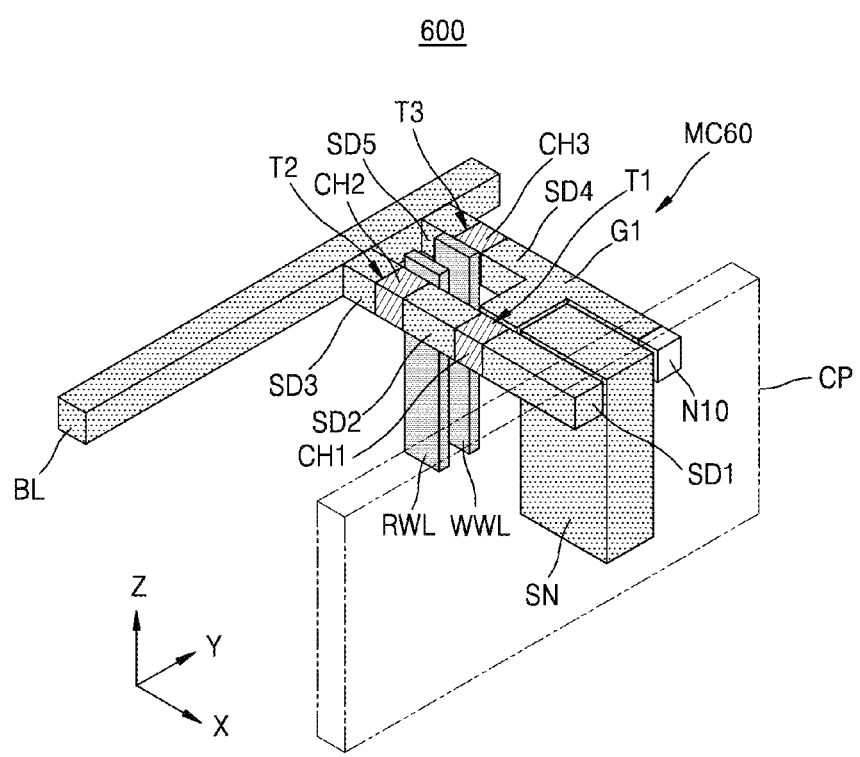
FIG. 13 is a perspective view illustrating some components of a semiconductor memory device, according to some example embodiments of inventive concepts.

FIG. 13 is a perspective view illustrating some components of a semiconductor memory device 600, according to some example embodiments of inventive concepts.

Referring to FIG. 13, the semiconductor memory device 600 may include a memory cell MC60. The memory cell MC60 may have substantially the same configuration as that of the memory cell MC10 of the semiconductor memory device 100 described with reference to FIGS. 2A and 2B. However, the memory cell MC60 may further include a storage node SN. A memory cell array including the plurality of memory cells MC60 may constitute/correspond to the circuit illustrated in FIGS. 12A and 12B.

The storage node SN may constitute/correspond to at least a portion of the capacitor C illustrated in FIGS. 12A and 12B. The storage node SN may include a portion facing the storage gate G1 at a location apart from the storage gate G1, and a portion facing the source/drain region SD1 at a location apart from the source/drain region SD1 of the first transistor T1. One end of the storage node SN and one end of the source/drain region SD1 of the first transistor T1 may be connected to the common plate CP.

The semiconductor memory device 600 may include the plurality of memory cells MC60 arranged in three dimensions similarly to the plurality of memory cells MC10 of the semiconductor memory device 100 illustrated in FIG. 2A. The plurality of memory cells MC60 that are arranged in a row in the second horizontal direction (Y direction) among the plurality of memory cells MC60 may share one storage node SN.

Figure 14A:
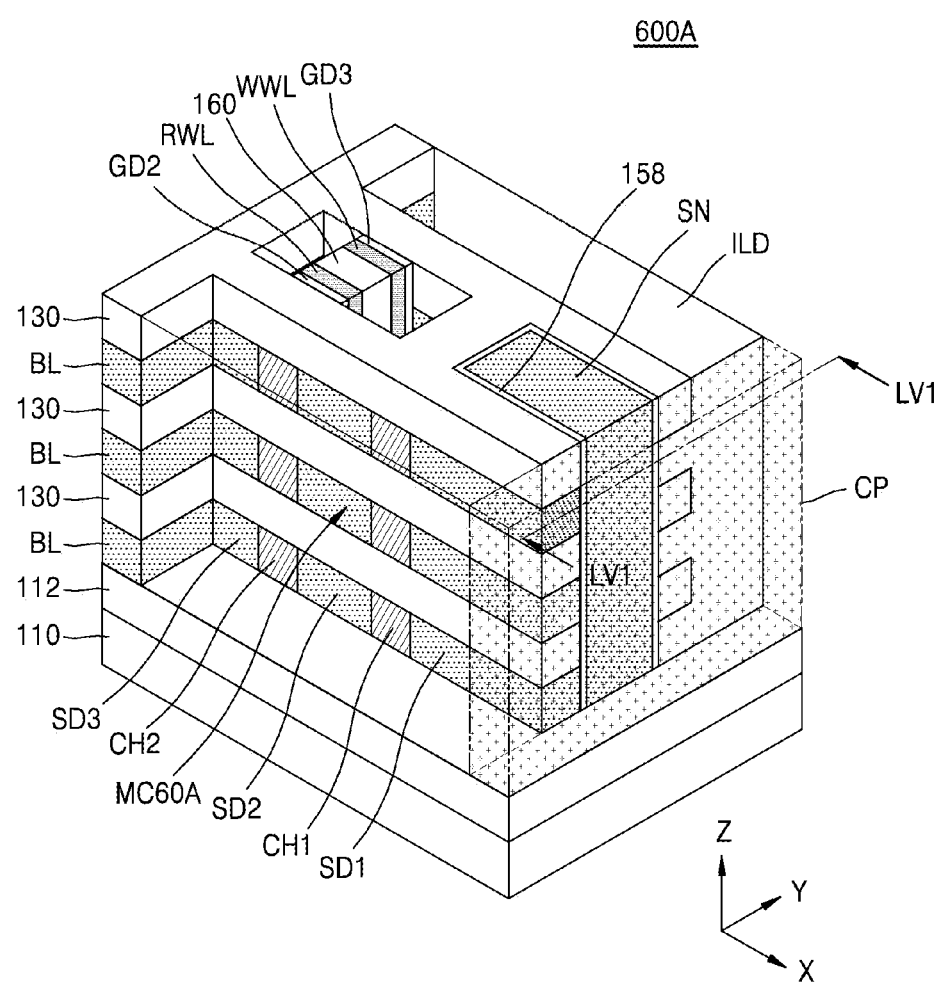
FIG. 14A is a perspective view of some region of a semiconductor memory device, according to some example embodiments of inventive concepts.
Figure 14B:
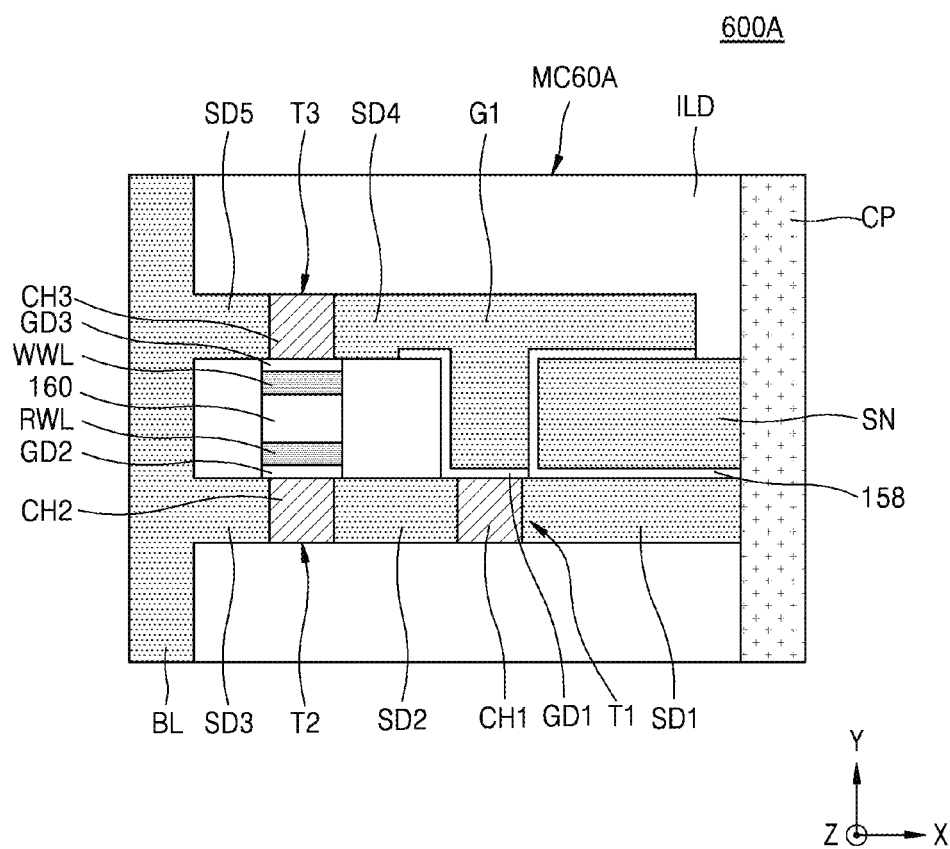
FIG. 14B is a planar view on a first level in FIG. 14A.

FIG. 14A is a perspective view of some region of a semiconductor memory device 600A, according to some example embodiments of inventive concepts, and FIG. 14B is a planar view on the first level LV1 in FIG. 14A. A more detailed example of the semiconductor memory device 600 illustrated in FIG. 13 is described with reference to FIGS. 14A and 14B.

Referring to FIGS. 14A and 14B, the semiconductor memory device 600A has substantially the same configuration as that described with respect to the semiconductor memory device 100A with reference to FIGS. 3A and 3B. However, the semiconductor memory device 600A may include a plurality of memory cells MC60A.

In the plurality of memory cells MC60A, the storage node SN may be adjacent to the source/drain region SD1 of the first transistor T1 in the second horizontal direction (Y direction) with a capacitor dielectric layer 158 therebetween, and may be adjacent to the storage gate G1 in the first horizontal direction (X direction) and the second horizontal direction (Y direction) with the capacitor dielectric layer 158 therebetween. The capacitor dielectric layer 158 may include a silicon oxide layer, a silicon oxynitride layer, a high-k dielectric layer, a ferroelectric layer, or a combination or sub-combination thereof.

The storage node SN may be apart from the first transistor T1 with the capacitor dielectric layer 158 therebetween and may extend long in the horizontal direction (X direction) between the source/drain region SD1 of the first transistor T1 and the storage gate G1. One end of the source/drain region SD1 of the first transistor T1 and one end of the storage node SN may be connected to (e.g. directly connected to) the common plate CP. The common plate CP may include a portion in contact with/direct contact with the source/drain region SD1 and a portion in contact with/direct contact with the storage node SN. The storage gate G1 may be apart from the common plate CP with the buried insulating layer ILD therebetween. A memory cell array including the plurality of memory cells MC60A may constitute/correspond to the circuit illustrated in FIGS. 12A and 12B.

Figure 15:
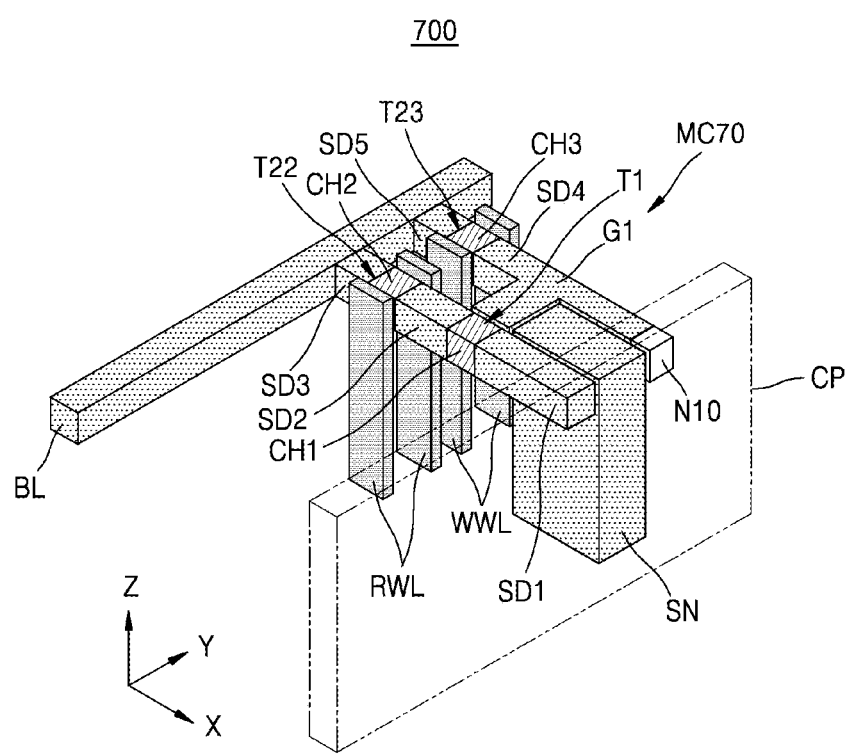
FIG. 15 is a perspective view illustrating some components of a semiconductor memory device, according to some example embodiments of inventive concepts.

FIG. 15 is a perspective view illustrating some components of a semiconductor memory device 700, according to some example embodiments of inventive concepts.

Referring to FIG. 15, the semiconductor memory device 700 has a configuration substantially the same as that described with reference to FIG. 13. However, the semiconductor memory device 700 may include a plurality of memory cells MC70. A memory cell array including the plurality of memory cells MC70 may constitute the circuit illustrated in FIGS. 12A and 12B. The memory cell MC70 may include the second transistor T22 and the third transistor T23. Detailed configurations of the second transistor T22 and the third transistor T23 may be the same as those described with reference to FIG. 4.

In some example embodiments, one of the pair of conductive lines constituting/corresponding the pair of read word lines RWL included in the second transistor T22 in the semiconductor memory device 700 may be used as a back-gate for controlling a threshold voltage of the second transistor T22, instead of using as a read word line. In addition, one of a pair of conductive lines forming the pair of write word lines WWL included in the third transistor T23 may be used as a back-gate for controlling a threshold voltage of the third transistor T23 instead of using as a write word line.

Figure 16A:
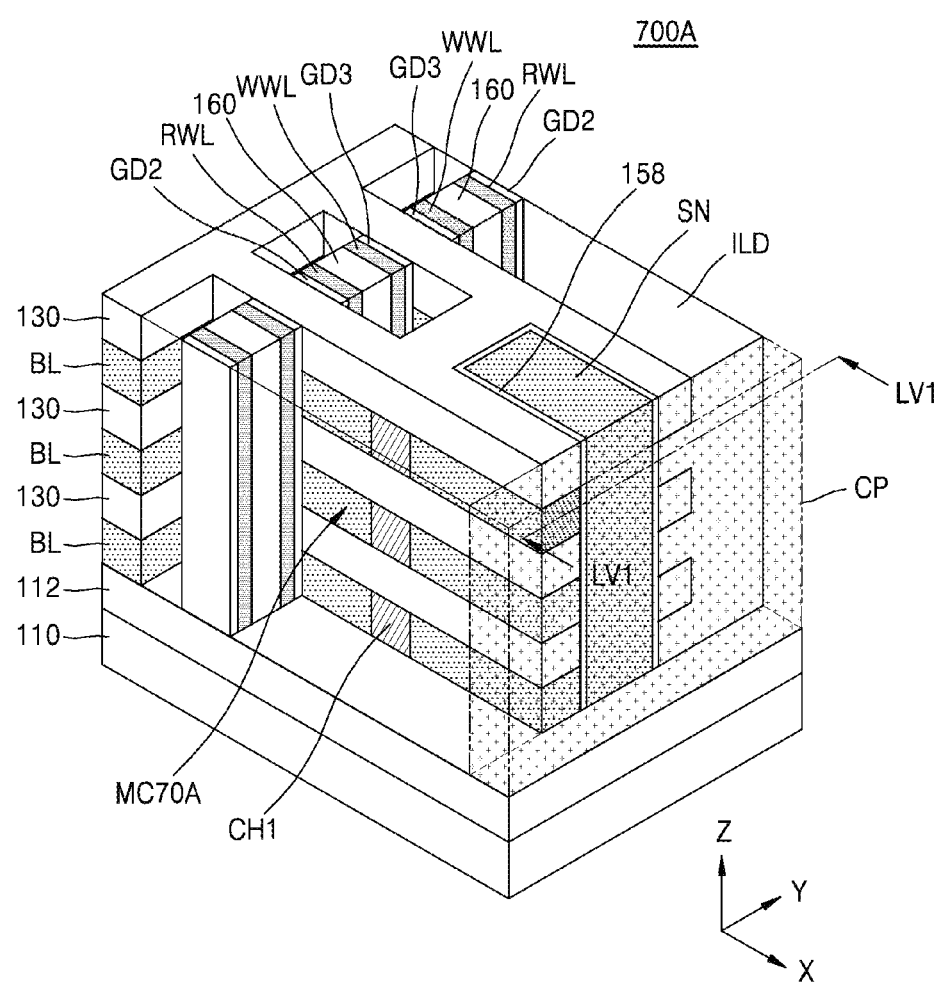
FIG. 16A is a perspective view of some region of a semiconductor memory device, according to some example embodiments of inventive concepts.
Figure 16B:
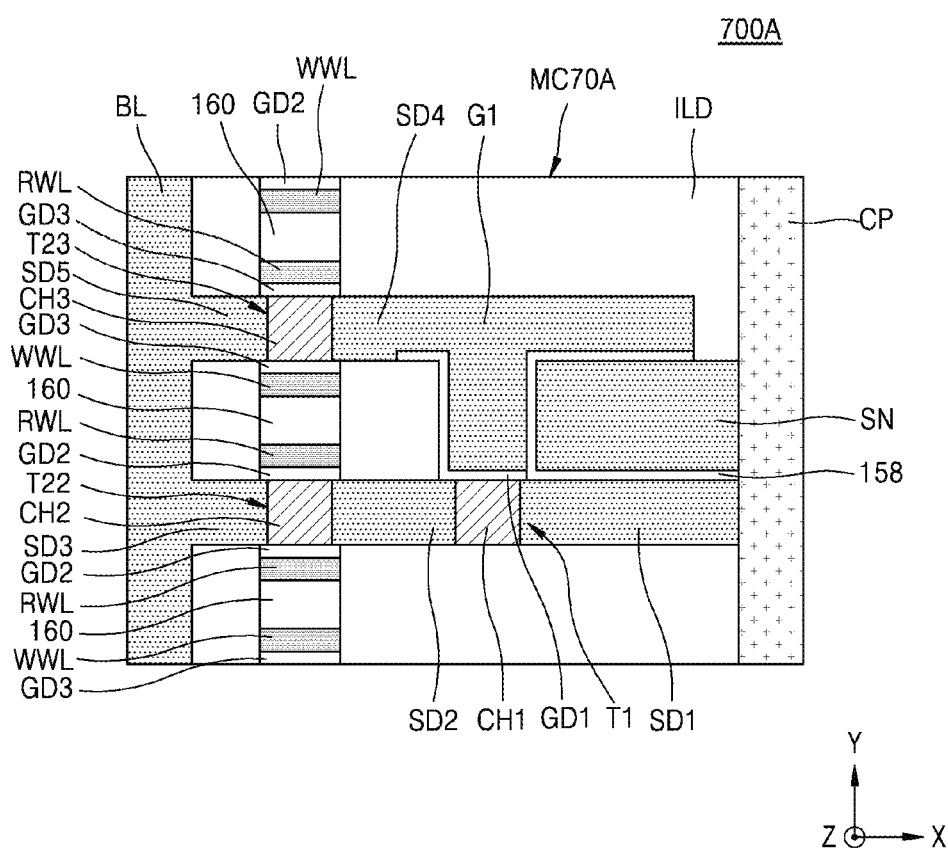
FIG. 16B is a planar view on a first level in FIG. 16A.

FIG. 16A is a perspective view of some region of a semiconductor memory device 700A, according to some example embodiments of inventive concepts, and FIG. 16B is a planar view on the first level LV1 in FIG. 16A. A more detailed example of the semiconductor memory device 700 illustrated in FIG. 15 is described with reference to FIGS. 16A and 16B.

Referring to FIGS. 16A and 16B, the semiconductor memory device 700A has a configuration substantially the same as that described with respect to the semiconductor memory device 600A with reference to FIGS. 14A and 14B. However, the semiconductor memory device 700A may include a plurality of memory cells MC70A. The plurality of memory cells MC70A may include the second transistor T22 and the third transistor T23 having a double gate structure including a pair of read word lines RWL and a pair of write word lines WWL. The second gate insulating layer GD2 may be between the second channel region CH2 and each of the pair of read word lines RWL, and the third gate insulating layer GD3 may be between the third channel region CH3 and each of the pair of write word lines WWL.

Figure 17:
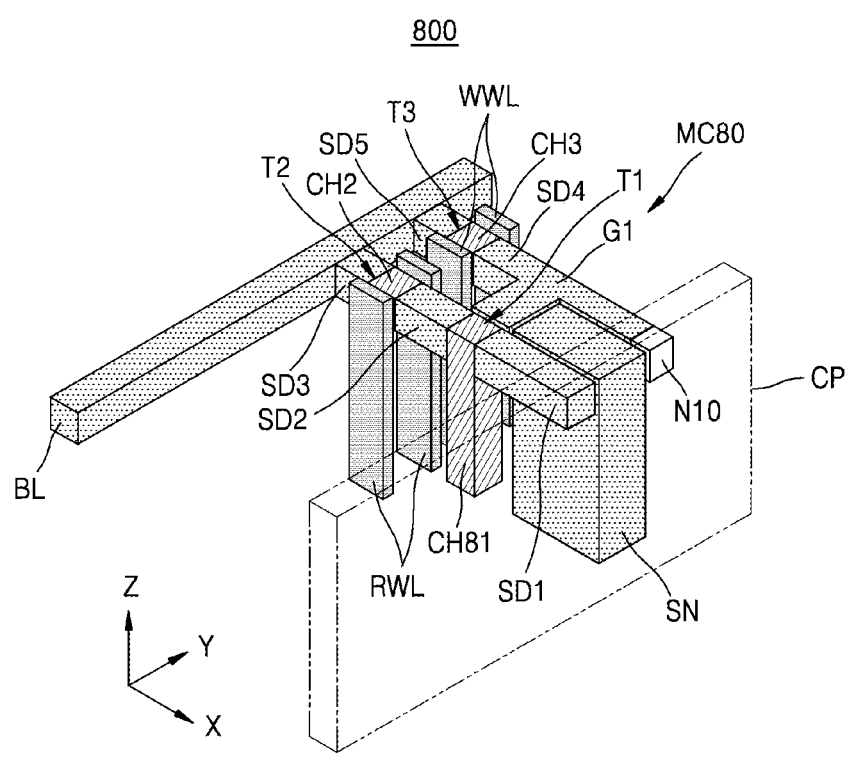
FIGS. 17 through 19 are each a perspective view illustrating some components of a semiconductor memory device, according to some example embodiments of inventive concepts.

FIG. 17 is a perspective view illustrating some components of a semiconductor memory device 800, according to some example embodiments of inventive concepts.

Referring to FIG. 17, the semiconductor memory device 800 may have substantially the same configuration as that of the semiconductor memory device 700 described with reference to FIG. 15. However, the semiconductor memory device 700 may include a plurality of memory cells MC80. In the memory cell MC80, the first transistor T1 may include a first channel region CH81 extending long in the vertical direction (Z direction). A detailed configuration of the first channel region CH81 may be the same as descriptions on the first channel region CH31 given with reference to FIGS. 6A and 6B.

The memory cell MC80 may include the second transistor T22 and the third transistor T23. Detailed configurations of the second transistor T22 and the third transistor T23 may be the same as those described with reference to FIG. 4.

A memory cell array including the plurality of memory cells MC80 may constitute/correspond to the circuit illustrated in FIGS. 12A and 12B. The first channel region CH81 may be shared by the first transistor T1 of each of the plurality of memory cells MC80 arranged in a row in the vertical direction (Z direction) among the plurality of memory cells MC80 constituting the semiconductor memory device 800.

In some example embodiments, the semiconductor memory device 800 may further include the back-gate BG5 described with reference to FIG. 10. The semiconductor memory device 800 may control a leakage current that is caused by the first channel region CH81 due to inclusion of the back-gate BG5.

Figure 18:
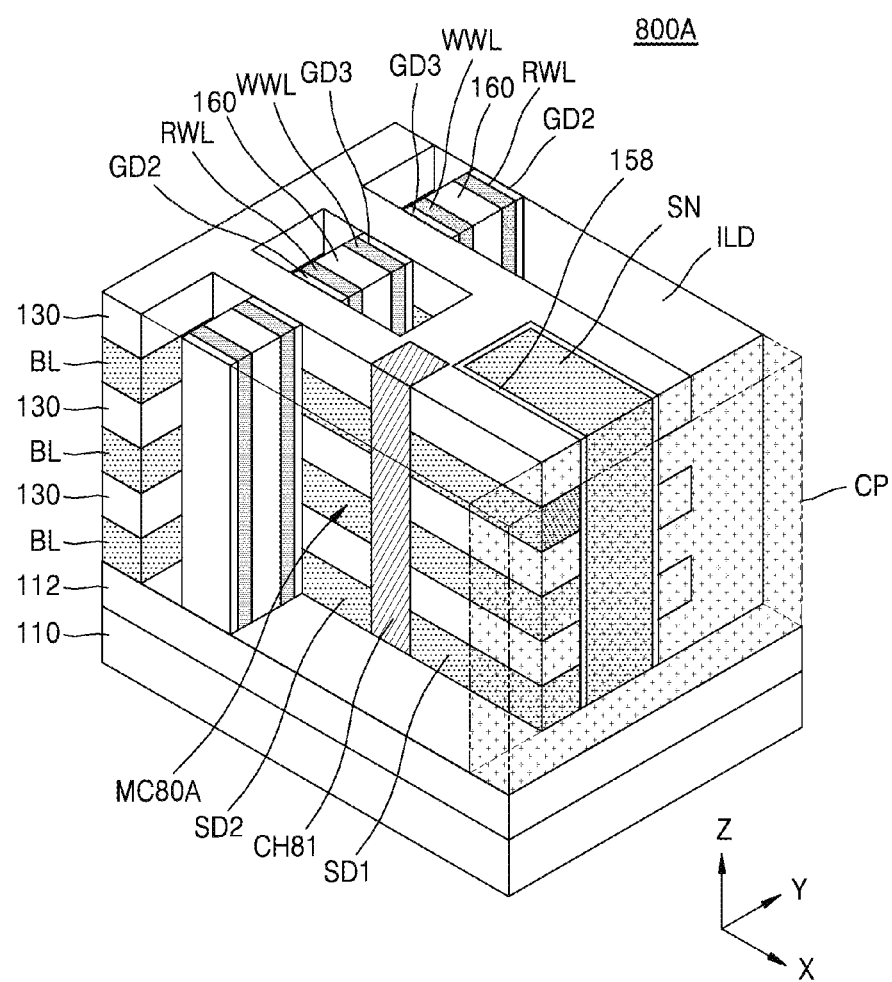

FIG. 18 is a perspective view of a semiconductor memory device 800A according to some example embodiments of inventive concepts. A more detailed example of the semiconductor memory device 800 illustrated in FIG. 17 is described with reference to FIG. 18.

Referring to FIG. 18, the semiconductor memory device 800A may have substantially the same configuration as that of the semiconductor memory device 700A described with reference to FIGS. 16A and 16B. However, the semiconductor memory device 800A may include a plurality of memory cells MC80A. In the memory cell MC80A, the first transistor T1 may include the first channel region CH81 extending long in the vertical direction (Z direction). The first channel region CH81 may be shared by the plurality of memory cells MC80A arranged in a row in the vertical direction (Z direction) among the plurality of memory cells MC80A.

Figure 19:
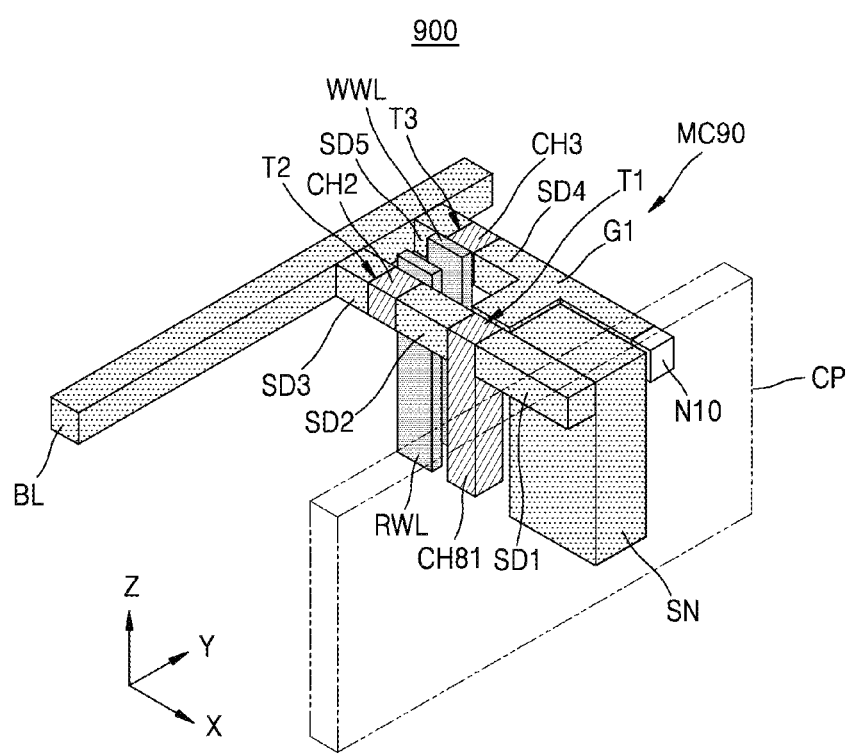

FIG. 19 is a perspective view of some components of a semiconductor memory device 900, according to some example embodiments of inventive concepts.

Referring to FIG. 19, the semiconductor memory device 900 may have substantially the same configuration as that of the semiconductor memory device 600 described with reference to FIG. 13. However, the semiconductor memory device 900 may include a plurality of memory cells MC90. In the memory cell MC90, the source/drain region SD1 of the first transistor T1 and the storage node SN may be in contact with each other. A memory cell array including the plurality of memory cells MC90 may constitute/correspond to the circuit illustrated in FIGS. 12A and 12B.

Figure 20:
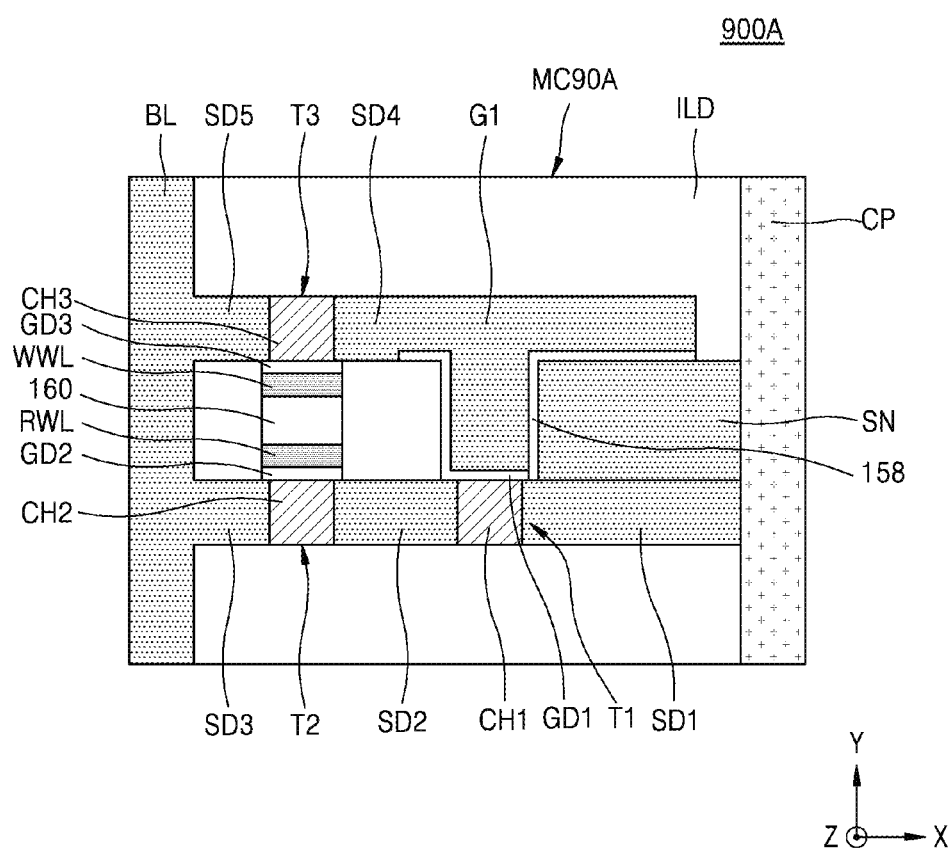
FIG. 20 is a planar view illustrating some region of a semiconductor memory device, according to some example embodiments of inventive concepts.

FIG. 20 is a planar view illustrating some region of a semiconductor memory device 900A, according to some example embodiments of inventive concepts. A more detailed example of the semiconductor memory device 900 illustrated in FIG. 19 is described with reference to FIG. 20.

Referring to FIG. 20, the semiconductor memory device 900A may include a memory cell MC90A. The memory cell MC90A has substantially the same configuration as that described with respect to the memory cell MC60A with reference to FIGS. 14A and 14B. However, in the memory cell MC90A, the source/drain region SD1 and the storage node SN may be in contact with (e.g. in direct contact with) each other. The capacitor dielectric layer 158 may be between the storage gate G1 and the storage node SN and may not be between the source/drain region SD1 and the storage node SN. A memory cell array including the plurality of memory cells MC90A may constitute the circuit illustrated in FIGS. 12A and 12B.

Figure 21A:
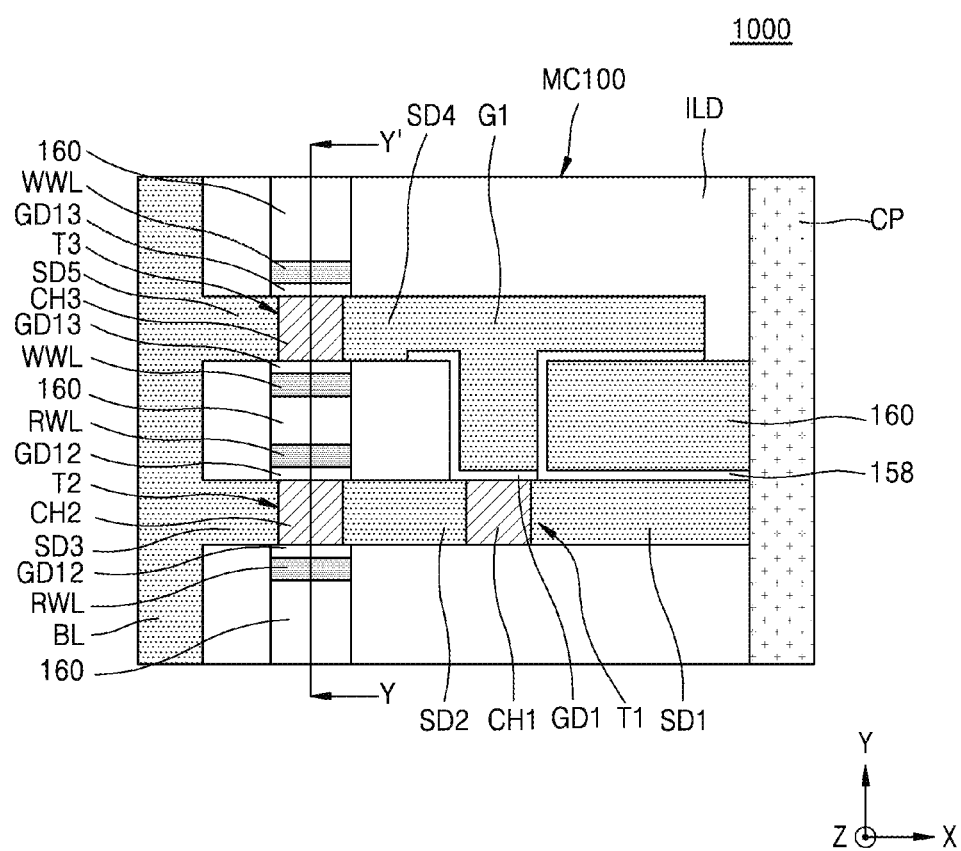
FIG. 21A is a planar view of some region of a semiconductor memory device, according to some example embodiments of inventive concepts.
Figure 21B:
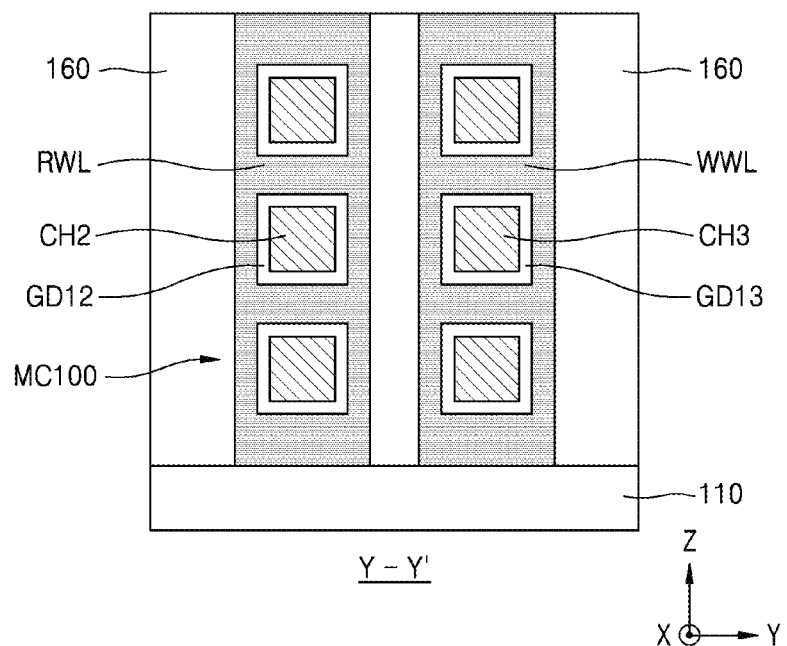
FIG. 21B is a cross-sectional view taken along line Y-Y' in FIG. 21A.

FIG. 21A is a planar view of some region of a semiconductor memory device 1000, according to some example embodiments of inventive concepts, and FIG. 21B is a cross-sectional view taken along line Y-Y' in FIG. 21A.

Referring to FIGS. 21A and 21B, the semiconductor memory device 1000 may include a memory cell MC100. The memory cell MC100 has substantially the same configuration as that described with respect to the memory cell MC60A with reference to FIGS. 14A and 14B. The planar configuration illustrated in FIG. 21A may be a planar configuration of a portion corresponding to the first level LV1 in FIG. 14A. However, in the memory cell MC100, the second channel region CH2 of the second transistor T2 may be partially or wholly surrounded by the read word line RWL, and the third channel region CH3 of the third transistor T3 may be partially or wholly surrounded by the write word line WWL. As illustrated in FIG. 21B, the read word line RWL may cover a bottom surface, a top surface, and both sidewalls of the second channel region CH2, and the write word line WWL may cover a bottom surface, a top surface, and both sidewalls of the third channel region CH3.

A second gate insulating layer GD12 may be between the second channel region CH2 and the read word line RWL, and a third gate insulating layer GD13 may be between the third channel region CH3 and the write word line WWL. More detailed configurations of the second gate insulating layer GD12 and the third gate insulating layer GD13 may be the same as those of the second gate insulating layer GD2 and the third gate insulating layer GD3 described with reference to FIGS. 3A and 3B. Both sidewalls of each of the read word line RWL and the write word line WWL may be covered by the insulating fence 160.

Figure 22:
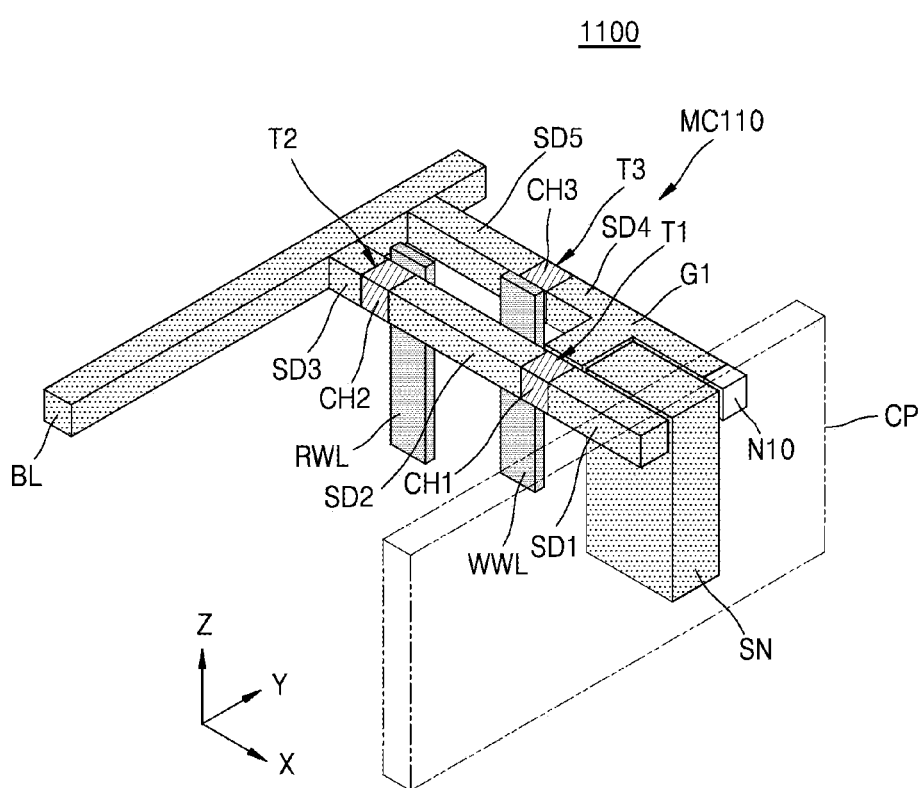
FIG. 22 is a perspective view illustrating some region of a semiconductor memory device, according to some example embodiments of inventive concepts.
Figure 23:
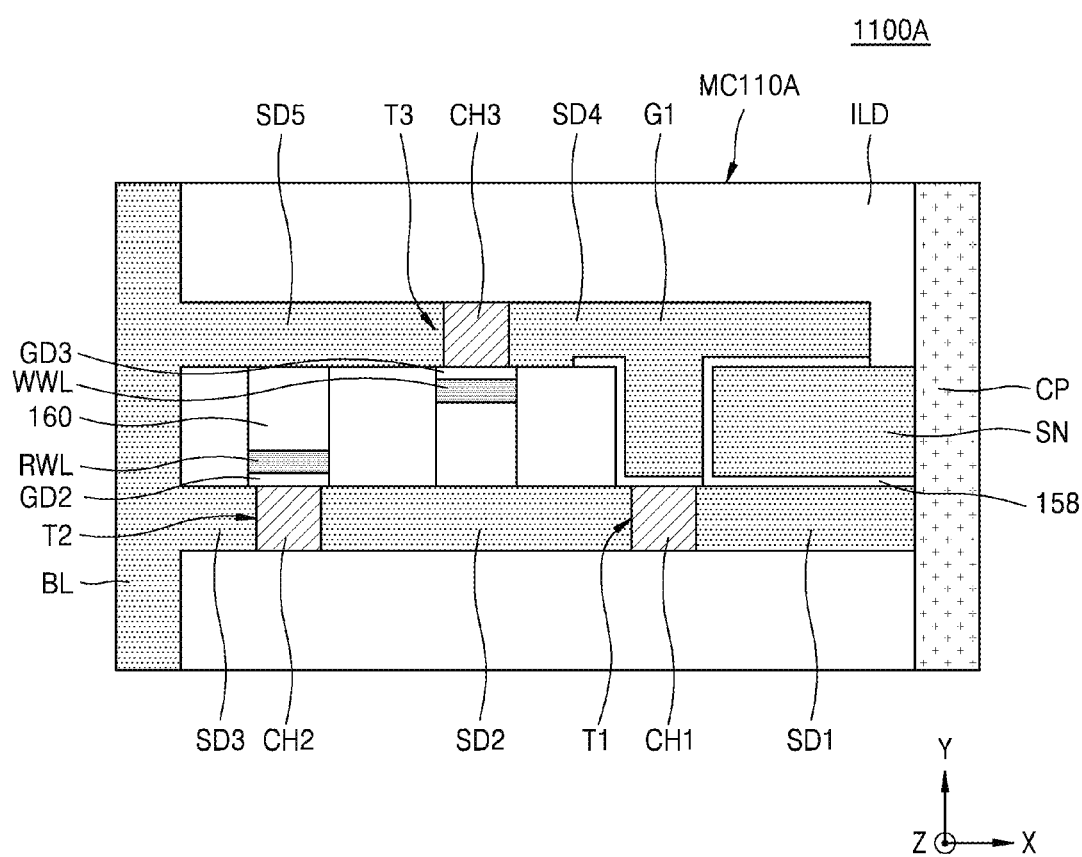
FIG. 23 is a planar view of a semiconductor memory device, according to some example embodiments of inventive concepts.

FIG. 22 is a perspective view of some region of a semiconductor memory device 1100, according to some example embodiments of inventive concepts, and FIG. 23 is a plan view of the semiconductor memory device 1100A that is a more detailed embodiment of the semiconductor memory device 1100 illustrated in FIG. 22.

Referring to FIGS. 22 and 23, the semiconductor memory devices 1100 and 1100A may have substantially the same configurations as those of the semiconductor memory devices 600 and 600A described with reference to FIGS. 13, 14A, and 14B. However, in memory cells MC100 and MC110A of the semiconductor memory devices 1100 and 1100A, the second channel region CH2 of the second transistor T2 and the third channel region CH3 of the third transistor T3 may be arranged offset from each other instead of being on one straight line in the second horizontal direction (Y direction). In the first horizontal direction (X direction), a shortest distance from the bit line BL to the second channel region CH2 may be different from a shortest distance from the bit line BL to the third channel region CH3.

The read word line RWL of the second channel region CH2 and the write word line WWL of the third channel region CH3 may be arranged offset from each other instead of being on one straight line in the second horizontal direction (Y direction). In the first horizontal direction (X direction), a shortest distance from the bit line BL to the read word line RWL may be different from a shortest distance from the bit line BL to the write word line WWL.

Figure 24A:
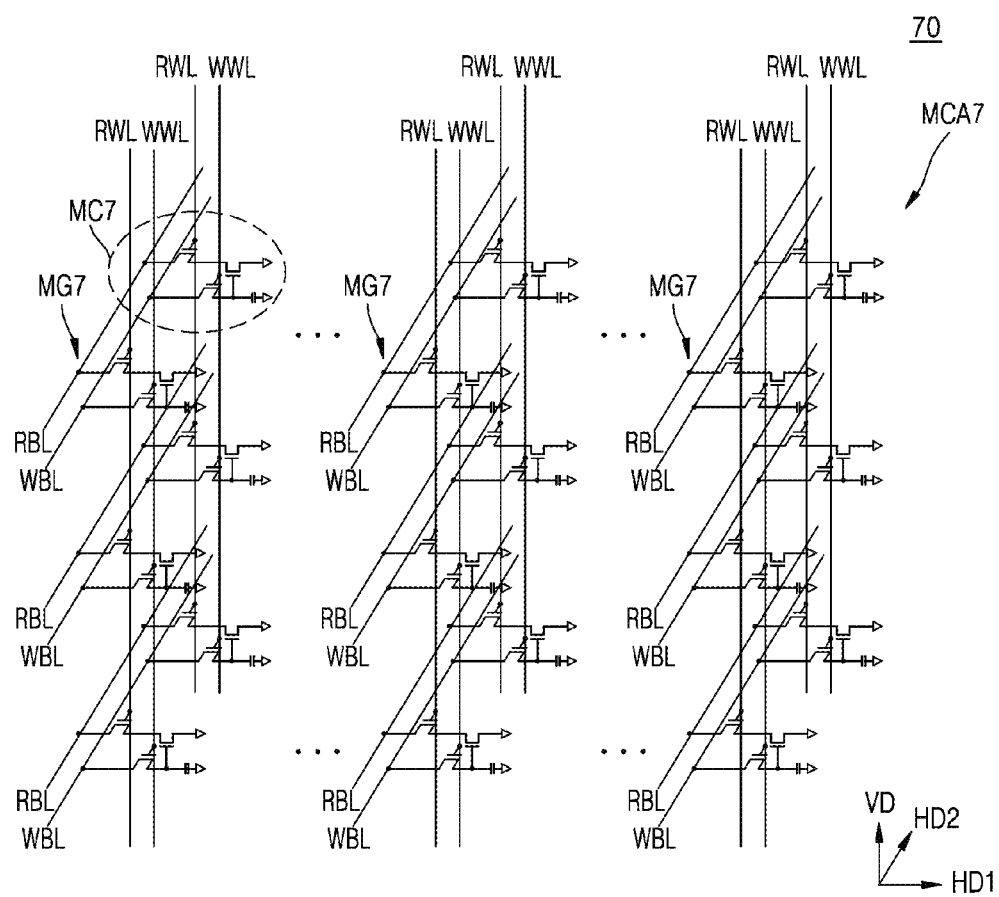
FIG. 24A is a circuit diagram illustrating a memory cell array of a semiconductor memory device, according to some example embodiments of inventive concepts.
Figure 24B:
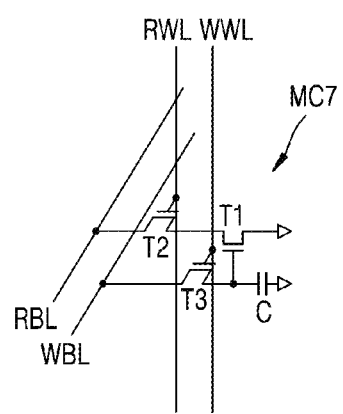
FIG. 24B is a circuit diagram of a memory cell illustrated in FIG. 24A.

FIG. 24A is a circuit diagram illustrating a circuit configuration of a memory cell array MCA7 of a semiconductor memory device 70, according to some to some example embodiments of inventive concepts, and FIG. 24B is a circuit diagram of a memory cell MC7 illustrated in FIG. 24A.

Referring to FIGS. 24A and 24B, the semiconductor memory device 70 may include the memory cell array MCA7 having a three-dimensional structure and including a plurality of memory cells MC7 that are repeatedly arranged in a first horizontal direction (HD1 direction), a second horizontal direction (HD2 direction), and a vertical direction (VD direction). The plurality of memory cells MC7 have substantially the same configuration as that described with respect to the plurality of memory cells MC6 with reference to FIGS. 12A and 12B. The memory cell array MCA7 may include the plurality of memory cell groups MG7 including the plurality of memory cells MC7 arranged in two dimensions in the second horizontal direction (HD2 direction) and the vertical direction (VD direction). The plurality of memory cell groups MG7 may be repeatedly arranged in the first horizontal direction (HD1 direction). The plurality of memory cells MC7 may include 3T1C memory cells including three transistors that are the first transistor T1, the second transistor T2, and the third transistor T3 and one capacitor C. However, the memory cell array MCA7 may include the plurality of read bit lines RBL and the plurality of write bit lines WBL extending in the second horizontal direction (Y direction). In each of the plurality of memory cells MC7, one source/drain region of a pair of source/drain regions included in the second transistor T2 may be connected to the read bit line RBL, and one source/drain region of a pair of source/drain regions included in the third transistor T3 may be connected to the write bit line WBL.

Figure 25:
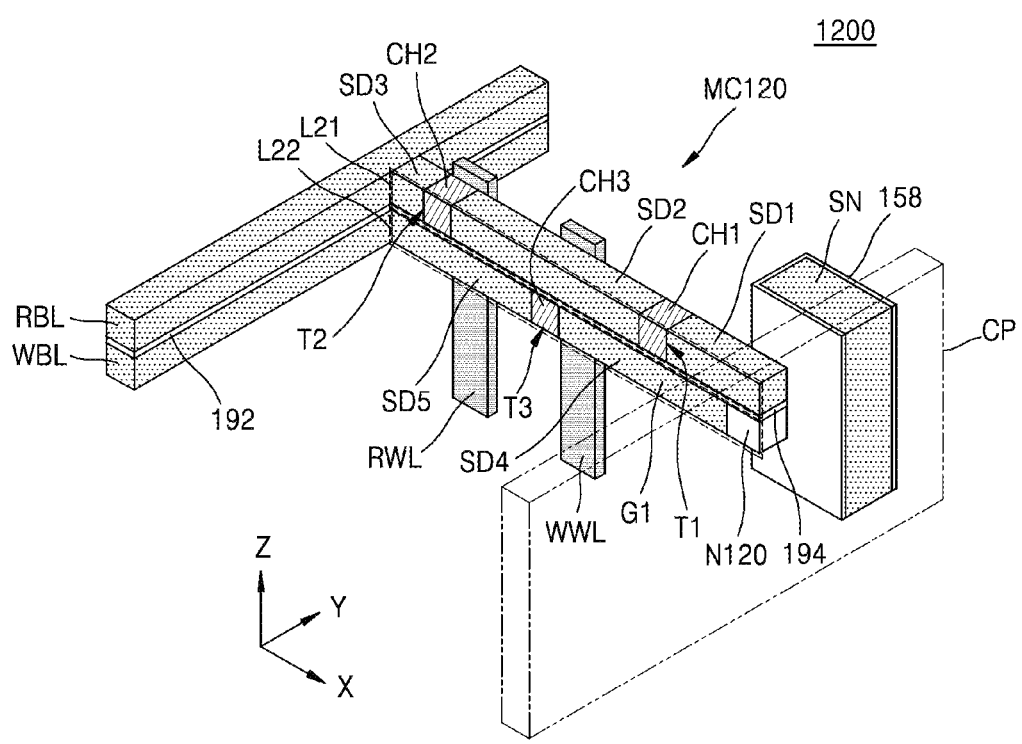
FIG. 25 is a perspective view for illustrating a semiconductor memory device according to some example embodiments of inventive concepts.

FIG. 25 is a perspective view of a semiconductor memory device 1200 according to some to some example embodiments of inventive concepts. A more detailed example of the semiconductor memory device 70 illustrated in FIGS. 24A and 24B is described with reference to FIG. 25.

Referring to FIG. 25, the semiconductor memory device 1200 may have substantially the same configuration as that of the semiconductor memory device 600 described with reference to FIG. 13. However, the semiconductor memory device 1200 may include a memory cell MC120. The memory cell MC120 may include the read bit line RBL and the write bit line WBL that are spaced apart from each other with an insulating layer 192 therebetween. The memory cell MC120 may include a first conductive line region L21 connected to the read bit line RBL and extending from the read bit line RBL in the first horizontal direction (X direction), and a second conductive line region L22 connected to the write bit line WBL and extending from the write bit line WBL in the first horizontal direction (X direction). One end of the first conductive line region L21 may be in contact/direct contact with the common plate CP, and the second conductive line region L22 may be spaced apart from the common plate CP with the insulating region N10 therebetween. More detailed configurations of the first conductive line region L21 and the second conductive line region L22 may be generally the same as those of the first conductive line region L1 and the second conductive line region L2 described with reference to FIGS. 2A and 2B. However, the first conductive line region L21 and the second conductive line region L22 may be spaced apart from each other with the insulating layer 194 therebetween in the vertical direction (Z direction). The insulating layer 192 and the insulating layer 194 may include a silicon oxide layer, a silicon nitride layer, a silicon oxynitride layer, or a combination thereof.

In the memory cell MC120, an axis in the channel length direction of each of the first channel region CH1 and the second channel region CH2 may be in the first straight line parallel with the first horizontal direction (X direction) in the first conductive line region L21. An axis in the channel length direction of the third channel region CH3 may be in the second straight line parallel with the first horizontal direction (X direction) in the second conductive line region L22. The first straight line and the second straight line may be apart from each other in the vertical direction (Z direction) and may extend in parallel with each other. The second channel region CH2 and the third channel region CH3 may be offset from each other so that they are not on one straight line in the second horizontal direction (Y direction).

Semiconductor memory devices according to inventive concepts described with reference to FIGS. 1A through 25 may amplify an amount of charge accumulated in a memory cell and supply the same to a bit line by including three transistors in one memory cell. Thus, the semiconductor memory devices may not be limited by capacitance of a capacitor or a coupling capacitance component between the bit lines. In addition, the semiconductor memory devices according to inventive concepts may include a memory cell that is capable of miniaturization and have structures that are advantageous for a high-density three-dimensional array. Therefore, the degree of integration of the semiconductor memory devices may be improved.

In a method of manufacturing a semiconductor memory device according to some example embodiments of inventive concepts, as in the semiconductor memory devices described with reference to FIGS. 1A through 25, a plurality of memory cells may be simultaneously formed that are arranged in a row on the substrate 110 in the vertical direction (Z direction), and include three transistors which include the first transistor T1, the second transistors (T2, and T22), and the third transistors (T3 and T23), respectively. Hereinafter, the method of manufacturing a semiconductor memory device according to some example embodiments of inventive concepts is described with detailed examples.

FIGS. 26A through 35B are diagrams for describing a method of manufacturing a semiconductor memory device according to some example embodiments of inventive concepts, and FIGS. 26A, 27A, 28A, 29A, 30A, 31A, 32A, 33A, 34A, and 35A are perspective views illustrating the method of manufacturing the semiconductor memory device in a process sequence, and FIGS. 26B, 27B, 28B, 29B, 30B, 31B, 32B, 33B, 34B, and 35B are plan views on the first level LV1 in FIGS. 26A, 27A, 28A, 29A, 30A, 31A, 32A, 33A, 34A, and 35A, respectively. An example method of fabricating/manufacturing the semiconductor memory device 400A illustrated in FIG. 9 is described with reference to FIGS. 26A through 35B.

Figure 26A:
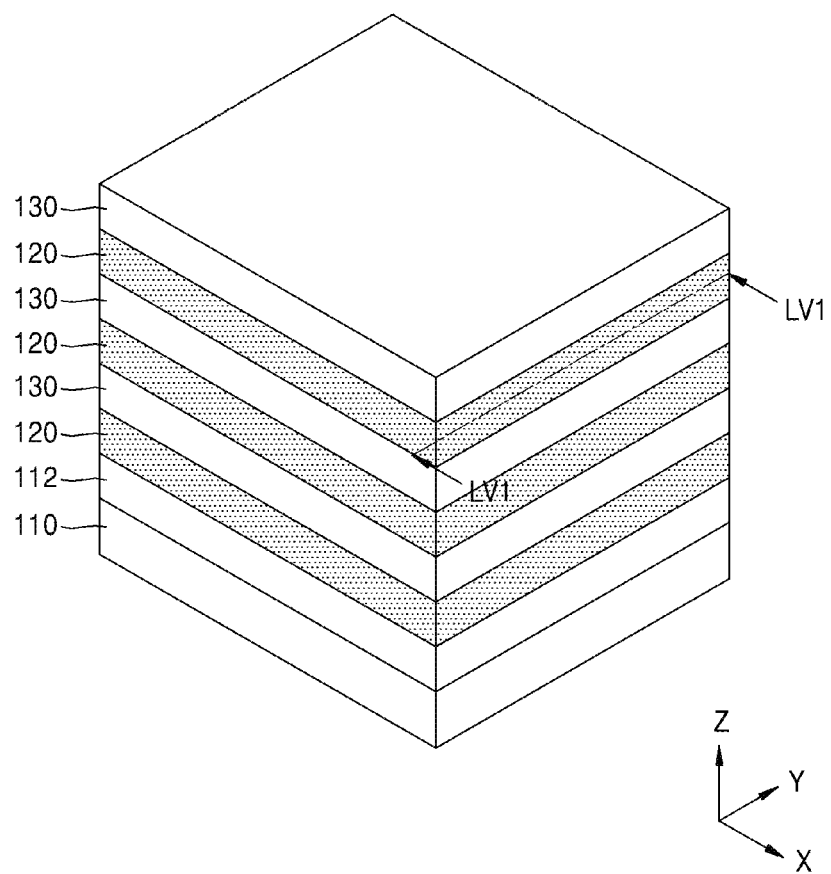
Figure 26B:
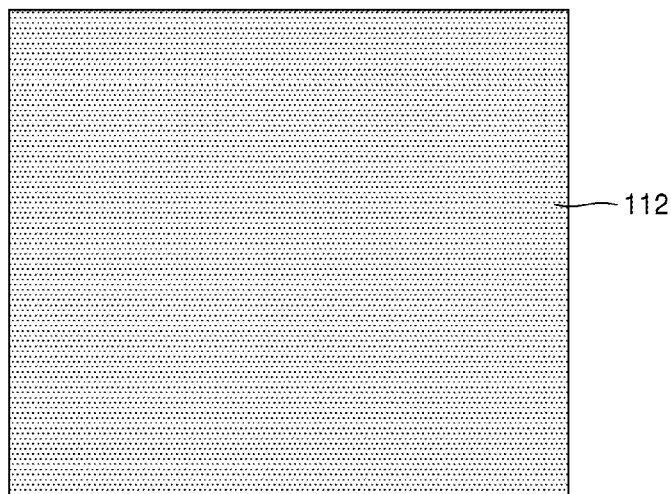

Referring to FIGS. 26A and 26B, the lower insulating layer 112 may be formed on the substrate 110, and the plurality of conductive layers 120 and the plurality of intermediate insulating layers 130 may be alternately stacked on the lower insulating layer 112. The plurality of conductive layers 120 may include a semiconductor material such as doped or undoped single crystal silicon or polysilicon, an oxide semiconductor, and/or a metal.

Figure 27A:
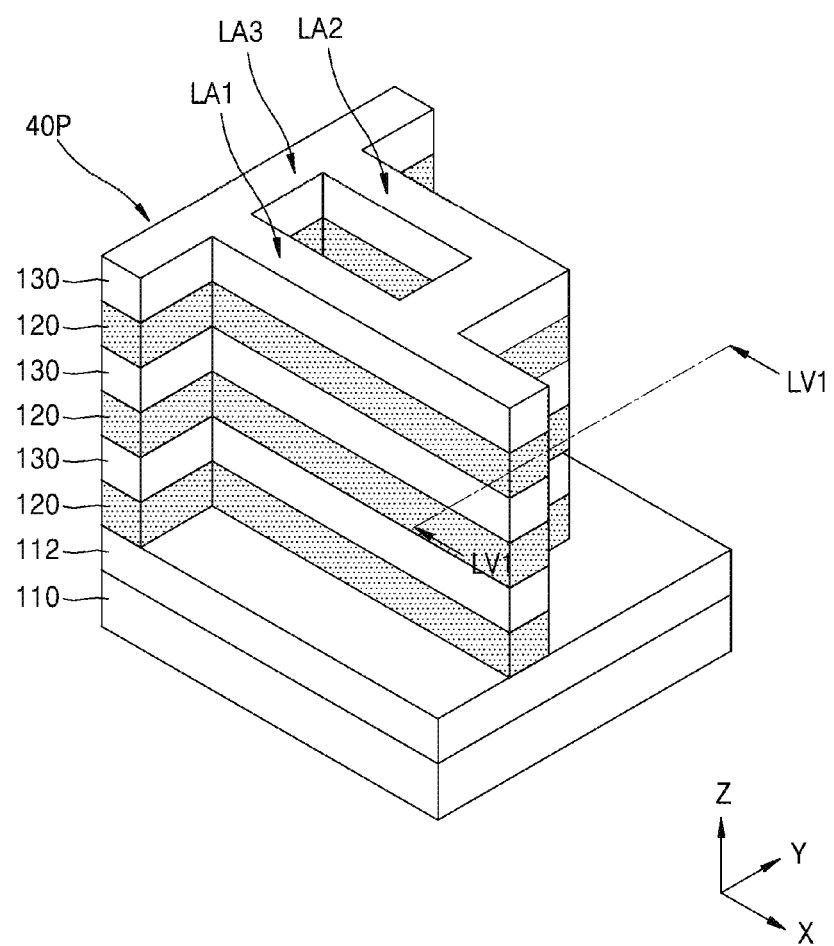
Figure 27B:
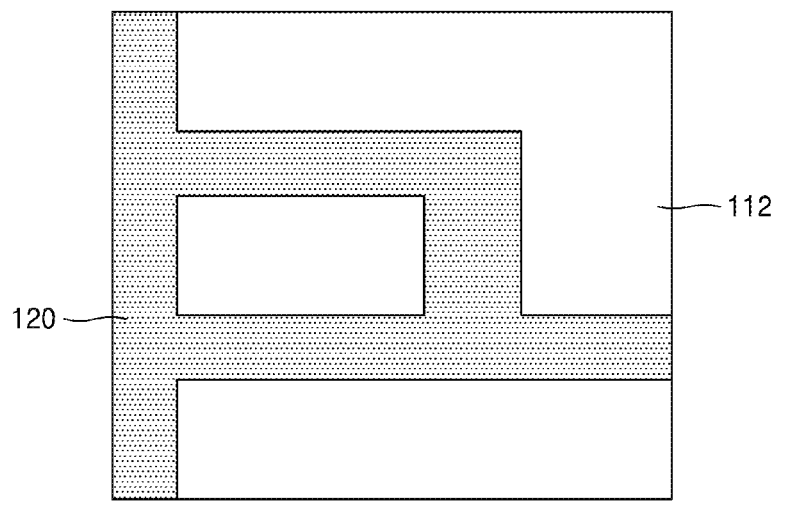

Referring to FIGS. 27A and 27B, by removing a portion of each of the plurality of conductive layers 120 and the plurality of intermediate insulating layers 130, e.g. by removing the portions with an isotropic and/or anisotropic etch, a cell pattern 40P may be formed. The cell pattern 40P may include a first line region LA1 and a second line region LA2 that extend in parallel with each other in the first horizontal direction (X direction), and a third line region LA3 extending in the second horizontal direction (Y direction) and connected to the first line region LA1 and the second line region LA2. In the first horizontal direction (X direction), a length of the first line region LA1 may be greater than a length of the second line region LA2.

The cell pattern 40P may include portions corresponding to the bit line BL, the first conductive line region L1, and the second conductive line region L2 illustrated in FIGS. 2A and 2B. A top surface of the lower insulating layer 112 may be exposed through the cell pattern 40P.

Figure 28A:
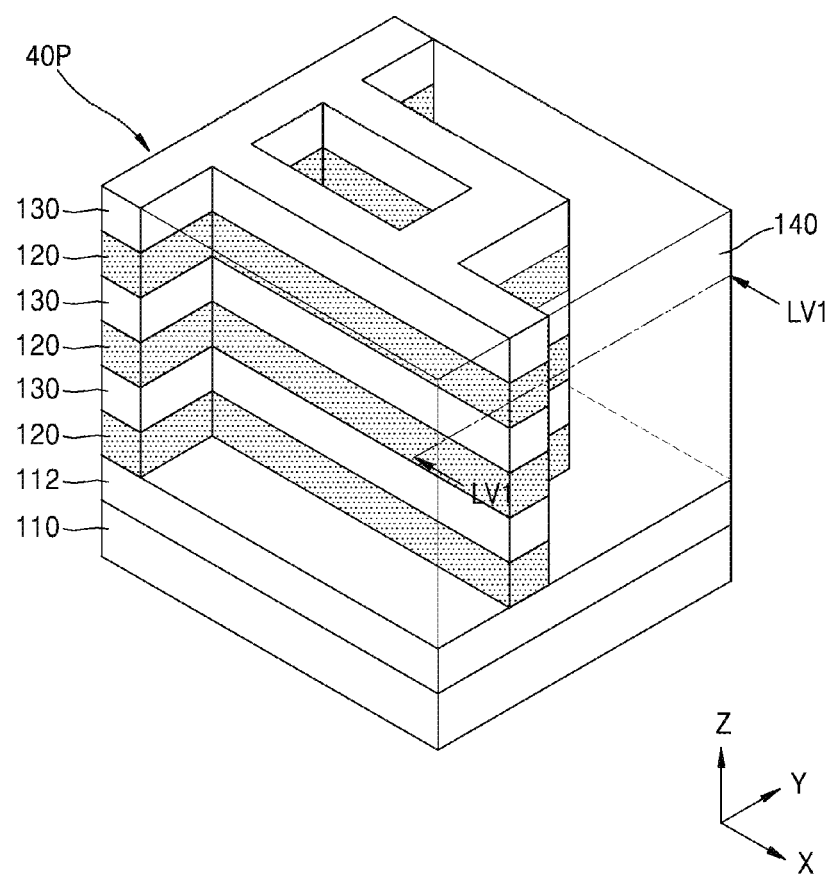
Figure 28B:
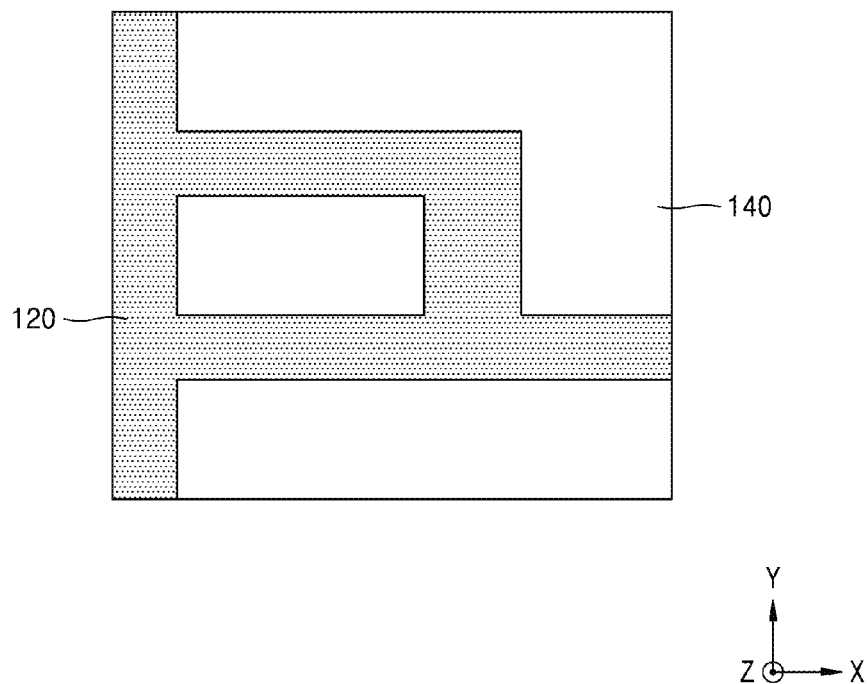

Referring to FIGS. 28A and 28B, in the resultant of FIGS. 27A and 27B, spaces exposing the lower insulating layer 112 through the cell pattern 40P may be filled with the buried insulating layer 140. The buried insulating layer 140 may include a silicon oxide layer, a silicon nitride layer, a silicon oxynitride layer, or a combination thereof. In FIG. 28A, for helping understanding, portions of the cell pattern 40P covered by the buried insulating layer 140 are also indicated by solid lines. In the drawings referred to in the following description, as illustrated in FIG. 28A for better understanding, some regions covered with the buried insulating layer 140 are shown as solid lines.

Figure 29A:
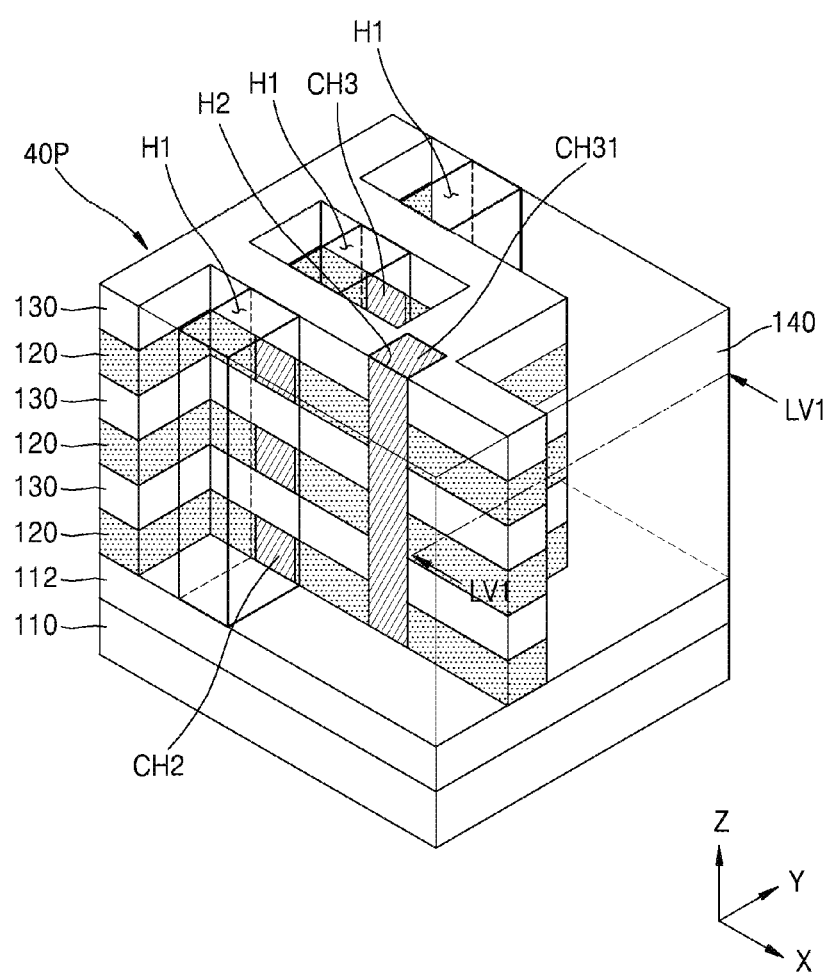
Figure 29B:
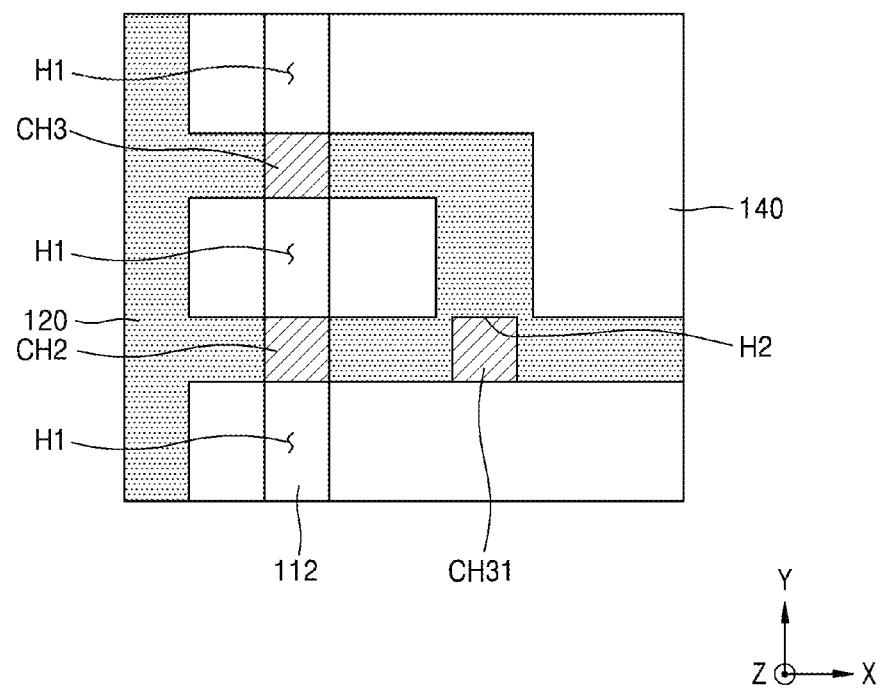

Referring to FIGS. 29A and 29B, partial regions of each of the plurality of conductive layers 120 included in the first line region LA1 and the second line region LA2 of the cell pattern 40P (see FIG. 27A) may be replaced by the first channel region CH31, the second channel region CH2, and the third channel region CH3.

More specifically, a plurality of first holes H1 penetrating some regions of the buried insulating layer 140 may be formed, a plurality of channel spaces may be formed by selectively removing a portion of each of the plurality of conductive layers 120 via the plurality of first holes H1, the plurality of second channel regions CH2 and the plurality of third channel regions CH3 that fill the plurality of channel spaces may be formed by depositing a channel forming material inside the plurality of channel spaces via the plurality of first holes H1, and unnecessary material remaining inside the plurality of first holes H1 may be removed. In addition, a second hole H2 penetrating some region of the cell pattern 40P may be formed, and the first channel region CH31 may be formed in the second hole H2.

The plurality of second channel regions CH2 may be obtained by replacing some regions included in the first line region LA1 (refer to FIG. 27A) among the plurality of conductive layers 120, and the plurality of second channel regions CH2 may be arranged in a row in the vertical direction (Z direction) in the first line area LA1. The plurality of third channel regions CH3 may be obtained by replacing some regions included in the second line region LA2 (refer to FIG. 27A) among the plurality of conductive layers 120, and the plurality of third channel regions CH3 may be arranged in a row in the vertical direction (Z direction) in the second line area LA2.

An atomic layer deposition (ALD) process may be used to form the first channel region CH31, the plurality of second channel regions CH2, and the plurality of third channel regions CH3. An order of forming each of the first channel region CH31, the plurality of second channel regions CH2, and the plurality of third channel regions CH3 may not be particularly limited, and may be arbitrarily determined as necessary. Furthermore, other deposition processes may be used to form the channel region.

Figure 30A:
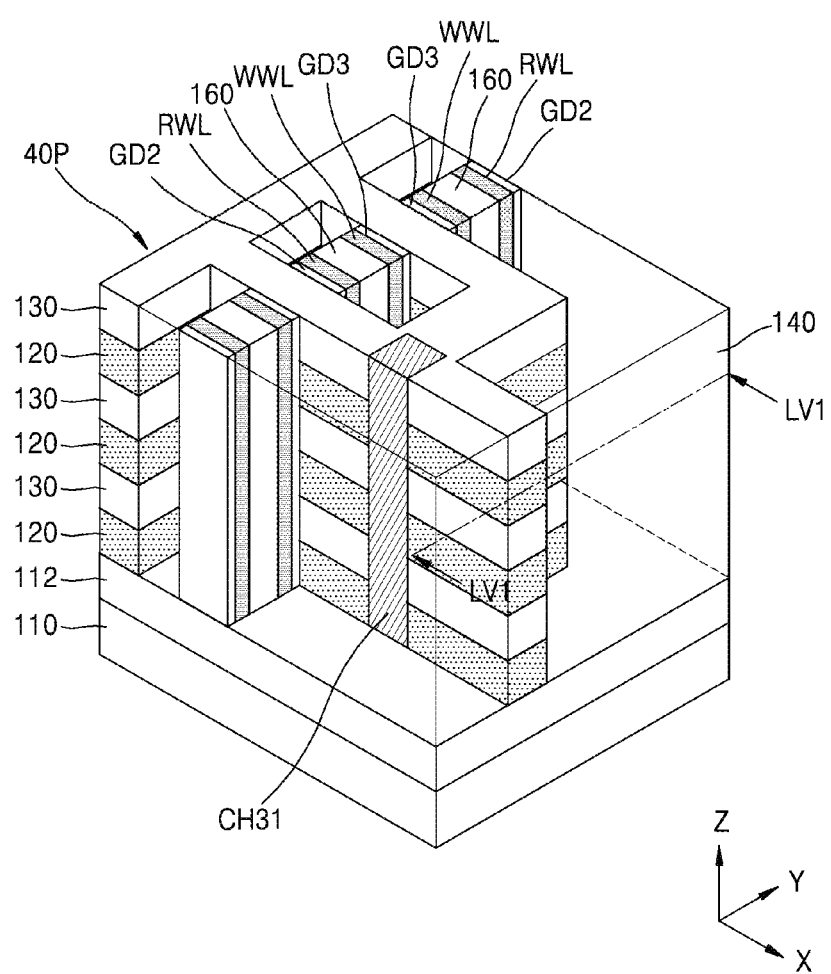
Figure 30B:
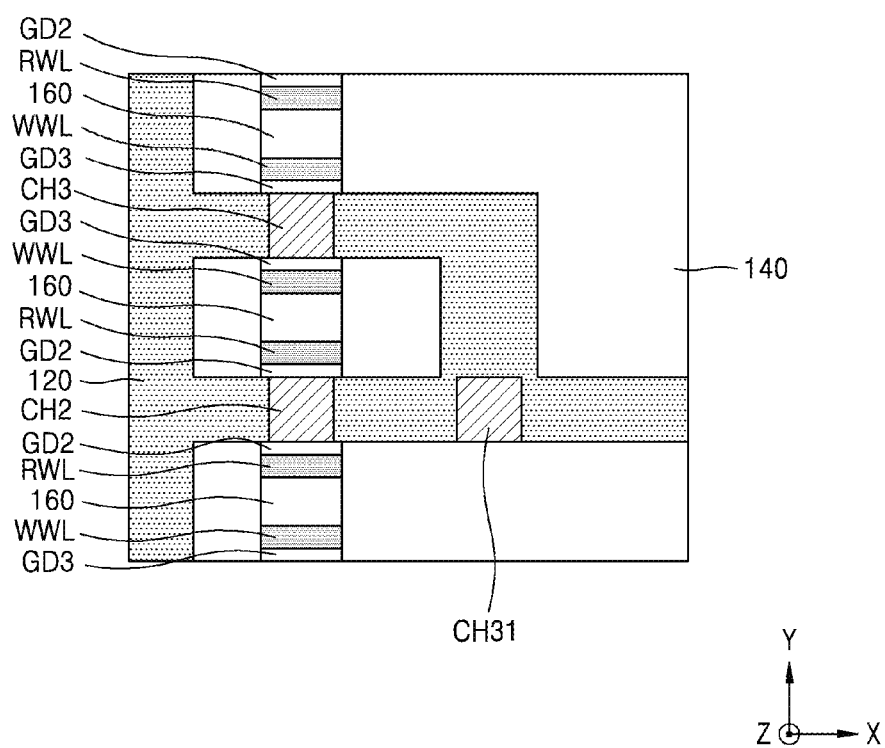

Referring to FIGS. 30A and 30B, in the resultant of FIGS. 29A and 29B, the second gate insulating layer GD2, the third gate insulating layer GD3, the read word line RWL, the write word line WWL, and the insulating fence 160 may be sequentially formed in each of the plurality of first holes H1. The read word line RWL may extend in the vertical direction (Z direction) along some region of the sidewall of the cell pattern 40P and face the plurality of second channel regions CH2. The write word line WWL may extend long in the vertical direction (Z direction) along some other region of the sidewall of the cell pattern 40P and face the plurality of third channel regions CH3.

In some example embodiments, the second gate insulating layer GD2 and the third gate insulating layer GD3 may be simultaneously formed, and the read word line RWL and the write word line WWL may be simultaneously formed. Various processes may be used to form the second gate insulating layer GD2 and the third gate insulating layer GD3, the read word line RWL, the write word line WWL, and the insulating fence 160. A shape of each of the second gate insulating layer GD2, the third gate insulating layer GD3, the read word line RWL and the write word line WWL, and the insulating fence 160 may not be limited as illustrated in FIGS. 30A and 30B, and may be various according to a sequence of the processes used.

Figure 31A:
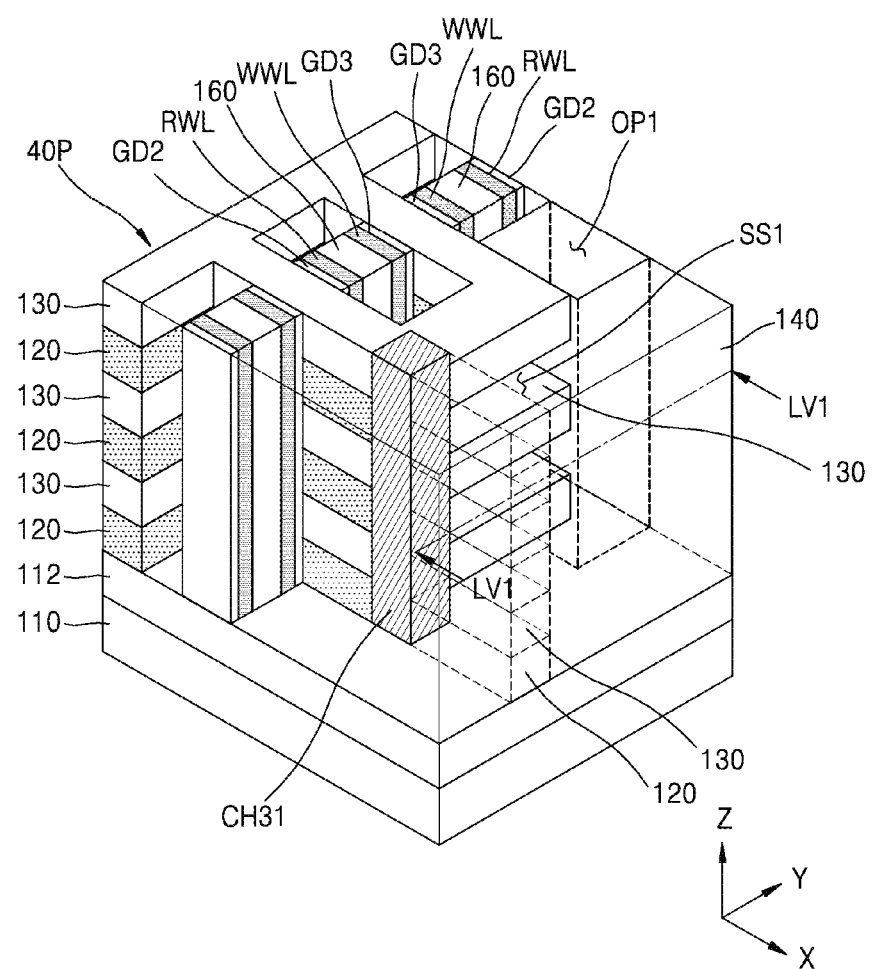
Figure 31B:
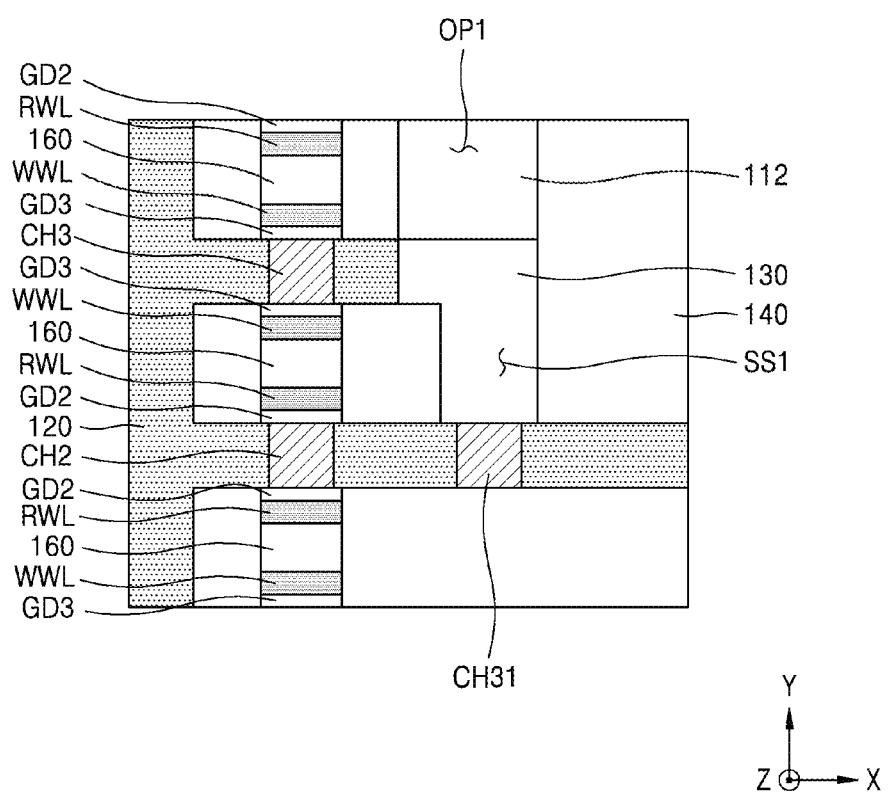

Referring to FIGS. 31A and 31B, in the resultant of FIGS. 30A and 30B, a first opening OP1 penetrating some region of the buried insulating layer 140 and exposing the sidewalls of the cell pattern 40P may be formed, and a plurality of first spaces SS1 may be formed by removing a portion of each of the plurality of conductive layers 120 exposed via the opening OP1. The plurality of first spaces SS1 may overlap each other in the vertical direction (Z direction). The intermediate insulating layer 130 may be between each of the plurality of first spaces SS1. The top surface of the lower insulating layer 112 may be exposed via the first opening OP1. In FIG. 31A, some region of the cell pattern 40P is illustrated as dashed lines for better understanding. In the drawings referred to in the following description, for better understanding, as illustrated in FIG. 31A, some region of the cell pattern 40P may be illustrated as dashed lines.

Figure 32A:
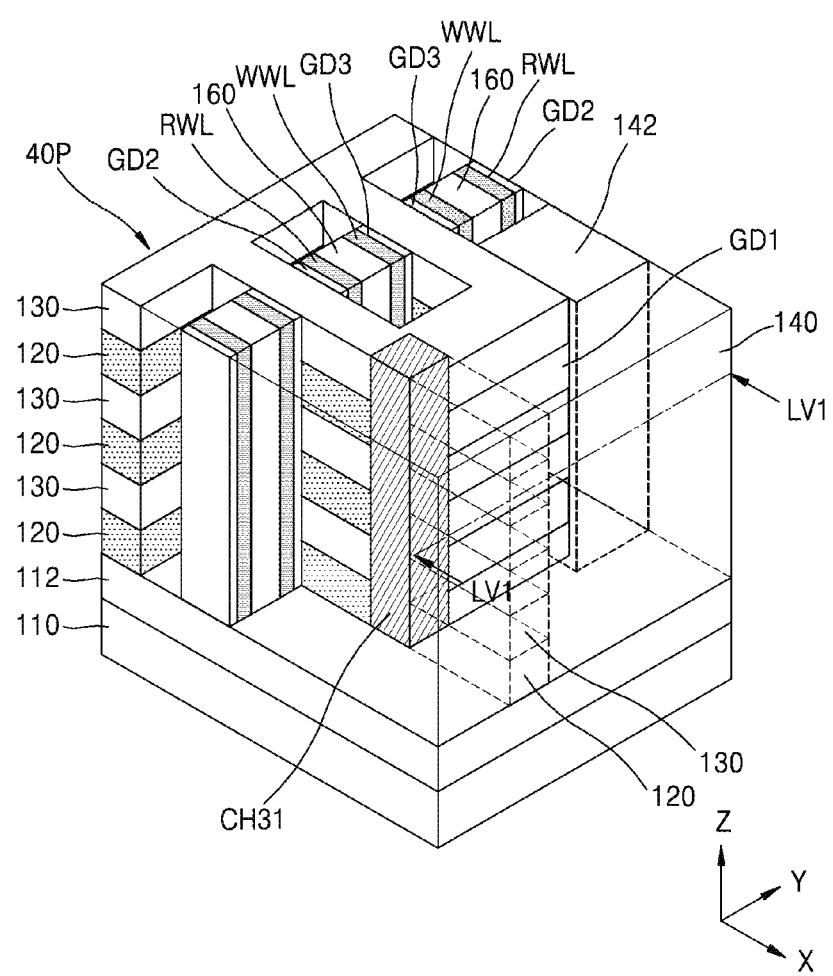
Figure 32B:
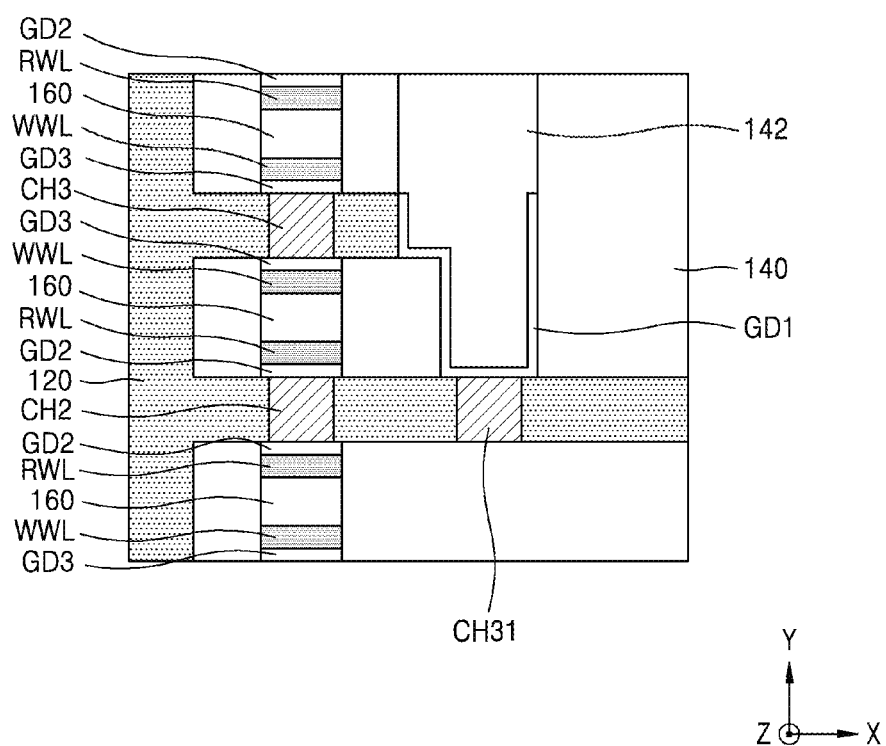

Referring to FIGS. 32A and 32B, after forming the plurality of first gate insulating layers GD1 covering surfaces exposed via the plurality of first spaces SS1 from the resultant of FIGS. 31A and 31B, unnecessary portions of the plurality of gate insulating layers GD1 outside the plurality of first spaces SS1 may be removed, and the plurality of first spaces SS1 and the first opening OP1 may be filled with the sacrificial layer 142. The sacrificial layer 142 may include a material having an etch selectivity with respect to the first gate insulating layer GD1.

Figure 33A:
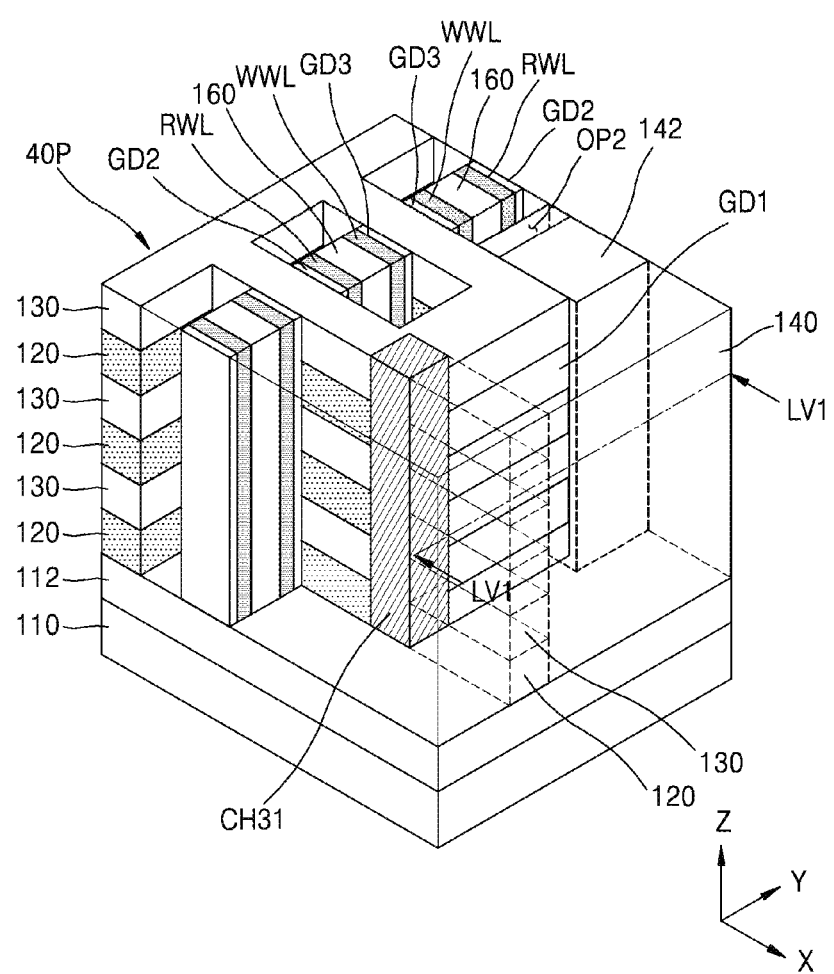
Figure 33B:
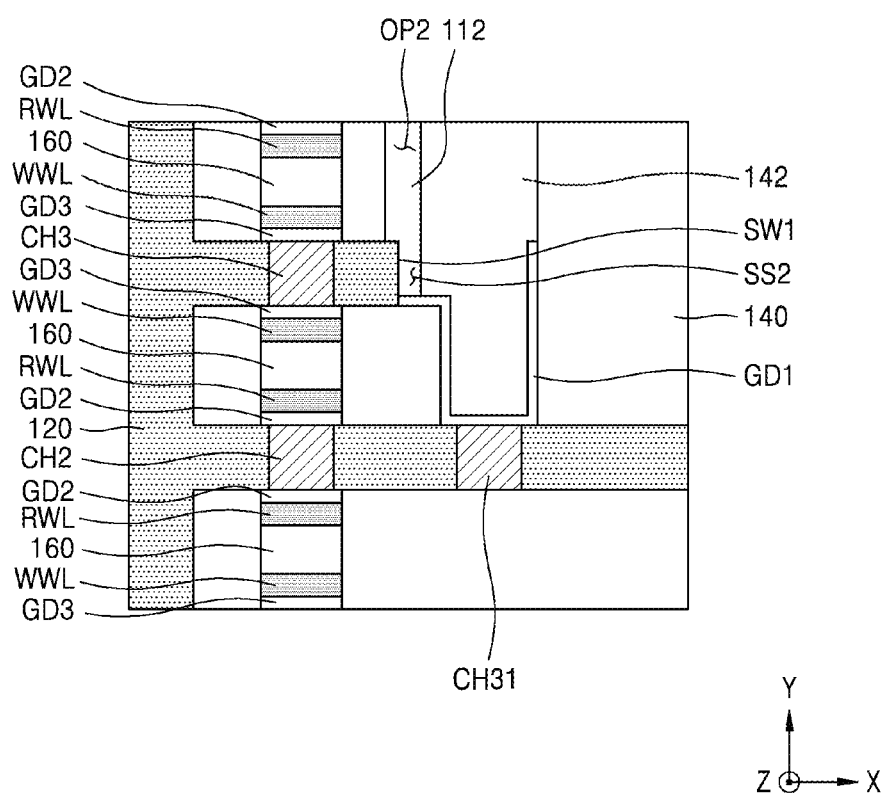

Referring to FIGS. 33A and 33B, by removing a portion of the buried insulating layer 140 and a portion of the sacrificial layer 142 from the resultant of FIGS. 32A and 32B, a second opening OP2 exposing the sidewall of each of the plurality of first gate insulating layers GD1 and the lower insulating layer 112 may be formed. By removing a portion of the plurality of first gate insulating layers GD1 exposed via the second opening OP2, a sidewall SW1 of each of the plurality of conductive layers 120 included in the cell pattern 40P may be exposed. The sacrificial layer 142 may also be partially removed while portions of the plurality of first gate insulating layers GD1 are removed to expose the sidewall SW1 of each of the plurality of conductive layers 120, and a plurality of second spaces SS2 communicated with the second opening OP2 may be formed between the plurality of intermediate insulating layers 130 included in the cell pattern 40P.

Figure 34A:
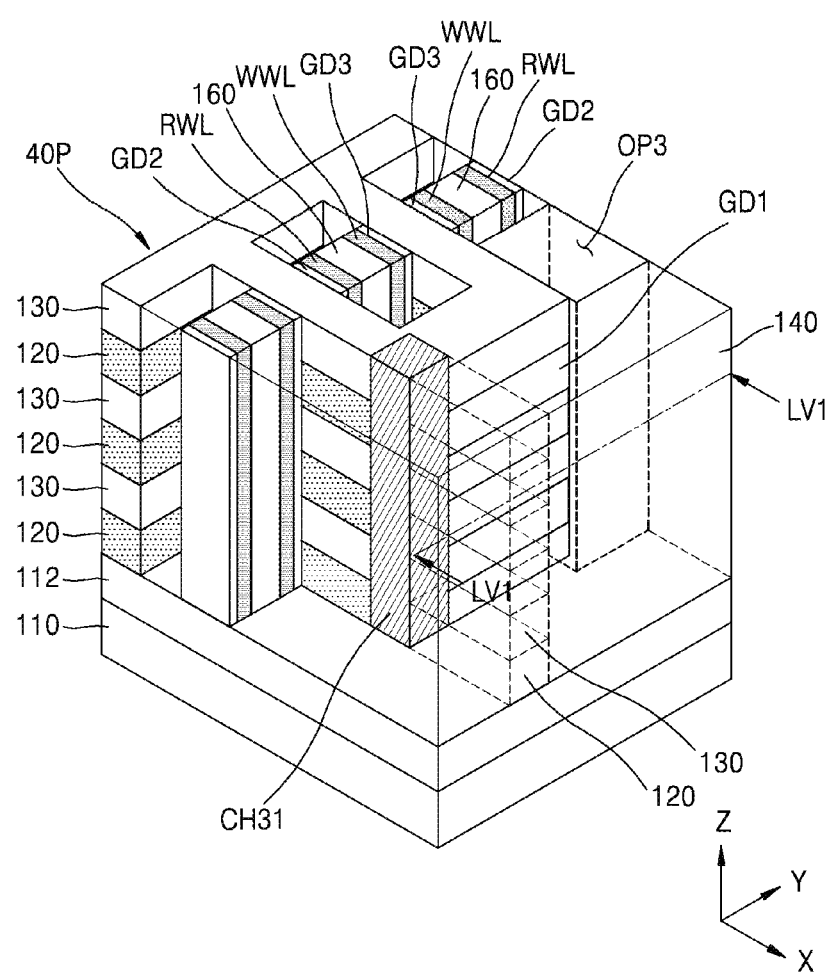
Figure 34B:
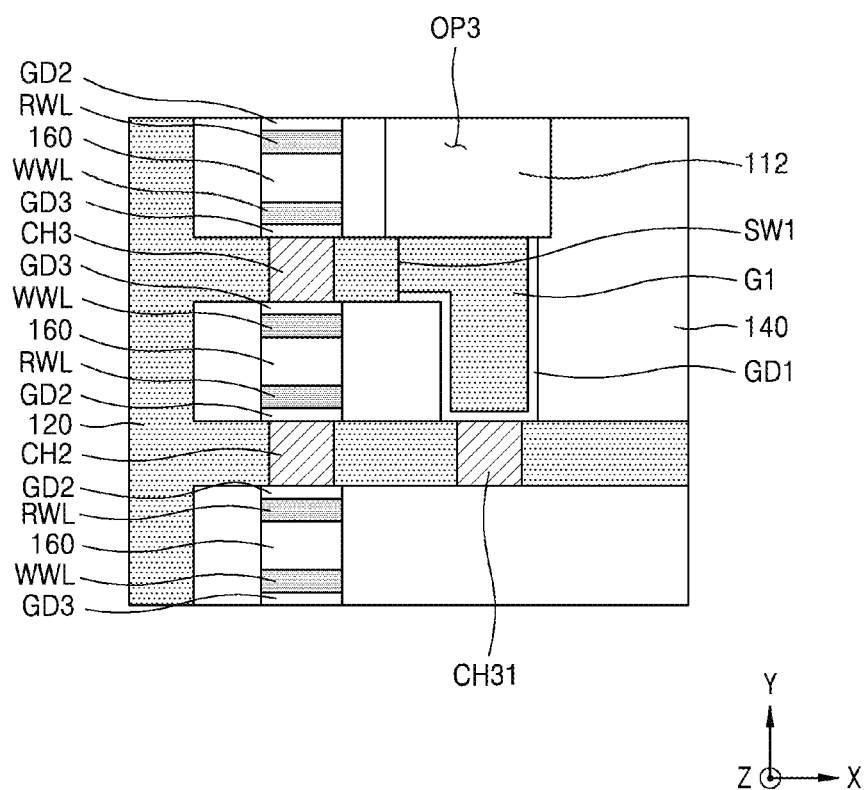

Referring to FIGS. 34A and 34B, after the sacrificial layer 142 is selectively removed from the resultant of FIGS. 33A and 33B, and then spaces are provided between each of the plurality of intermediate insulating layers 130 of the cell pattern 40P, the plurality of storage gates G1 filling the spaces may be formed. As a result, a portion of each of the plurality of conductive layers 120 may be replaced with the plurality of storage gates G1. Each of the plurality of storage gates G1 may include a portion that contacts the sidewall SW1 of the conductive layer 120.

Thereafter, unnecessary materials remaining inside the second opening OP2 may be removed by an etch back process, a chemical mechanical planarization process, and/or the like. After the plurality of storage gates G1 is formed, the second opening OP2 may be expanded by an etch back process or a cleaning process that is followed to form a third opening OP3. The top surface of the lower insulating layer 112 may be exposed via the third opening OP3. In to some example embodiments, the second opening OP2 may remain unexpanded.

Figure 35A:
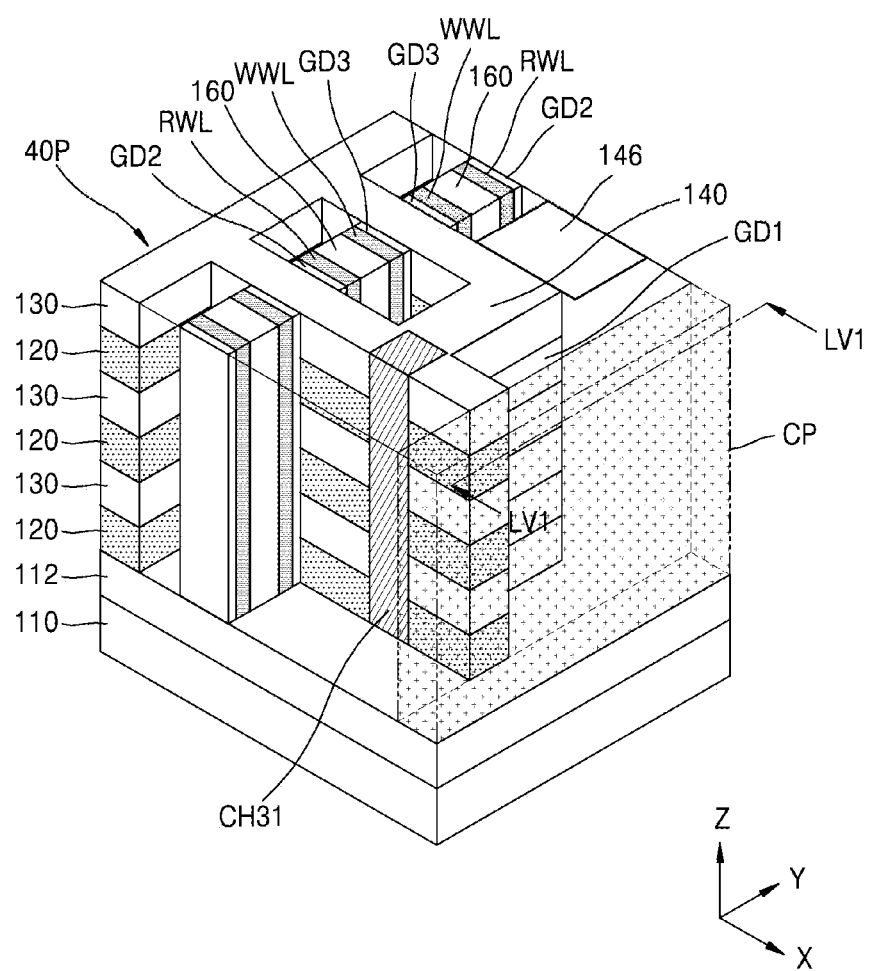
Figure 35B:
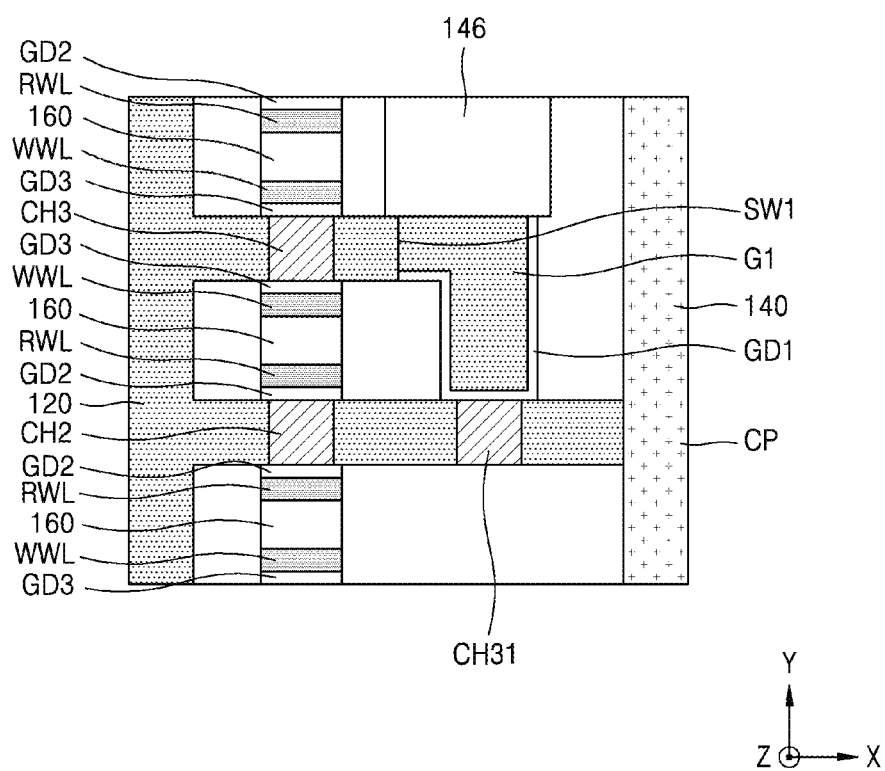

Referring to FIGS. 35A and 35B, after filling the third opening OP3 with the buried insulating layer 146 from the resultant of FIGS. 34A and 34B, an empty space may be prepared by removing a portion of the buried insulating layer 140 and a portion of the cell pattern 40P, and a common plate CP filling the empty space may be formed. The buried insulating layer 146 may include the same material as the buried insulating layer 140.

The plurality of bit lines BL and the plurality of source/drain regions (SD1, SD2, SD3, SD4, and SD5) may be formed from the plurality of conductive layers 120 that remains in the resultant of FIGS. 35A and 35B. The plurality of bit lines BL and the plurality of source/drain regions (SD1, SD2, SD3, SD4, and SD5) may include the bit lines BL and the plurality of source/drain regions (SD1, SD2, SD3, SD4, and SD5) that are illustrated in FIG. 8. The buried insulating layer (140 and 146) may constitute the buried insulating layer ILD illustrated in FIG. 9.

FIGS. 36A through 40B are diagrams for describing a method of manufacturing a semiconductor memory device according to some example embodiments of inventive concepts, and FIGS. 36A, 37A, 38A, 39A, and 40A are perspective views illustrating the method of manufacturing the semiconductor memory device in a process sequence, and FIGS. 36B, 37B, 38B, 39B, and 40B are plan views on the first level LV1 in FIGS. 36A, 37A, 38A, 39A, and 40A, respectively. An example method of manufacturing the semiconductor memory device 800A illustrated in FIG. 18 is described with reference to FIGS. 36A through 40B.

Figure 36A:
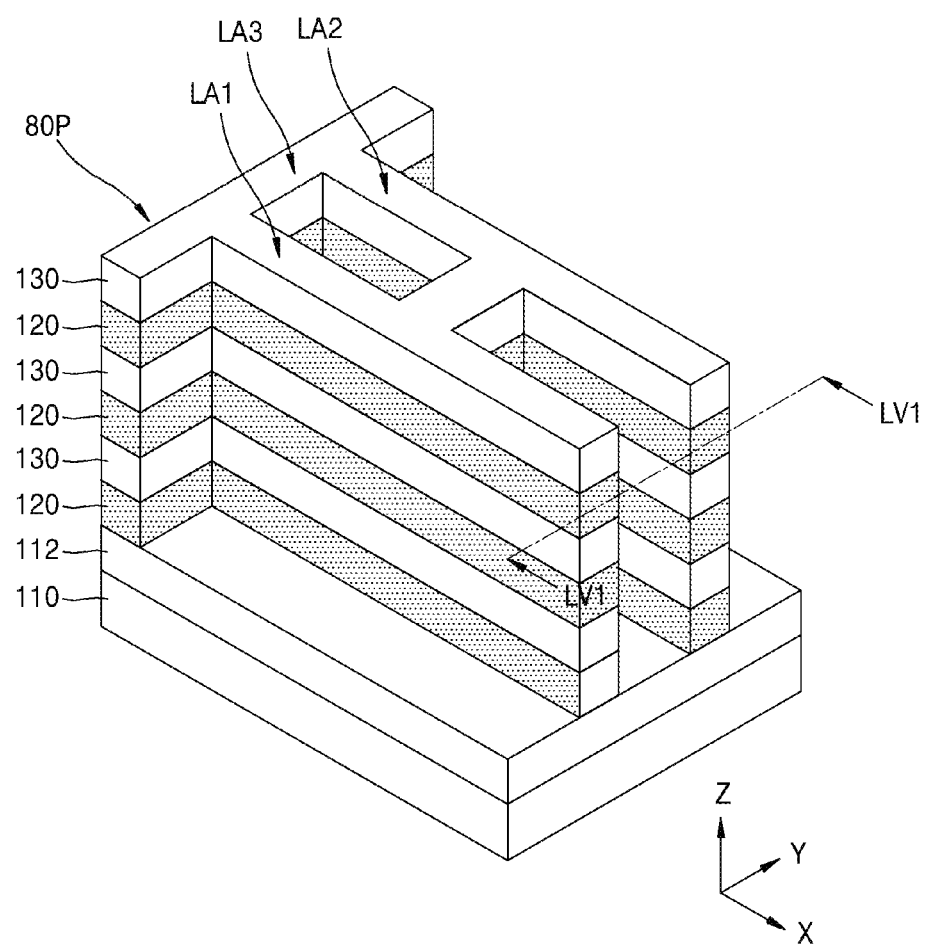
Figure 36B:
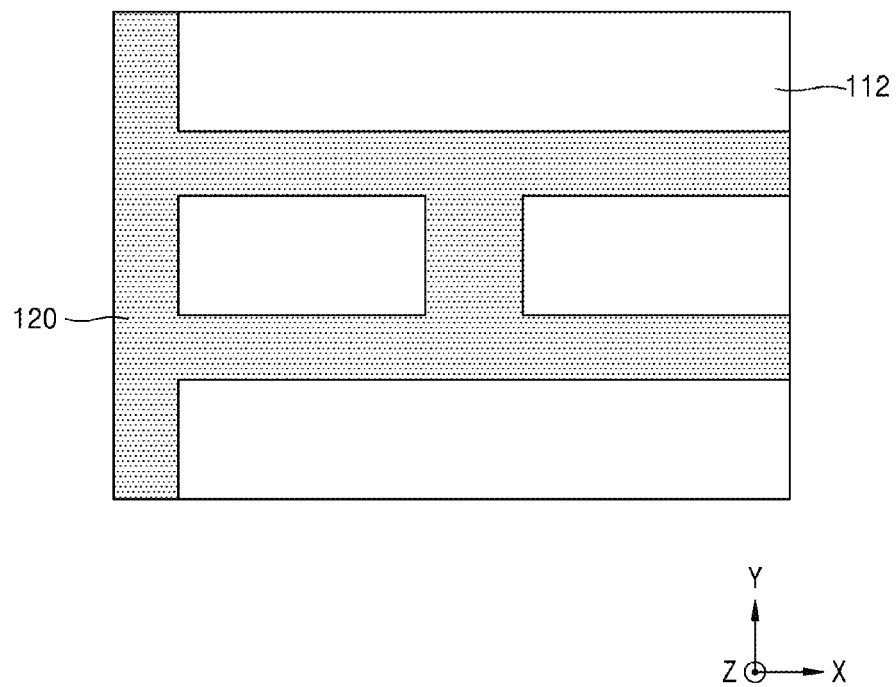

Referring to FIGS. 36A and 36B, similar processes as described with reference to FIGS. 26A through 27B may be performed. However, in this example, a cell pattern 80P including the plurality of conductive layers 120 and the plurality of intermediate insulating layers 130 may be formed. The cell pattern 80P may include the first line region LA1 and the second line region LA2 that extend in parallel with each other in the first horizontal direction (X direction), and may include the third line region LA3 that is connected to the first line region LA1 and the second line region LA2 and extends in the second horizontal direction (Y direction). In the first horizontal direction (X direction), the length of the first line region LA1 and the length of the second line region LA2 may be substantially the same or similar to each other. The cell pattern 80P may include a portion having an H-shaped planar shape.

Figure 37A:
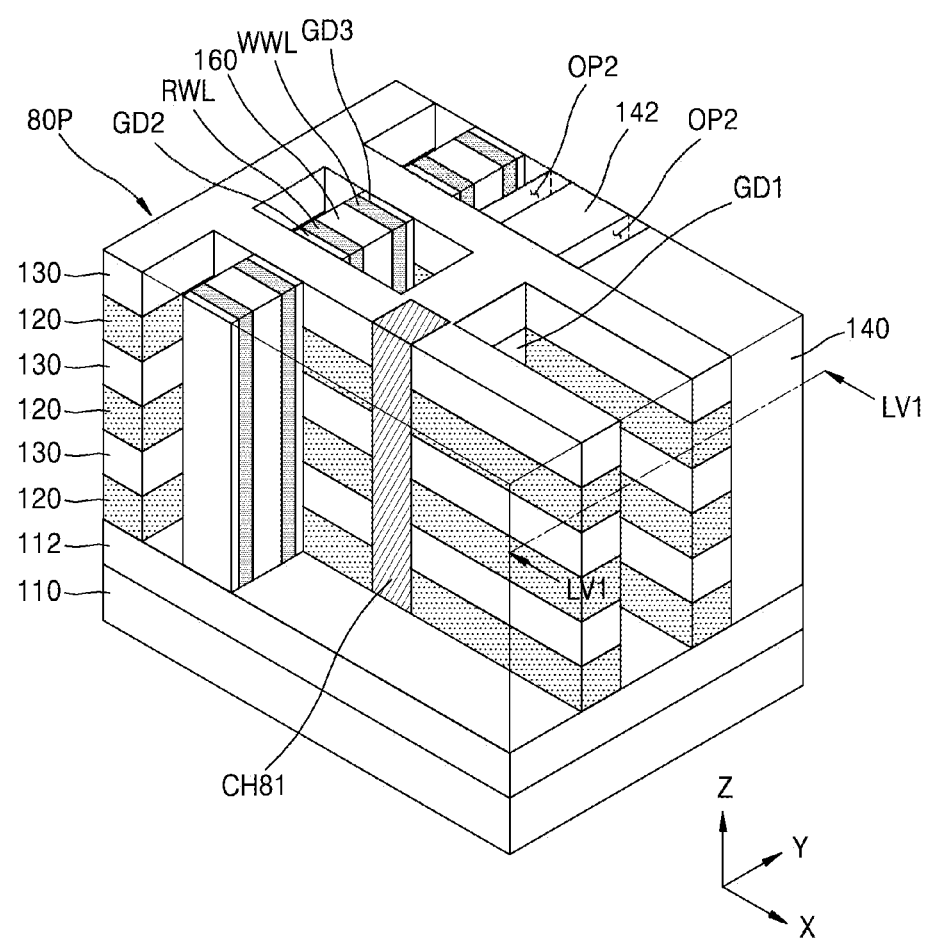
Figure 37B:
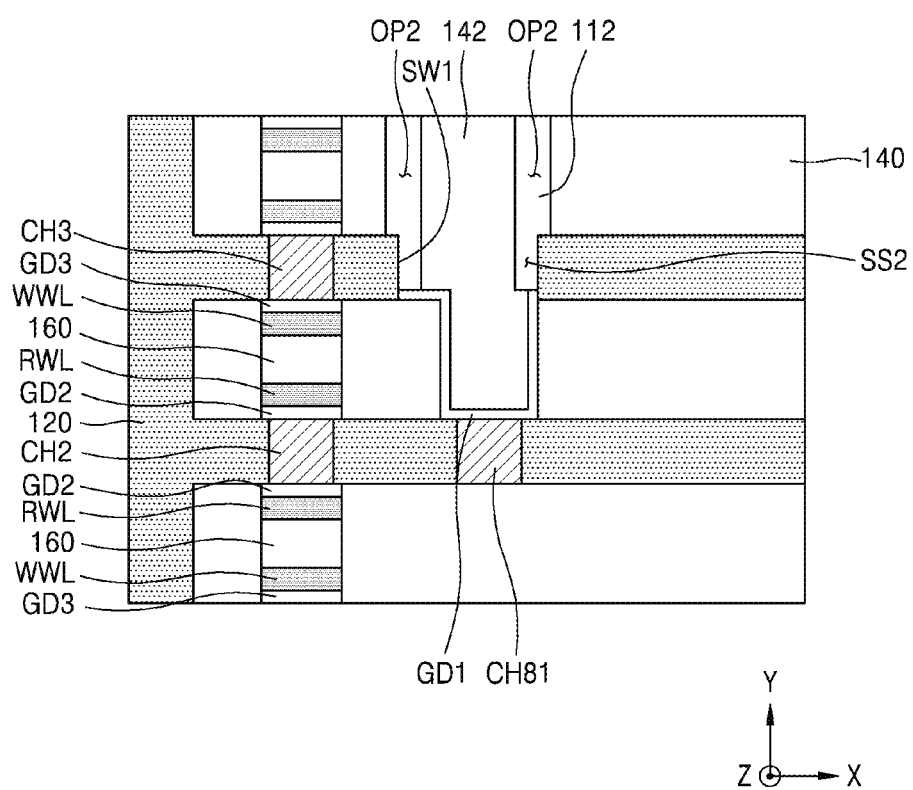

Referring to FIGS. 37A and 37B, by performing the processes described with reference to FIGS. 28A through 32B on the resultant of FIGS. 36A and 36B, a result including the plurality of first gate insulating layers GD1 and the sacrificial layer 142 may be formed. Thereafter, in a method similar to as described with reference to FIGS. 33A and 33B, by removing a portion of the buried insulating layer 140 and a portion of the sacrificial layer 142, a plurality of second openings OP2 exposing the sidewall of each of the plurality of first gate insulating layers GD1 and the lower insulating layer 112 may be formed. By removing a portion of the plurality of first gate insulating layers GD1 exposed via the second opening OP2, a plurality of second spaces SS2 exposing the sidewall SW1 of each of the plurality of conductive layers 120 included in the cell pattern 40P among the plurality of first gate insulating layers GD1 may be formed.

Figure 38A:
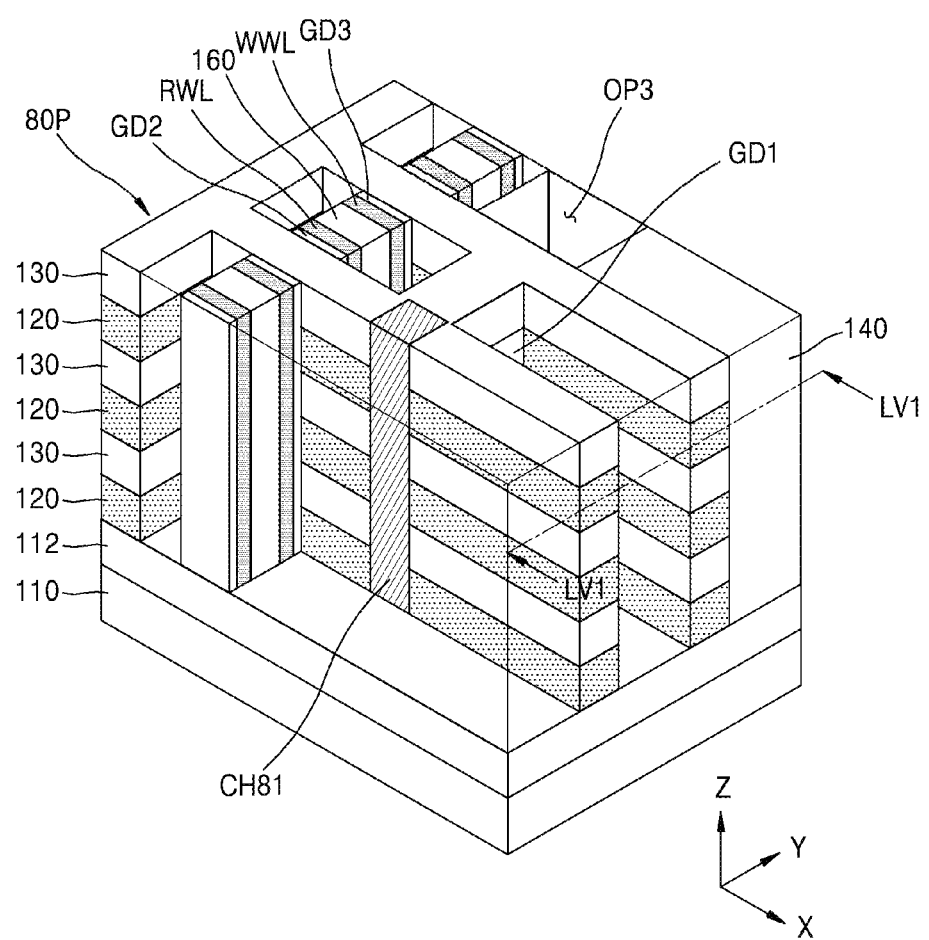
Figure 38B:
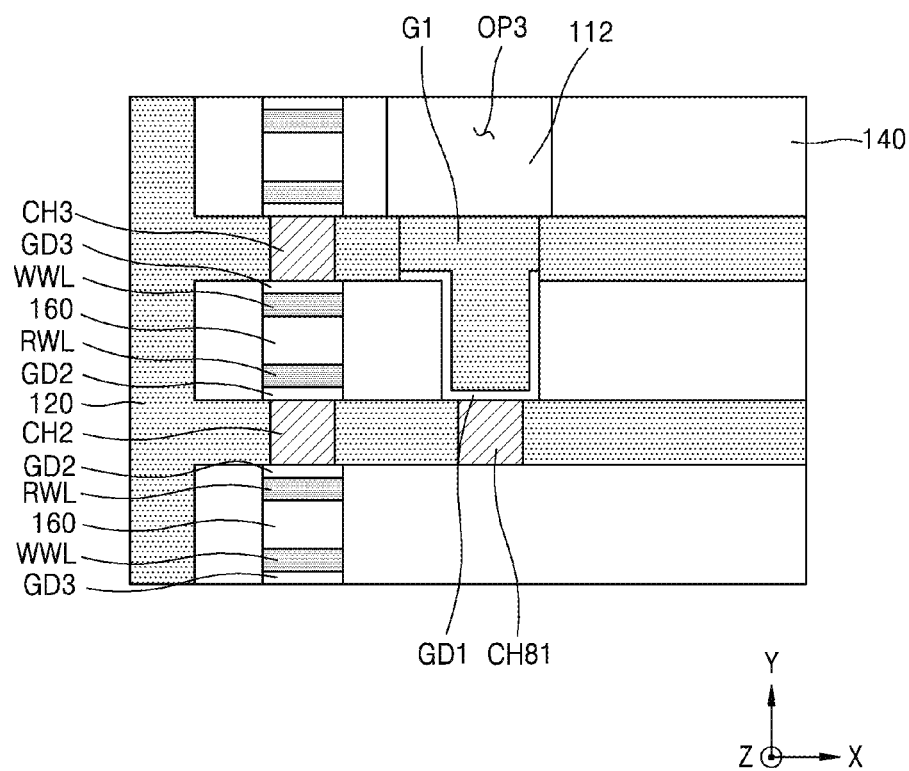

Referring to FIGS. 38A and 38B, in a similar method as described with reference to FIGS. 34A and 34B, after selectively removing the sacrificial layer 142 from the resultant of FIGS. 37A and 37B to form spaces between each of the plurality of intermediate insulating layers 130 of the cell pattern 80P, the plurality of storage gates G1 filling the spaces may be formed. While the plurality of storage gates G1 are formed, the second opening OP2 may be expanded to form the third opening OP3. The top surface of the lower insulating layer 112 may be exposed via the third opening OP3.

Figure 39A:
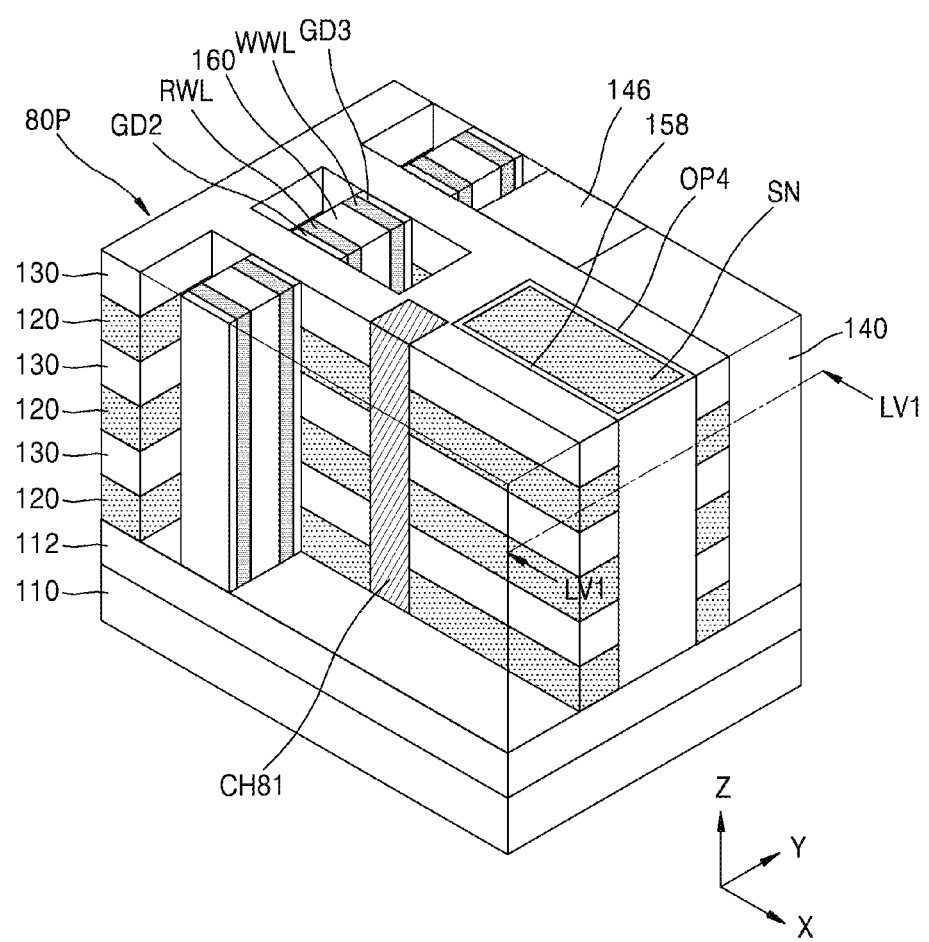
Figure 39B:
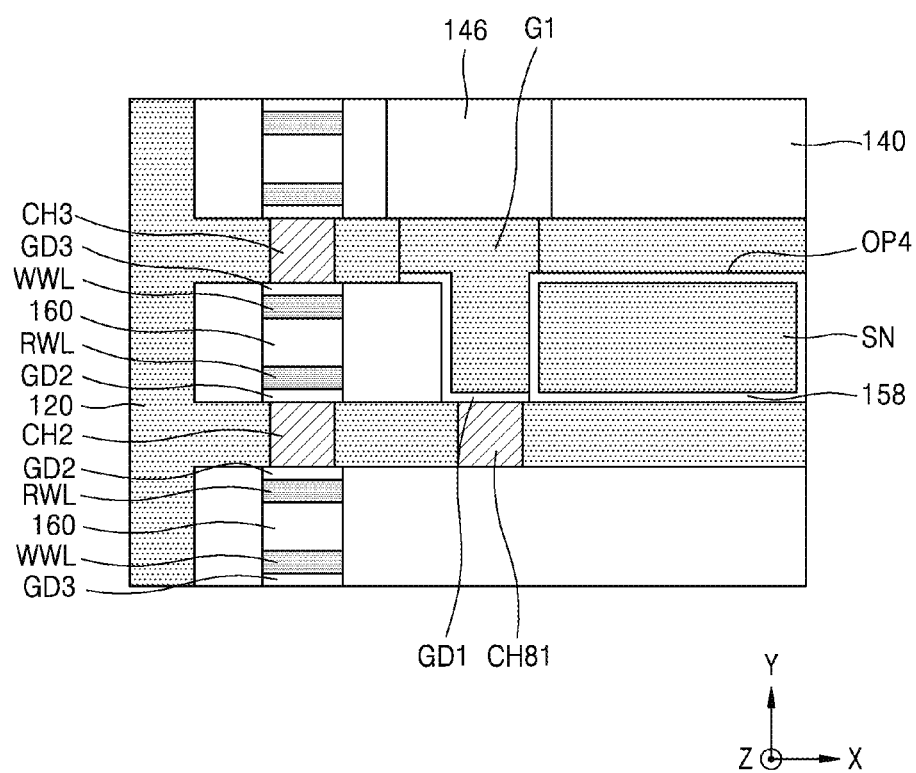

Referring to FIGS. 39A and 39B, after filling the third opening OP3 with the buried insulating layer 146 from the resultant of FIGS. 38A and 38B, a portion of the buried insulating layer 140 and a portion of the cell pattern 80P may be removed to form a fourth opening OP4 exposing the lower insulating layer 112 on the bottom of the fourth opening OP4, and the capacitor dielectric layer 158 and the storage node SN may be formed in a fourth opening OP4. The capacitor dielectric layer 158 and the storage node SN may extend in the vertical direction (Z direction) along the sidewall of the cell pattern 80P.

Figure 40A:
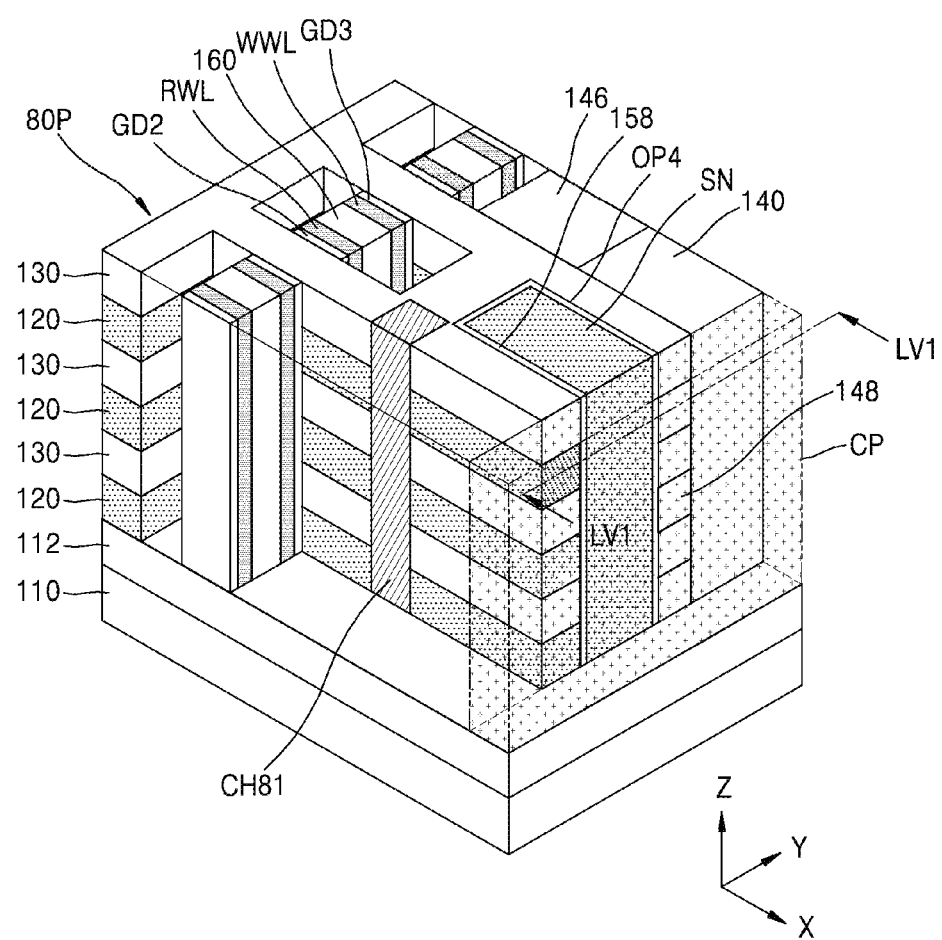
Figure 40B:
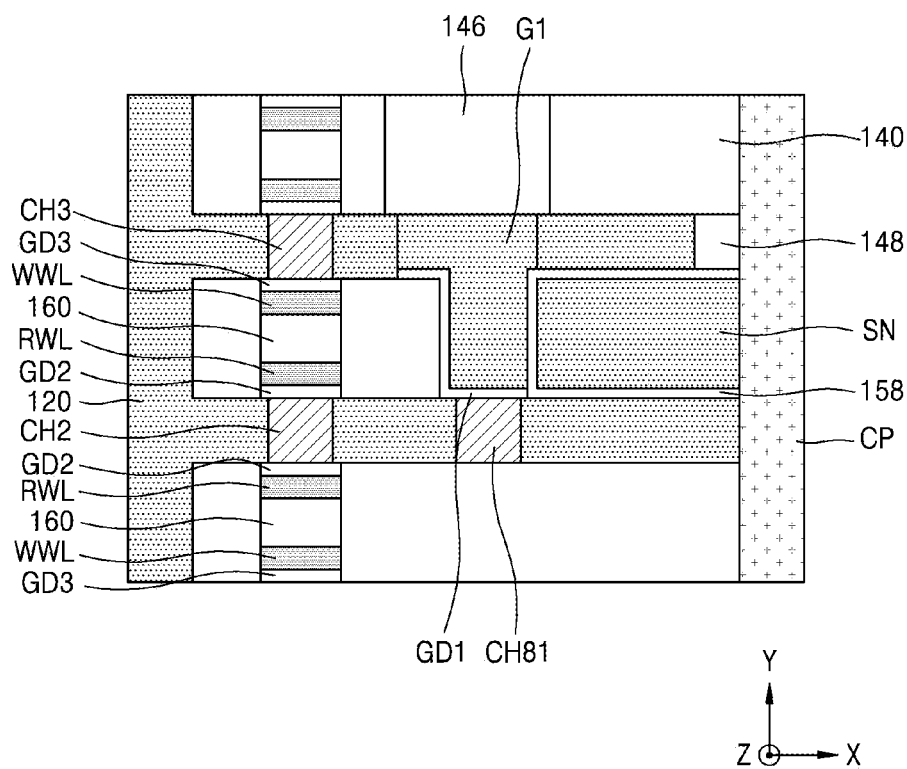

Referring to FIGS. 40A and 40B, an empty space may be provided by removing portions of each of the buried insulating layers 140 and 148, the cell pattern 80P, the capacitor dielectric layer 158, and the storage node SN from the resultant of FIGS. 39A and 39B, a plurality of indented spaces may be formed between each of the plurality of intermediate insulating layers 130 by removing portions of the plurality of conductive layers 120 connected to the plurality of storage gates G1 among the plurality of conductive layers 120 exposed via the empty space, and the plurality of buried insulating layers 148 filling the plurality of indented spaces may be formed. Thereafter, the common plate CP filling the empty space may be formed. The buried insulating layer 148 may include the same material as the buried insulating layer 140. From the resultant of FIGS. 40A and 40B, the buried insulating layers 140, 146, and 148 may form the buried insulating layer ILD illustrated in FIG. 18.

In the above, example methods of manufacturing the semiconductor memory devices 400A and 800A illustrated in FIGS. 9 and 18 have been described with reference to FIGS. 26A through 40B, but it will be appreciated by those of ordinary skill in the art that the semiconductor memory devices illustrated in FIGS. 26A to 40B, or various modified and modified semiconductor memory devices may be manufactured therefrom by applying various modifications and changes without departing from the scope of inventive concepts.

According to a method of manufacturing a semiconductor memory device according to some example embodiments of inventive concepts, a plurality of memory cells of a three-dimensional structure arranged in a high density may be simultaneously formed. Accordingly, even when the number of memory cells stacked in a vertical direction is increased, a semiconductor memory device including a plurality of memory cells of a three-dimensional structure arranged in a high density in a simplified process without excessively increasing the number of processes and a unit cost may be manufactured. Therefore, according to the technical idea of inventive concepts, a large-capacity and high-speed semiconductor memory device may be manufactured by a simplified process while sufficiently securing a data sensing margin, without adverse effects caused by interference between the memory cells.

While inventive concepts have been particularly shown and described with reference to some example embodiments thereof, it will be understood that various changes in form and details may be made therein without departing from the spirit and scope of the following claims.

What is claimed is:

1. A semiconductor memory device comprising:
a memory cell array of a three-dimensional structure, the memory cell array including a plurality of memory cells on a substrate, the plurality of memory cells repeatedly arranged in a first horizontal direction, a second horizontal direction, and a vertical direction, the first horizontal direction and the second horizontal direction parallel with a main surface of the substrate, the first horizontal direction crossing the second horizontal direction, the vertical direction perpendicular to the main surface,
wherein each of the plurality of memory cells comprises three transistors.

2. The device of claim 1, wherein each of the three transistors have an axis in a channel length direction parallel with the first horizontal direction, and,
in the plurality of memory cells, two memory cells adjacent to each other in the second horizontal direction have a mirror-symmetry shape with respect to an imaginary straight line along the first horizontal direction.

3. The device of claim 1, wherein the memory cell array further comprises a bit line and a common plate, the bit line and the common plate extending on the substrate in the second horizontal direction, and,
in the plurality of memory cells, two memory cells adjacent to each other in the first horizontal direction have a mirror-symmetry shape with respect to one of the bit line and the common plate.

4. The device of claim 1, wherein the memory cell array comprises a bit line on the substrate, the bit line extending along in the second horizontal direction, and
the memory cells that are arranged in a row in the second horizontal direction among the plurality of memory cells share the bit line.

5. The device of claim 1, wherein the plurality of memory cells comprise a portion of a read word line and a portion of a write word line, the read word line and the write word line being apart from each other in the second horizontal direction and extending in the vertical direction, and
the memory cells among the plurality of memory cells that are arranged in a row in the vertical direction share the read word line and the write word line.

6. A semiconductor memory device comprising:
a memory cell array of a three-dimensional structure, the memory cell array comprising a plurality of memory cells that are repeatedly arranged on a substrate in a first horizontal direction, a second horizontal direction, and a vertical direction, the first horizontal direction and the second horizontal direction parallel with a main surface of the substrate and cross each other, and the vertical direction perpendicular to the main surface,
wherein each of the plurality of memory cells comprises,
a first transistor including, a first channel region and a storage gate,
a second transistor including a second channel region and a portion of a read word line,
and a third transistor comprising a third channel region and a portion of a write word line,
wherein an axis in a channel length direction of each of the first channel region and the second channel region follows a first straight line parallel with the first horizontal direction, and an axis in a channel length direction of the third channel region is parallel with the first horizontal direction and follows a second straight line apart from the first straight line.

7. The device of claim 6, wherein each of the first transistor and the second transistor comprises a pair of source/drain regions arranged along the first straight line, and
the third transistor comprises a pair of source/drain regions arranged along the second straight line.

8. The device of claim 6, further comprising:
a bit line on the substrate extending in the second horizontal direction,
wherein the first transistor includes a pair of first source/drain regions along the first straight line,
the second transistor is between the bit line and one first source/drain region among the pair of first source/drain regions, and
the third transistor is between the bit line and the storage gate.

9. The device of claim 8, wherein,
the second transistor comprises a pair of second source/drain regions, one second source/drain region among the pair of second source/drain regions is connected to the bit line, and the other second source/drain region among the pair of second source/drain regions is connected to one first source/drain region among the pair of first source/drain regions of the first transistor.

10. The device of claim 8, wherein the third transistor comprises a pair of third source/drain regions, one third source/drain region among the pair of third source/drain regions is connected to the bit line, and the other third source/drain region among the pair of third source/drain regions is connected to the storage gate of the first transistor.

11. The device of claim 6, wherein the read word line and the write word line extend in the vertical direction, and
the memory cells arranged in a row in the vertical direction among the plurality of memory cells share one read word line and one write word line.

12. The device of claim 6, wherein the memory cell array further comprises a bit line and a common plate, the bit line and the common plate on the substrate and extending in the second horizontal direction,
wherein the common plate is apart from the bit line with a first memory cell group therebetween, the first memory cell group comprising memory cells arranged in a row in the second horizontal direction, and,
in each of memory cells comprised in the first memory cell group, one first source/drain region among a pair of first source/drain regions included in the first transistor is connected to the common plate, one second source/drain region among a pair of second source/drain regions included in the second transistor, and one third source/drain region among a pair of third source/drain regions included in the third transistor are connected to the bit line.

13. The device of claim 6, wherein each of the plurality of memory cells further comprises a capacitor,
wherein the capacitor comprises a storage node adjacent to the storage gate of the third transistor in the second horizontal direction with a capacitor dielectric layer interposed between the storage node and the storage gate, the storage node extending in the first horizontal direction between the first straight line and the second straight line.

14. The device of claim 13, wherein the memory cell array further comprises a common plate on the substrate, the common plate extending along in the second horizontal direction, and
the common plate comprises a portion contacting one source/drain region among a pair of source/drain regions included in the first transistor, and the common plate comprises a portion contacting the storage node.

15. The device of claim 6, wherein the first channel region extends in the vertical direction, and
first transistors of memory cells arranged in a row in the vertical direction among the plurality of memory cells share the first channel region.

16. The device of claim 6, wherein the first straight line and the second straight line are apart from each other in the second horizontal direction, and
the second channel region and the third channel region are arranged on one straight line in the second horizontal direction.

17. The device of claim 6, wherein the first straight line and the second straight line are apart from each other in the second horizontal direction, and
the second channel region and the third channel region are misaligned with each other so that they are not on one straight line in the second horizontal direction.

18. The device of claim 6, wherein the memory cell array further comprises a read bit line and a write bit line, the read bit line and the write bit line on the substrate, the read bit line and the write bit line extending in the second horizontal direction,
one source/drain region among a pair of source/drain regions comprised in the second transistor is connected to the read bit line, and
one source/drain region among a pair of source/drain regions included in the third transistor is connected to the write bit line.

19. The device of claim 6, wherein the first straight line and the second straight line are apart from each other in the vertical direction, and
the second channel region and the third channel region are misaligned with each other so that they are not on one straight line in the vertical direction.

20. A semiconductor memory device comprising:
a memory cell array of a three-dimensional structure, the memory cell array comprising a plurality of memory cells that are on a substrate and are repeatedly arranged in a first horizontal direction, a second horizontal direction, and a vertical direction, the first and second horizontal directions parallel with a main surface of the substrate and crossing each other, the vertical direction perpendicular to the main surface of the substrate,
wherein the memory cell array comprises,
a plurality of bit lines extending in the second horizontal direction and being apart from each other in the vertical direction on the substrate, and
a plurality of read word lines and a plurality of write word lines extending parallel with each other in the vertical direction, the plurality of read word lines apart from the plurality of write word lines in the second horizontal direction,
wherein memory cells in a row in the second horizontal direction among the plurality of memory cells share one bit line selected from the plurality of bit lines, and
memory cells in a row in the vertical direction among the plurality of memory cells share one read word line and one write word line selected among the plurality of read word lines and the plurality of write word lines, respectively.

* * * * *